United States Patent [19]
Jain et al.

[11] Patent Number: 5,649,165
[45] Date of Patent: Jul. 15, 1997

[54] TOPOLOGY-BASED COMPUTER-AIDED DESIGN SYSTEM FOR DIGITAL CIRCUITS AND METHOD THEREOF

[75] Inventors: Jawahar Jain, Santa Clara; Rajarshi Mukherjee, San Jose, both of Calif.

[73] Assignee: Fujitsu Limited, Kawasaki, Japan

[21] Appl. No.: 399,707

[22] Filed: Mar. 3, 1995

Related U.S. Application Data

[63] Continuation-in-part of Ser. No. 382,222, Jan. 31, 1995, abandoned.

[51] Int. Cl.⁶ .......................... G06F 17/50; G06F 9/455
[52] U.S. Cl. .................... 395/500; 364/491; 371/67.1
[58] Field of Search .......................... 395/500, 700; 364/488, 489, 490, 491, 578; 371/23, 27, 67.1, 71

[56] References Cited

U.S. PATENT DOCUMENTS

| | | | |
|---|---|---|---|
| 5,243,538 | 9/1993 | Okuzawa et al. | 364/489 |
| 5,349,659 | 9/1994 | Do et al. | 395/700 |
| 5,377,201 | 12/1994 | Chakradhar et al. | 371/23 |
| 5,379,231 | 1/1995 | Pillage et al. | 364/488 |
| 5,481,473 | 1/1996 | Kim et al. | 364/490 |
| 5,485,471 | 1/1996 | Bershteyn | 371/27 |
| 5,497,334 | 3/1996 | Russell et al. | 364/489 |
| 5,522,063 | 5/1996 | Ashar et al. | 395/500 |
| 5,526,514 | 6/1996 | Pradhan et al. | 395/500 |
| 5,528,508 | 6/1996 | Russell et al. | 364/488 |
| 5,541,849 | 7/1996 | Rostoker et al. | 364/489 |
| 5,544,066 | 8/1996 | Rostoker et al. | 364/489 |
| 5,553,002 | 9/1996 | Dangelo et al. | 364/489 |
| 5,557,531 | 9/1996 | Rostoker et al. | 364/489 |
| 5,572,436 | 11/1996 | Dangelo et al. | 364/489 |
| 5,572,437 | 11/1996 | Rostoker et al. | 364/489 |

OTHER PUBLICATIONS

S. Malik et al., *Logic Verification Using Binary Decision Diagrams in a Logic Synthesis Environment*, Int'l Conf. on Computer–Aided Design, pp. 6–9 (1988).

M. Fujita et al., *Evaluation and Improvements of Boolean Comparison Methods Based on Binary Decision Diagrams*, Int'l Conf. on Computer–Aided Design, pp. 2–5 (1988).

C.L. Berman & L.H. Trevyllian, *Functional Comparison of Logic Designs for VLSI Circuits*, Int.'Conf. on Computer–Aided Design, pp. 456–459 (1989).

D. Brand, *Verification of Large Synthesized Designs*, Int'l Conf. on Computer–Aided Design, pp. 534–537 (1993).

E. Cerny & C. Mauras, *Tautology Checking Using Cross–Controllability and Cross–Observability Relations*, Int'l Conf. on Computer–Aided Design, pp. 34–37 (1990).

(List continued on next page.)

*Primary Examiner*—Kevin J. Teska
*Assistant Examiner*—Russell W. Frejd
*Attorney, Agent, or Firm*—Christie, Parker & Hale, LLP

[57] ABSTRACT

A computer-aided design system and method thereof for performing logic design analysis for determining logical interdependencies between points in a digital circuit topology. Such a topology comprises a set of primary outputs and a set of primary inputs, both interconnected with logic gates. The logic gates are interconnected by wires. Each such point comprises a location on a wire carrying a signal asserted into or from one of the logic gates. A representation of such topology is stored in a storage device in the computer-aided design system. A cutset in the topology is selected comprising the logic gates falling in a fan-in of the logic gates leading to a target one of the logic gates. A decision diagram is built for logic gates in the cutset leading from the target logic gate. The logic gates in a potential learning area in the topology are marked. Justification vectors are extracted from the decision diagram for a predetermined Boolean value of the target logic gate. Such logical interdependencies are determined and a representation of the logical interdependencies is stored in a storage device in the computer-aided design system. Boolean operations are performed between the decision diagram and a plurality of other decision diagrams for the logic gates in the potential learning area.

62 Claims, 40 Drawing Sheets

Microfiche Appendix Included
(5 Microfiche, 286 Pages)

OTHER PUBLICATIONS

W. Kunz, *HANNIBAL: An Efficient Tool for Logic Verification Based on Recursive Learning*, Int'l Conf. on Computer-Aided Design, pp. 538–543 (1993).

Schulz et al., *SOCRATES: A Highly Efficient Automatic Test Pattern Generation System*, Int'l Test Conf., pp. 1016–1026 (1987).

K. Karplus, *Using If–Then Else DAGs For Multi–Level Minimization*, Decennial Caltech Conference on VLSi (May 1989).

M. Abramovici et al., *Digital Systems Testing and Testable Design*, Computer Science Press pp. 101–117 (1990).

R.E. Bryant, *Graph–Based Algorithms for Boolean Function Manipulation*, IEEE Transactions on Computers, vol. C–35, No. 8, pp. 677–691 (Aug. 1986).

Schulz et al., *Advanced Automatic Test Pattern Generation and Redundancy Identification Techniques*, Fault Tolerant Computing Symposium–18, pp. 30–35 (1988).

R. Rudell, *Dynamic Variable Ordering for Ordered Binary Decision Diagrams*, Int'l Conf. on Computer–Aided Design, pp. 42–47, (1993).

R. Drechsler et al., *Efficient Representation and Manipulation of Switching Functions Based on Ordered Kronecker Functional Decision Diagrams*, 31st ACM/IEEE Design Automation Conference, pp. 415–419, (1994).

S.T. Chakradhar et al., *A Transitive Closure Algorithm for Test Generation*, IEEE Transactions on Computer–Aided Design of Integrated Circuits and Systems, vol. 12, No. 7, pp. 1015–1027, (Jul. 1993).

R.E. Bryant, *Symbolic Boolean Manipulation with Ordered Binary–Decision Diagrams*, ACM Computing Surveys, vol. 24, No. 3, pp. 293–318, (Sep. 1992).

O. Coudert et al., *A Unified Framework for the Formal Verification of Sequential Circuits*, Int'l Conf. on Computer–Aided Design, pp. 126–129 (1990).

W. Kunz et al., *Recursive Learning: An Attractive Alternative to the Decision Tree for Test Generation in Digital Circuits*, Int'l Test Conf., pp. 816–825, (1992).

R. Mukherjee et al., *Functional Learning: A New Approach to Learning in Digital Circuits*, Technical Report 94–020, Dept. of Computer Science, Texas A&M University, pp. 1–15, (1994).

FIG.5

```
LOGIC_GATE {
        INT GATE_NUMBER;
        INT GATE_VAL;
        CHAR GATE_NAME[10];
        CHAR GATE_TYPE[10];
        INT NO_IN, NO_OUT;
        INT LEVEL_NO;
        INT * FAN_OUT;
        INT * FAN_IN;

```
TYPE VERTEX = RECORD
    LOW, HIGH: VERTEX;
    INDEX: 1..n+1;
    VAL: (0,1,X);
    ID: INTEGER;
    MARK: BOOLEAN;
END;
```

FIG. 13

```
JUSTIFICATION_VECTOR {
      BDD LEAF_BDD;
      INT PATH_LENGTH;
      INT * PARTIAL_PATH;
      INT BOTTOM_OUT;
}
```

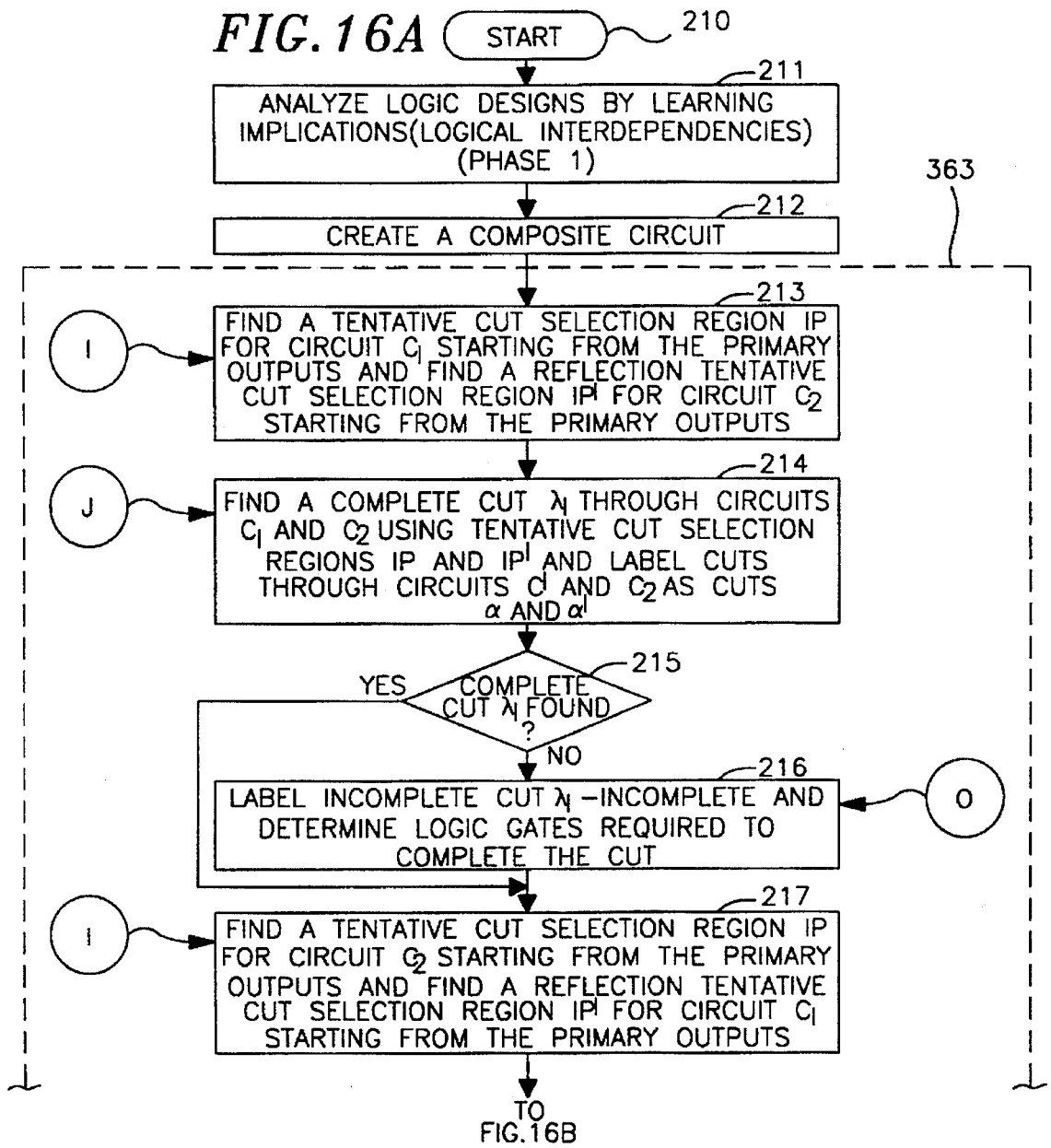

```
LEARNING_LINKED_LIST {
    INT  GATE_NUMBER;
    INT  GATE_VAL;
    LEARNING_LINKED_LIST  *NEXT_LEARNING_LINKED_LIST;
}
```

FIG.18A

```
LEARNING_LIST {
      INT    LENGTH;
      INT    *LEARNINGS;
}
```

FIG.18B

| EQ_LIST  | 5 | 8 | −10 | 12 |   |
|----------|---|---|-----|----|---|
| INV_LIST | 1 | −2 | 7 | 11 |   |
| LIST_0   | 3 | 15 | 20 | | |
| LIST_1   | 4 | 6 | 9 | 13 | 15 |

INT  TENTATIVE_CUT[CUT_SIZE];

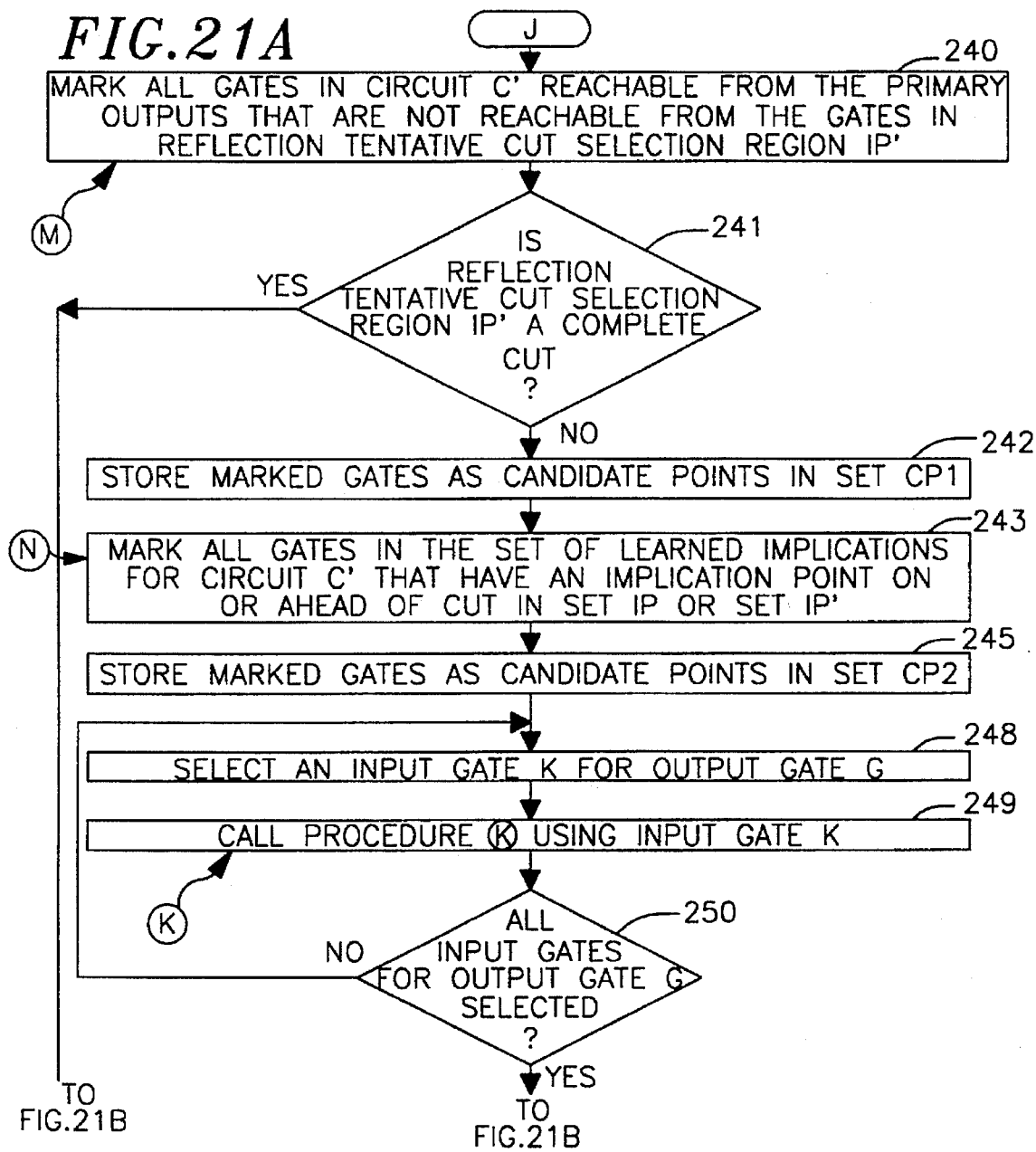

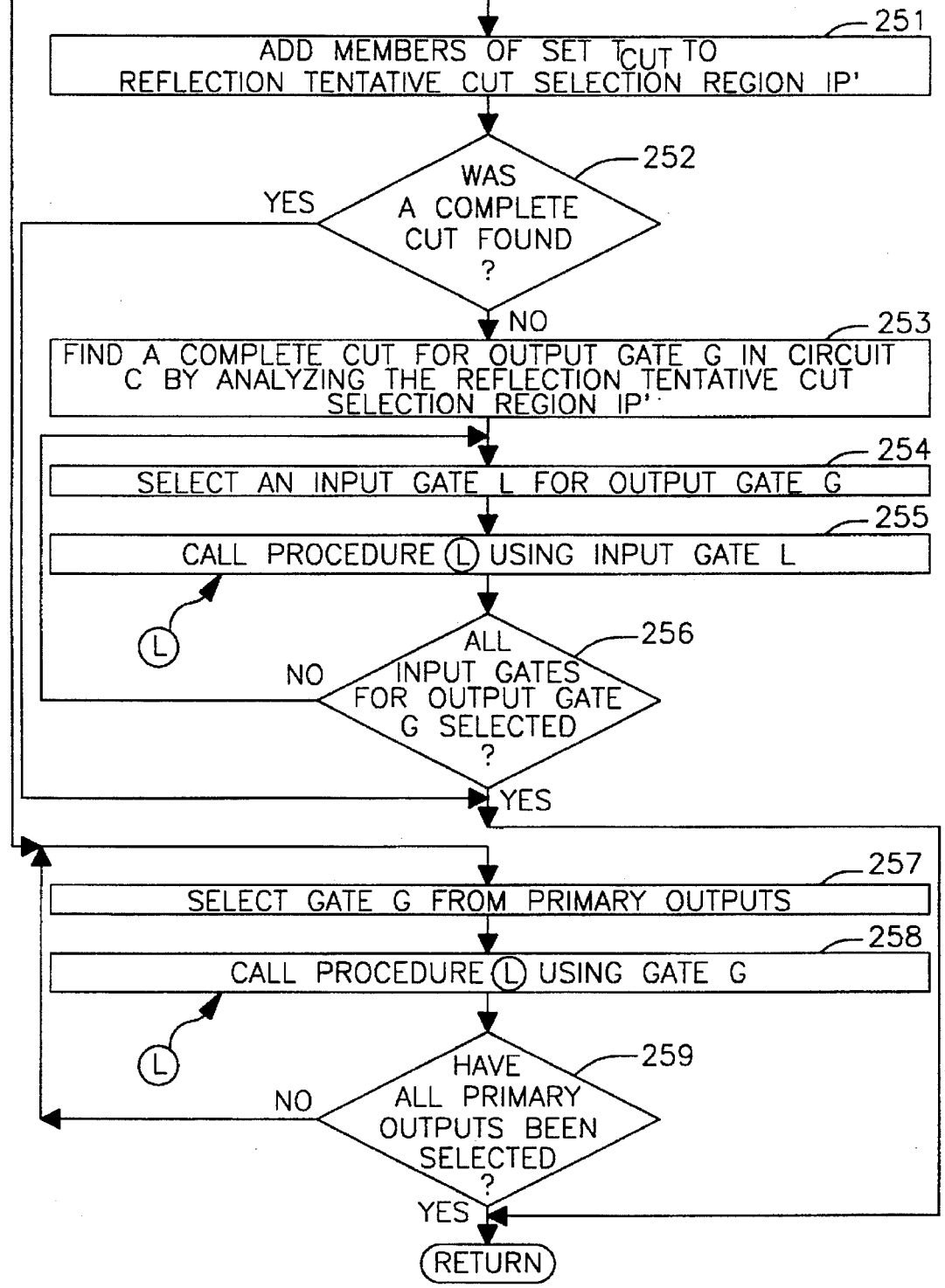

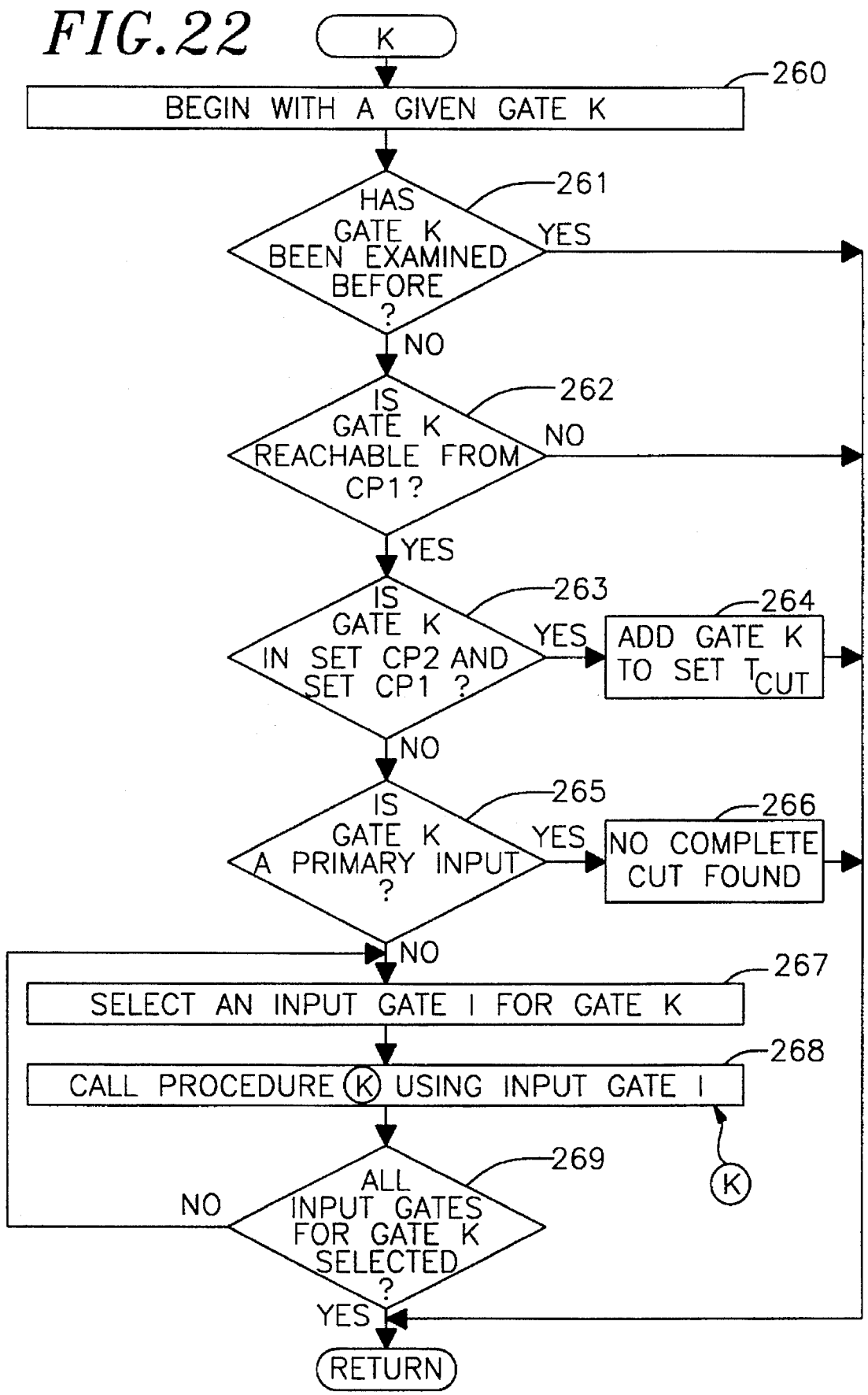

```
CUTSET   {
         INT    GATE_NUMBER;
         INT    EQ_FLAG;
         INT    INV_FLAG;
         INT    BOTH_FLAG;
         INT    0_FLAG;
         INT    1_FLAG
         INT    COMPLETE_FLAG;
}
```

```
CUTSET    CUT[CUT_SIZE];
```

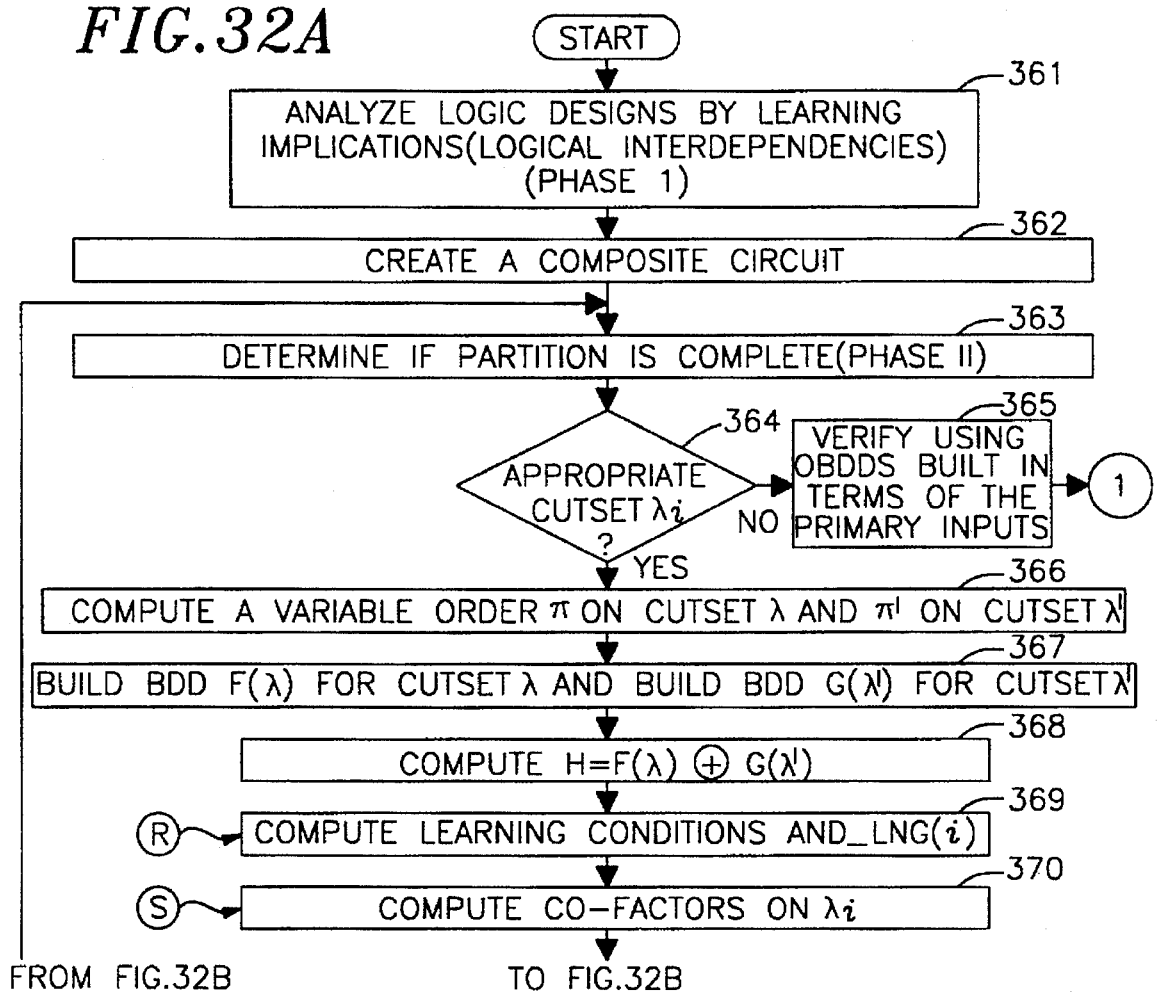

TOPOLOGY-BASED COMPUTER-AIDED DESIGN SYSTEM FOR DIGITAL CIRCUITS AND METHOD THEREOF

CROSS-REFERENCE TO RELATED APPLICATION

This is a continuation-in-part of application Ser. No. 08/382,222 filed Jan. 31, 1995 now abandoned, the priority filing date of which is hereby claimed and the subject of which is hereby incorporated by reference as if set forth in full.

REFERENCE TO APPENDICES

A Microfiche Appendix is part of this specification. The Microfiche Appendix includes 5 microfiche and 286 frames.

A portion of the disclosure of this patent document contains material to which a claim for copyright is made. The copyright owner has no objection to the facsimile reproduction by anyone of the patent document or patent disclosure, as it appears in the Patent and Trademark Office patent file or records, but reserves all other copyright rights whatsoever.

FIELD OF THE INVENTION

The present invention relates in general to computer-aided design (CAD) systems and methods, and in particular to CAD systems and methods for digital circuit design and verification of computer systems.

BACKGROUND OF THE INVENTION

Computer-aided design (CAD) of digital circuits using large scale programmed digital computers is a well-developed technology. Several techniques are used in digital circuitry CAD for extracting more information about the logic signal value assignments and logical interrelations among the logic gates in a proposed or existing digital circuit. Logic design analysis is used in CAD to determine logical interconnections and interdependencies between logic gates based on the structural topology of a digital circuit. An important part of this process is identifying all signal values that can be implied both directly and indirectly as a result of a given situation of value assignments. This includes recognition of various simple and complex physical and logical relations among two or more logic gates in the circuit as a result of a given situation of value assignments.

This analysis process is commonly referred to as learning and the logical interconnections and interdependencies are called implications. As examples, automatic test pattern generation (ATPG) for digital circuits, logic hardware optimization, logic hardware timing analysis and digital circuit engineering changes (EC) require logic design analysis. A problem encountered in CAD is the computational resources required both in terms of time and memory space. This is because all of the above-mentioned CAD problems may require the computer system to explore every possible input value to the circuit which may be exponential in number, commonly referred to as NP-complete or intractable. Hence, in the worst case, they require an exponential amount of time and/or memory space for a complete solution to be found. Therefore, good, efficient heuristics or shortcuts must be designed to solve these problems.

Consider digital circuit design verification. It is commonly performed using binary decision diagram (BDD) data representations, as shown in S. Malik et al., *Logic Verification Using Binary Decision Diagrams in a Logic Synthesis Environment*, Int'l Conf. on Computer-Aided Design, pp. 6–9 (1988); and M. Fujita et al., *Evaluation and Improvements of Boolean Comparison Methods Based on Binary Decision Diagrams*, Int'l Conf. on Computer-Aided Design, pp. 2–5 (1988). Such BDD-based verification processes are most advantageous to use when the logic designs being compared have few to none known logical interconnections. When the logic designs have numerous similarities, the designs are often verified using techniques that find constant valued relationships among the logic gates, such as shown in C. L. Berman & L. H. Trevyllian, *Functional Comparison of Logic Designs for VLSI Circuits*, Int'l Conf. on Computer-Aided Design, pp. 456–59 (1989); D. Brand, *Verification of Large Synthesized Designs*, Int'l Conf. on Computer-Aided Design, pp. 534–37 (1993); E. Cerny & C. Mauras, *Tautology Checking Using Cross-Controllability and Cross-Observability Relations*, ICCAD, pp. 34–38 (1990); and W. Kunz, *HANNIBAL: An Efficient Tool for Logic Verification Based on Recursive Learning*, Int'l Conf. on Computer-Aided Design (1993).

Implication-based verification systems basically operate in two phases. During Phase I, implications that occur between the logic gates comprising the two circuits being verified are learned. These implications include the discovery of logically equivalent and logically inverse signals or gate outputs between the two circuits. The circuit is analyzed using a different number of learning levels.

During Phase II, the learned implications are used to prove equivalency by examining a portion of the circuit situated between some set of internal logic gates and the primary outputs.

The difficulty with some of these approaches is that the computational time required increases exponentially with the number of learning levels analyzed. Current techniques show that the application of these techniques to five or more levels is impracticable because the technique is severely exponentially expensive with the number of learning levels being analyzed.

Thus, finding logical interconnections in which a constant Boolean value asserted at one logic gate causes (or implies) another constant Boolean signal (or value) at another logically or physically interconnected logic gate can be computationally inefficient for large circuit designs. These techniques are not general enough to detect other types of useful implications which are not constant valued.

Further, these techniques will fail to verify a design if only a portion of the circuit is examined during Phase II, where there is an insufficient number of implications, the nature of the implications is unsatisfactory, or the portion of the circuit being examined is incomplete. An "incomplete" partition immediately precludes the verification of the two circuits by analysis of the portion of the circuit lying between the cutset and the primary outputs of the two circuits. Note, in the worst case, the functional learning techniques can also require exponential time to identify some logical relations. This is because the underlying problem is NP-complete.

Another important problem in the CAD industry is that of ATPG for deriving test vectors for fabrication faults in digital circuits. A special type of fault is called a redundant fault. These faults are often too hard for ordinary ATPG tools to detect. In some cases, more efficient analysis of the logic interrelations among the logic gates in the circuit is required by means of learning techniques. Hence, learning-based ATPG tools perform much better on redundant and hard-to-detect faults, such as shown in Schulz et al., *SOCRATES: A Highly Efficient Automatic Test Pattern Generation System,*

Int'l Test Conf. (1987). The relations and constraints that are discovered by learning techniques prune the search space for a test vector for the targeted fault. However, these tools are restricted by the use of only constant valued learning, some of which in current techniques may take unnecessarily excessive computational resources in being discovered.

Accordingly, there is a need for a computer-aided design system and method thereof to perform logic design analysis for determining logical interdependencies between points in a digital circuit topology, to verify whether digital circuits are equivalent, to decrease computational resources for the construction of a representation of a hardware design, and to perform goal directed learning in a digital circuit, that is more immune to the number of gate levels to thereby increase the speed of processing, decrease the amount of time required, and decrease the amount of memory space needed for processing.

Accordingly, there is a need for a computer-aided design system and method thereof to enable the solving of problems when a digital circuit is a large and complex topology of logic gates.

Accordingly, there is a need for a computer-aided design system and method thereof that can find both constant valued and functional valued implications.

Also, there is a need for a computer-aided design system and method thereof that can determine whether a partition of one of a pair of digital circuits being verified is inadequate (incomplete) or complete.

SUMMARY OF THE INVENTION

The present invention overcomes the above problems and employs functional learning to perform logic design analysis for determining logical interdependencies (implications) between logic gates comprising a digital circuit topology, to verify whether circuits are equivalent, to decrease computational resource requirements for constructing representations of hardware designs, and to perform goal directed learning.

An embodiment of the present invention is a computer-aided design system and method thereof for performing logic design analysis for determining logical interdependencies between points in a digital circuit topology. Such a topology comprises a set of primary outputs and a set of primary inputs, both interconnected with logic gates. The logic gates are interconnected by wires. Each such point comprises a location on a wire carrying a signal asserted into or from one of the logic gates. A representation of such topology is stored in a storage device in the computer-aided design system. A cutset in the topology is selected comprising the logic gates falling in a fan-in of the logic gates leading to a target one of the logic gates. A decision diagram is built for logic gates in the cutset leading from the target logic gate. The logic gates in a potential learning area in the topology are marked. Justification vectors are extracted from the decision diagram for a predetermined Boolean value of the target logic gate. Such logical interdependencies are determined and a representation of the logical interdependencies is stored in a storage device in the computer-aided design system. Boolean operations are performed between the decision diagram and a plurality of other decision diagrams for the logic gates in the potential learning area.

An embodiment of the present invention is also a computer-aided design system and method thereof for logic design verification using a group of logic gates with logical interdependencies. The system comprises of first and a second separate digital circuit topology each comprising a set of primary outputs interconnected with logic gates. The logic gates are interconnected by wires. The topologies have a set of logical interdependencies associated with at least one of the logic gates in the system. Each such primary output for each separate topology has a corresponding primary output on the other of the separate topologies. The corresponding outputs from each of the separate topologies are XORed together using means for XORing. A tentative cut selection region in one of the separate topologies is selected and a reflection tentative cut selection region in the other of the separate topologies is selected. Each such region comprises a group of logic gates whereby the wires connecting into those of the logic gates in the region that are closest to the set of primary outputs form a cut. The tentative cut selection region further comprises at least one of the logic gates and at least one of the associated logical interdependencies on or ahead of the cut and the reflection tentative cut selection region further comprises at least one of the associated logical interdependencies for at least one of the logic gates in the tentative cut selection region. Each of the circuits is verified for equivalency by determining the effect of injection Boolean values into those of the logic gates in the tentative cut selection region and in the reflection tentative cut selection region that are closest to the set of primary outputs for each of the separate topologies to thereby determine an output signal indicating equivalency asserted by the XORing means.

An embodiment of the present invention is also a computer-aided design system and method thereof for logic design verification using decision diagram simplification. The system comprises a first and a second separate digital circuit topology each comprising a set of primary outputs and a set of primary inputs both interconnected with logic gates. The logic gates are interconnected by wires. The topologies have a set of logical interdependencies associated with at least one of the logic gates in the system. The system further comprises a tentative cut selection region in one of the separate topologies and comprises a reflection tentative cut selection region in the other of the separate topologies. Each such region comprises a group of logic gates whereby the wires connecting into those of the logic gates in the region that are closest to the set of primary outputs form a cut. A tentative cut selection region further comprises at least one of the logic gates and at least one of the associated logical interdependencies on or ahead of the cut and the reflection tentative cut selection region further comprises at least one of the associated logical interdependencies for at least one of the logic gates in the tentative cut selection region. Each such primary output for each separate topology has a corresponding primary output on each of the other separate topologies. The corresponding primary outputs from each of the separate topologies or XORed using means for XORing. A composite decision diagram is built by performing a Boolean exclusive OR between a decision diagram representing the tentative cut selection region and a decision diagram representing the reflection tentative cut selection region. Learning conditions are determined for each of the separate topologies. Each such learning condition comprises a decision diagram representing logic gates located between the cuts and the primary outputs and the composite decision diagram is simplified using the learning conditions. A pair of co-factor decision diagrams are determined for the simplified composite decision diagram by applying Shannon's expansion formula based on the cuts and the pair is combined to build a reduced composite decision diagram that is substituted for the composite decision diagram. Each of the topologies is verified for equivalency by composing the separate composite decision diagram using decision diagrams built on the primary inputs for each of separate topologies and the Boolean exclusive OR is performed between the decision diagrams to thereby determine an output signal indicating the equivalency asserted by the XORing means.

An embodiment of the present invention is also a computer-aided design system and method thereof for decreasing computational resource requirements for constructing a representation of the hardware design. The system comprises a digital circuit topology comprising a set of primary outputs and a set of primary inputs both interconnected with logic gates. The logic gates are interconnected by wires. The topology has a set of logical interdependencies associated with at least one of the logical gates in the system. The representation comprises of a decision diagram representing part or all of the hardware design. A subcircuit topology of the digital circuit topology is selected comprising logic gates falling in a fan-in of a logic gate in the digital circuit topology. A cutset comprising at least one of the logic gates is selected whereby the wires connecting into those of the logic gates closest to the set of primary outputs form a cut and it is determined whether each such logic gate in the cutset has a logical interdependency located on or ahead of the cut. A decision diagram is built using the cutset. The decision diagram is built using the cutset. The decision diagram is simplified whereby the simplified decision diagram is substituted for the decision diagram when the simplified decision diagram is smaller than the decision diagram. The decision diagram is composed using the set of primary inputs as a representation of the hardware design.

An embodiment of the present invention is also a computer-aided design system and method thereof for performing goal directed learning. The system comprises a digital circuit topology comprising a set of primary outputs and a set of primary inputs both interconnected with logic gates. The logic gates are interconnected by wires. The topology has a set of logical interdependencies associated with at least one of the logic gates in the system and has a cutset comprising at least one of the logic gates whereby the wires connecting into those of the logic gates closest to the set primary outputs form a cut. The goal directed learning is for directing the system to satisfy a predetermined goal. A list of logic gates between the cut and the set of primary outputs is determined whereby each of the logic gates is located at most a predetermined structural distance from the cut. Alternatively, a list of logic gates between the cut and the set of primary outputs or between the cut and the set of primary inputs is determined whereby each of the logic gates is located at most a predetermined structural distance from the cut. A logic gate is selected from the list and logical interdependencies are determined with a learning level equal to the predetermined structural distance. Each logic gate in the list is selected until every gate has been selected. The method is repeated while the predetermined structural distance is less than a further predetermined structural distance and the predefined goal remains unsatisfied.

Still other embodiments of the present invention will become readily apparent to those skilled in the art from the following detailed description, wherein is shown and described only the preferred embodiments of the invention by way of illustration of the best modes contemplated for carrying out the invention. As will be realized, the invention is capable of other and different embodiments and its several details are capable of modification in various obvious respects, all without departing from the spirit and scope of the present invention. Accordingly, the drawings and detailed description are to be regarded as illustrative in nature and not as restrictive.

BRIEF DESCRIPTION OF THE DRAWINGS

FIG. 5 is a diagram illustrating the internal data structure of logic gates in a digital circuit topology;

FIG. 11 is a diagram illustrating the internal data structure of vertex records for a BDD;

FIG. 13 is a diagram illustrating the internal data structure of justification vectors extracted from a BDD;

FIGS. 16A and 16B are a flow chart illustrating a process for logic design verification using a group of logic gates with logical interdependencies as an embodiment of the present invention;

FIG. 18A is a list data structure for collecting logical interdependencies upon completion of a level of logic gates, and FIG. 18B is a diagram illustrating an example of a set of logical interdependency lists;

FIGS. 21A and 21B are a flow chart illustrating a routine for finding a reflection cutset α;

FIG. 22 is a flow chart illustrating a routine for filling a hole in a cutset;

FIGS. 32A and 32B are a flow chart illustrating a process for logic design verification using BDD simplification as an embodiment of the present invention;

DETAILED DESCRIPTION

Figure 1:
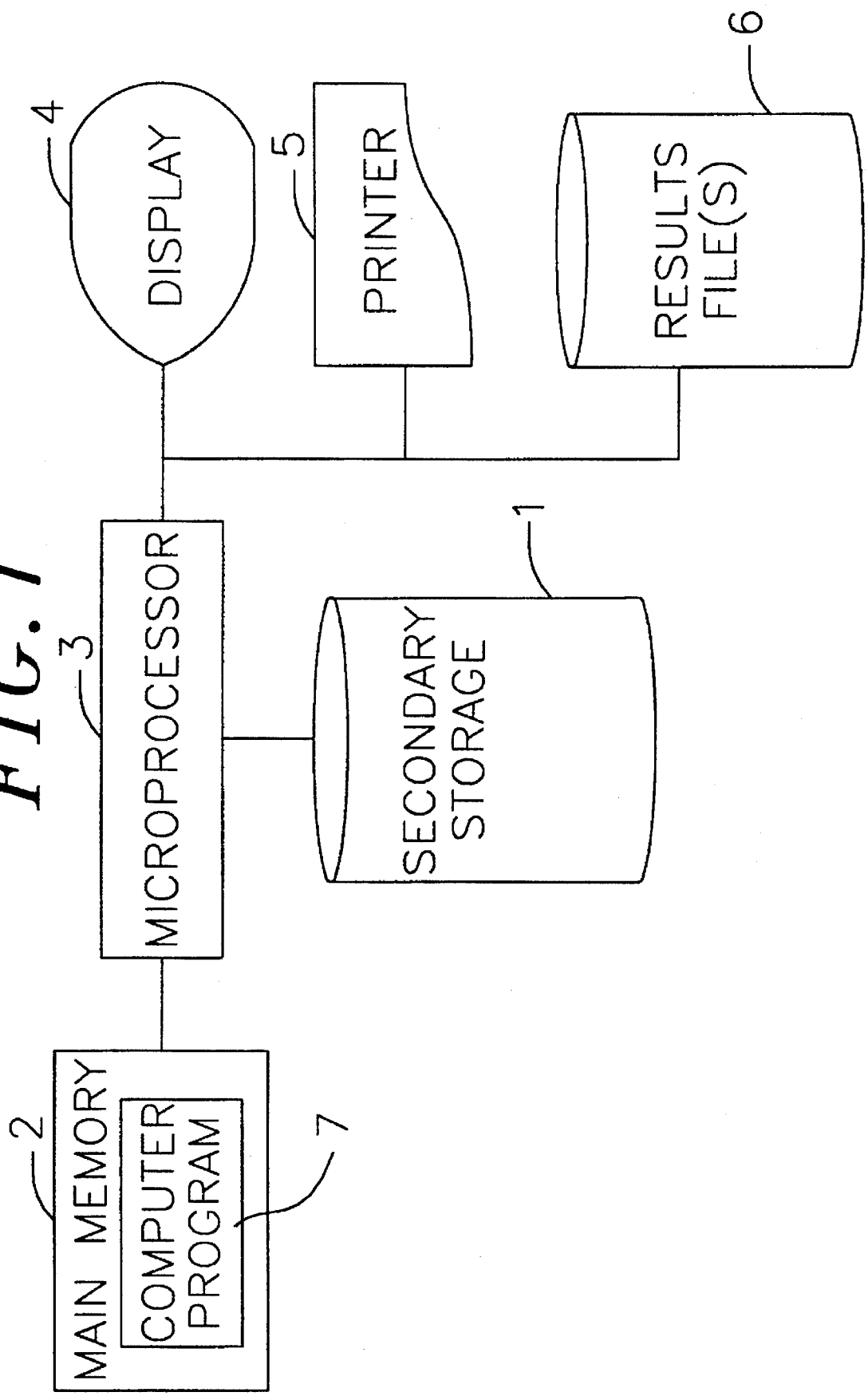
FIG. 1 is a block diagram of a computer system embodying the present invention.

A computer-aided design system according to the present invention is shown in FIG. 1. A microprocessor 3 executes a computer program 7 stored in a main memory 2 and uses a secondary storage device 1. The results of the execution of the computer program 7 are output on a display 4 and a printer 5 and stored in a results file 6. The main memory 2 contains a computer program 7 for carrying out the sequence of operations for logic design analysis for determining logical interdependencies, to verify whether circuits are equivalent, to decrease computational resource requirements for constructing representations of hardware designs, and to perform goal directed learning. A secondary storage device 1 is used to store and provide data files to a microprocessor 3 while executing the computer program 7 contained in main memory 2.

Source code listings for a computer program for use in one embodiment of the present invention are included in the Microfiche Appendix and Appendix A. The source code is written in C language. A description of the C language is detailed in B. W. Kernighan & D. M. Ritchie, *The C Programming Language*, Prentice Hall (2d ed. 1988), the disclosure of which is hereby incorporated by reference.

The computer program of the Microfiche Appendix and Appendix A are preferably run on a Sun Microsystems SPARCstation 10 workstation running the Unix operating system. The source code listings are compiled using the instructions contained in the Makefile and the resulting program is executed. Preferably, the workstation is equipped with 64 megabytes of random access memory and 500 megabytes of secondary storage space.

I. Logic Design Analysis

Figure 2:
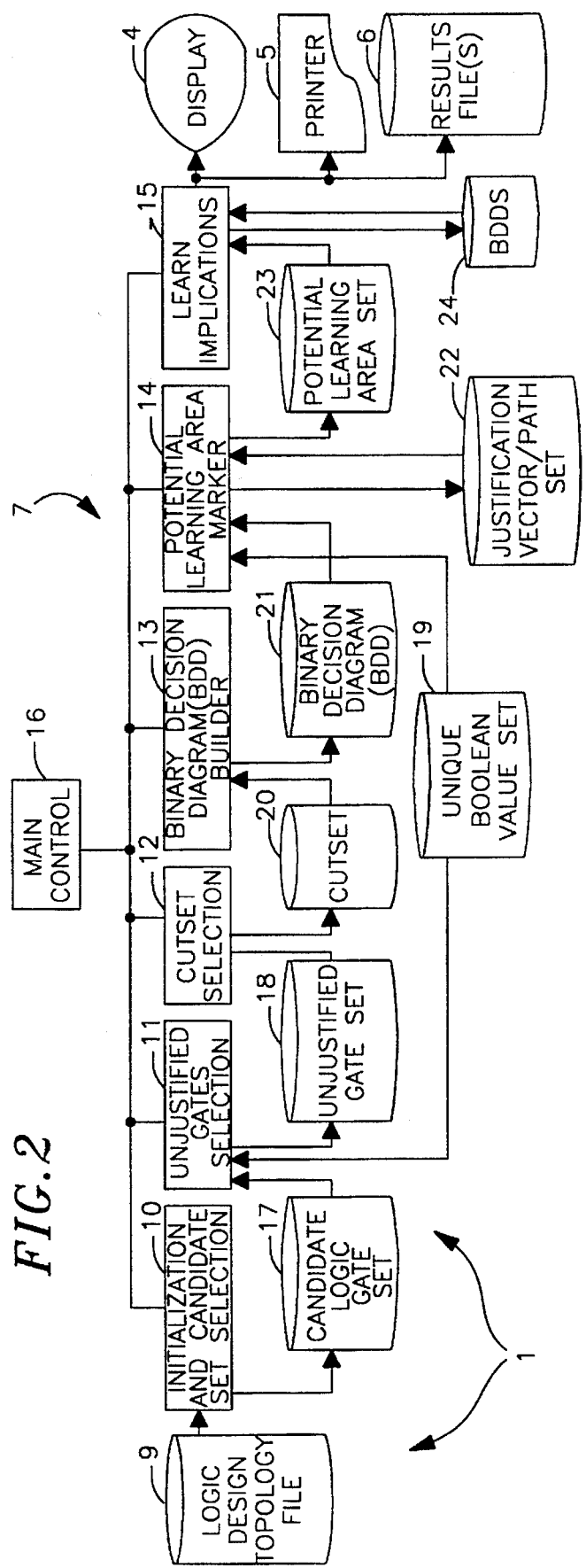
FIG. 2 is a block diagram of a computer-aided design system and method thereof for performing logic design analysis for determining logical interdependencies as used in the system of FIG. 1.

A block diagram of a computer-aided design system and method thereof for performing logic design analysis for determining logical interdependencies as used in the system of FIG. 1 is shown in FIG. 2. The computer program 7 consists of seven main components (blocks 10, 11, 12, 13, 14, 15 and 16), including a main control component 16 to coordinate the other components. The secondary storage device 1 contains nine files (blocks 9, 17, 18, 19, 20, 21, 22, 23 and 24). An initialization and candidate set selection component 10 produces a candidate logic gate set 17 from the logic design topology files 1. An unjustified gates selection component 11 generates an unjustified gate set 18 by tracing backwards through the topology. A cutset selection component 12 creates a cutset 20 by selecting logic gates situated in the fan-in of each unjustified logic gate. A binary decision diagram (BDD) builder component 13 creates a BDD 21 based on cutset 20 to represent the logic embodied in the topology. A potential learning area marker component 14 analyzes BDD 21 to specify a potential learning area set 23 by using the justification vectors stored in justification vector/path set 22 and unique Boolean values already present in the circuit as stored in unique Boolean value set 19. Finally, a learn implications component 15 generates a series of BDDs 24 for each gate in the potential learning area set 23 to learn implications based on the circuit topology, which are output on the display 4 and the printer 5 and stored in results files 6.

Figure 3A:
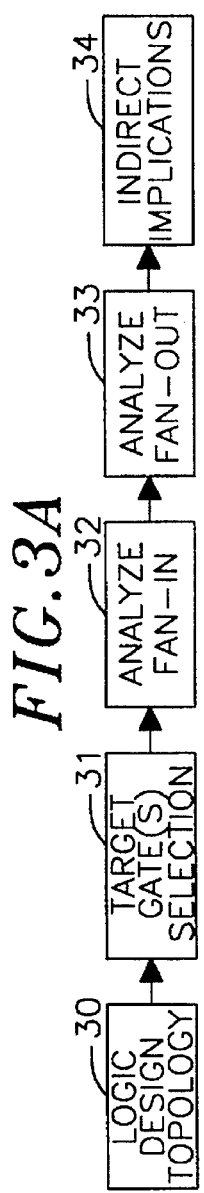
FIG. 3 is a flow chart illustrating the processes embodied in the present invention, as used in the system of FIG. 1, including FIG. 3A illustrating the process for analyzing a digital circuit for indirect implication, FIG. 3B illustrating the process for determining when a partition of a logic circuit design is complete for carrying out logic design verification, and FIG. 3C illustrating the process for using learning conditions for carrying out logic design verification.

The process for analyzing a logic design according to a preferred embodiment of the present invention is shown in FIG. 3A. A logic design topology 30, stored as a data structure, reflects a physical logic design of a digital circuit constituting logic gates and their interconnections, such as the sample digital circuit shown in FIG. 4.

The data structure for the topology is shown in FIG. 5. The gate_number field contains a unique number for a logic gate in the topology. The gate_val field stores the Boolean value occurring at that logic gate. The gate_name and the gate_type fields contain character strings which store a name for and the type of the logic gate, respectively. The no_in and no_out fields contain the number of logic gates falling in the fan-in and fan-out of the logic gate, respectively. The level_no field identifies the level at which the logic gate exists in the topology with respect to the primary inputs, which are at level 0. The fan_out and fan_in fields contain an array of numbers identifying the logic gates that fan-out from and fan-in to, respectively, the present logic gate.

Figure 4:
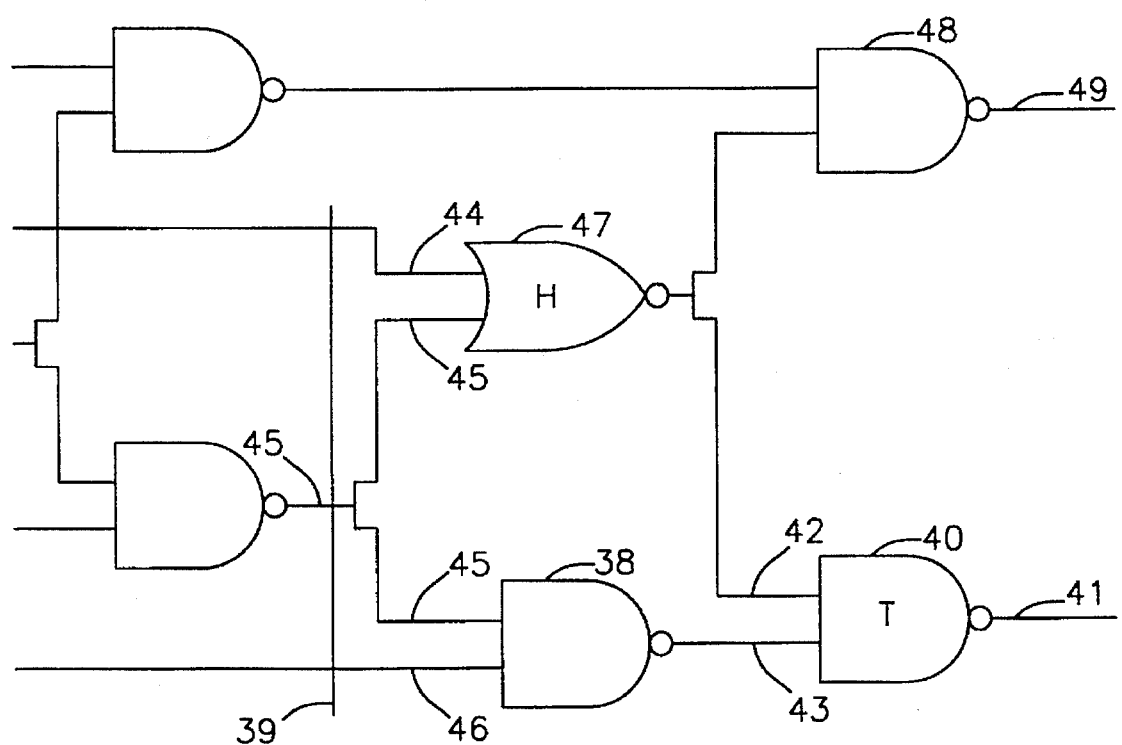
FIG. 4 is a logic design schematic illustrating the topology of a digital logic circuit.

In order to illustrate the use of this data structure, consider logic gate 47 in FIG. 4. The gate_number field for this gate equals 3. The gate_VAL field is assigned a value depending on the logic function of the gate. Here, logic gate 47 is a NOR gate and is therefore assigned a 4. The gate_name field is set to "only NOR." The gate_type field is "NOR." The No_in and No_out fields both equal 2. The level-no field also equals 2. The array fan_out field contains the gate numbers of gates 48 and 40. The array fan_in field contains the gate numbers for the input NAND gate and the primary input signal. The gate_val field remains −1 until a Boolean 0 or 1 is assigned to this gate. Then, it takes on that assigned value.

In the discussion below, only the use of unjustified gates is considered in any logic design analysis. After reading the following discussion, it should be apparent to one skilled in the art that for generalized functional implications, logic values other than unjustified values can also be used. A logic gate is unjustified if there is more than one combination of signals that can be asserted as inputs to that gate to produce a specific output signal. During ATPG, the unjustified gates to be analyzed are always found from the current situation of value assignments in a cut which are points located on wires carrying signals asserted into or from one or more logic gates in the topology. A cut may be wholly internal to the circuit or can overlap with either the primary inputs or primary outputs of the circuit. During verification, every logic gate can be an unjustified gate and during the analysis of each of those gates, Boolean values are injected at each given gate such that it becomes unjustified.

The process shown in FIG. 3A begins with the selection of one or more target logic gates (block 31), such a target logic gate constituting an unjustified gate. The target gates are based on already existing Boolean value situations in the circuit. For instance, NAND gate 40 is unjustified when a Boolean 1 is asserted on wire 41 because it could be the result of a Boolean 0 being asserted on either or both of wires 42 and 43. Specifically, there is more than one combination of input signals to NAND gate 40 to produce a Boolean 0 output signal, so it is unjustified.

The fan-in of an unjustified gate is analyzed (block 32) to determine logic relations based on the unjustified value injected at this logic gate. The logic gates situated in the fan-in of this unjustified gate are simulated by successively applying all justification vectors at some cutset in the circuit. A cutset constitutes the set of all logic gates occurring in the fan-in of a target logic gate up to a predetermined structural distance in the topology tracing backwards towards the primary inputs. The derivation of a cutset is described with reference to block 55. For each gate in the cutset, direct forward and direct backward implication is applied to observe direct logical interdependencies occurring in logic gates situated in their fan-in (block 32) and their fan-out (block 33).

For example, if NAND gate 40 has an unjustified Boolean 1 as an output signal that is asserted on wire 41, the fan-in to NAND gate 40 should be analyzed. Thus, when a Boolean 1 is asserted on wire 41, to justify this value, the output from NOR gate 47 that is asserted on wire 42 which may be a Boolean 0 or the output of the NAND gate 38 on wire 43 which may be a Boolean 0 should be analyzed. The Boolean 0 on wire 43, due to a direct backward implication, asserts a Boolean 1 on wire 45, and due to a direct forward implication, asserts a Boolean 1 on wire 41. The Boolean 1 on wire 45, due to a direct forward implication, asserts a Boolean 0 on wire 42. Therefore, a Boolean 0 on wire 42 is a necessary condition for causing a Boolean 1 on wire 41. By direct forward implication, the Boolean 0 on wire 42 also causes NAND gate 48 to assert a Boolean 1 on wire 49. Hence, a Boolean 1 on wire 49 is also a necessary condition for causing a Boolean 1 on wire The previous two steps, analyzing the fan-in and the fan-out, help derive direct implications based on the truth tables for the logic gates and connectivity of the logic gates constituting the digital circuit. By representing the logic gates as a BDD, indirect implications (block 34) can be derived so as to complete the logic design analysis process. Determining (learning) interdependencies is possible under a given situation of signal assignments in the circuit based on an analysis of the justification vectors in a BDD and subsequently carrying out Boolean operations in the potential learning area.

Figure 3B:
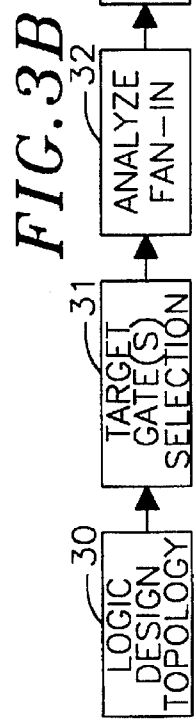

The process for determining when partitions of a logic circuit are incomplete and will not allow logic design verification using those partitions according to a preferred embodiment of the present invention is shown in FIG. 3B. Logical interdependencies learned through direct and indirect implication, as shown in the process set forth in FIG. 3A, are used as inputs. A composite circuit is created by combining matching output signals from a pair of digital circuit topologies. A cut is made in each of the circuits and only the partition of the circuit located between the cut and the primary output is examined. Thus, a necessary part of verification is ensuring that the partition for each circuit is complete for verification purposes.

Figure 3C:
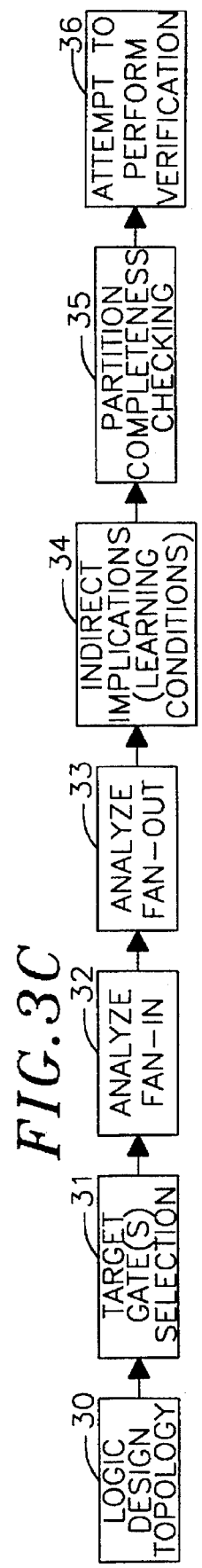

The process for using learning conditions for carrying out logic design verification according to a preferred embodiment of the present invention is shown in FIG. 3C. Logical interdependencies are learned and the completeness of a pair of partitions in a composite logic circuit is checked as set forth in the process shown in FIG. 3B. The logical relations learned in the circuit are consolidated as a single BDD which is then used to simplify any analysis of the given circuit. By way of example, the consolidation is done by simultaneously taking a Boolean AND between BDDs representing each logical relation.

Figure 7:
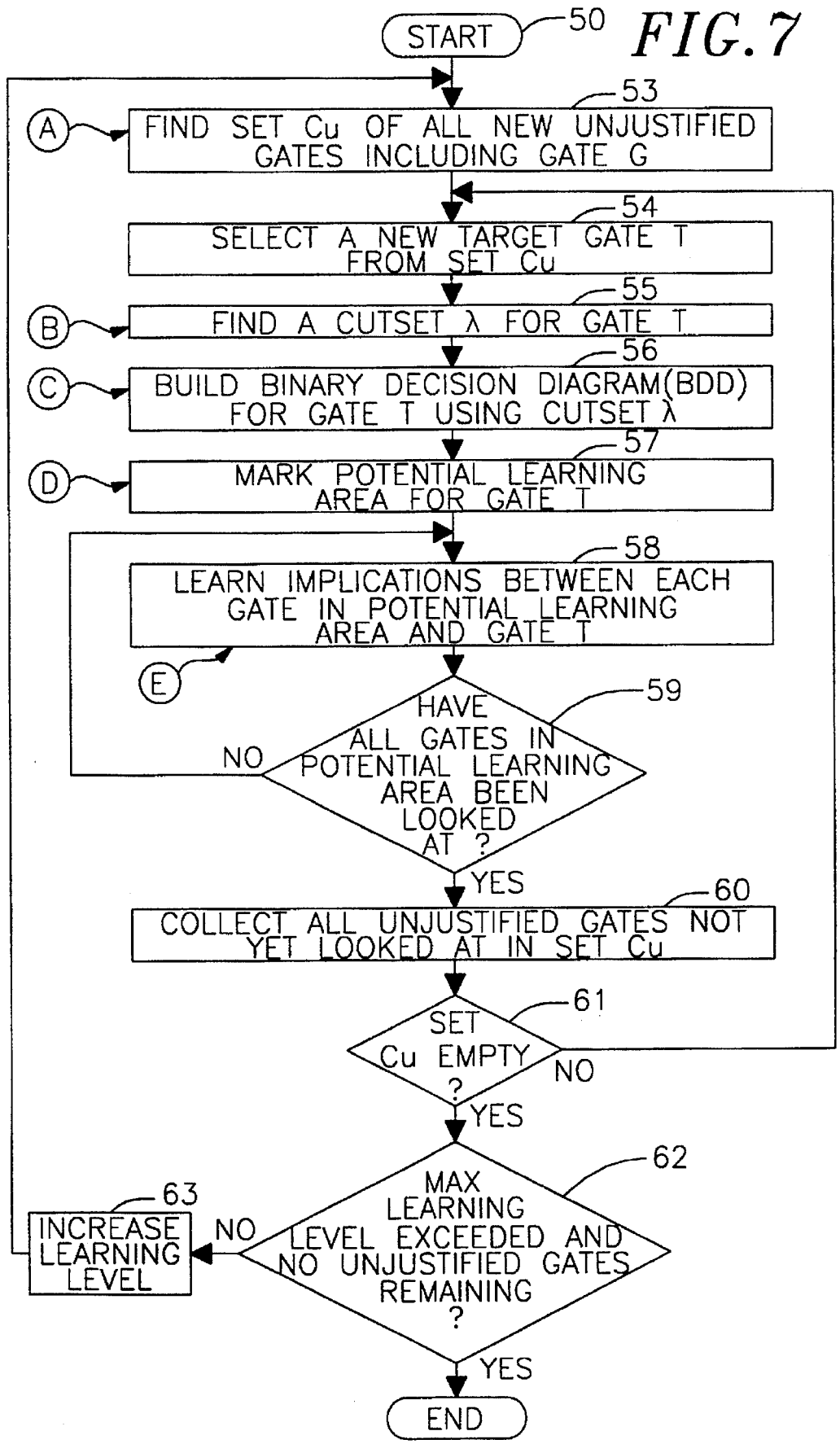
FIG. 7 is a flow chart illustrating the process for analyzing a logic design by learning implications in a logic circuit topology as an embodiment of the present invention.

A preferred embodiment of the computer program 50 is shown in FIG. 7. A maximum learning level is defined at a predetermined structural distance from the target logic gate G tracing backwards towards primary inputs. The topology is analyzed, beginning from the target logic gate G to find all new unjustified gates appearing between the target logic gate G and the maximum learning level and these gates are stored as candidate set $C_u$ (block 53).

A new target gate T is selected from candidate set $C_u$ (block 54). Target gate T initially is the same as logic gate G, but changes to each gate in the candidate set $C_u$. For instance, logic gate 40 constitutes a target logic gate for the digital circuit topology shown in FIG. 4.

A cutset $\lambda$ is found for target gate T (block 55). Different cutsets are found during different iterations. In a preferred embodiment, a cutset $\lambda$ is defined by a cut through the topology of logic gates situated a predetermined structural distance (the cut distance) from the target gate by tracing backwards towards the primary inputs, such as cut 39 shown in FIG. 4. For instance, in iteration 1, the cut distance may equal 1. If a primary input is at a structural distance less than the cut distance, the primary input becomes a member of the cutset. A simple topology-driven traversal of the fan-in of the target gate provides a cutset.

Figure 6A:
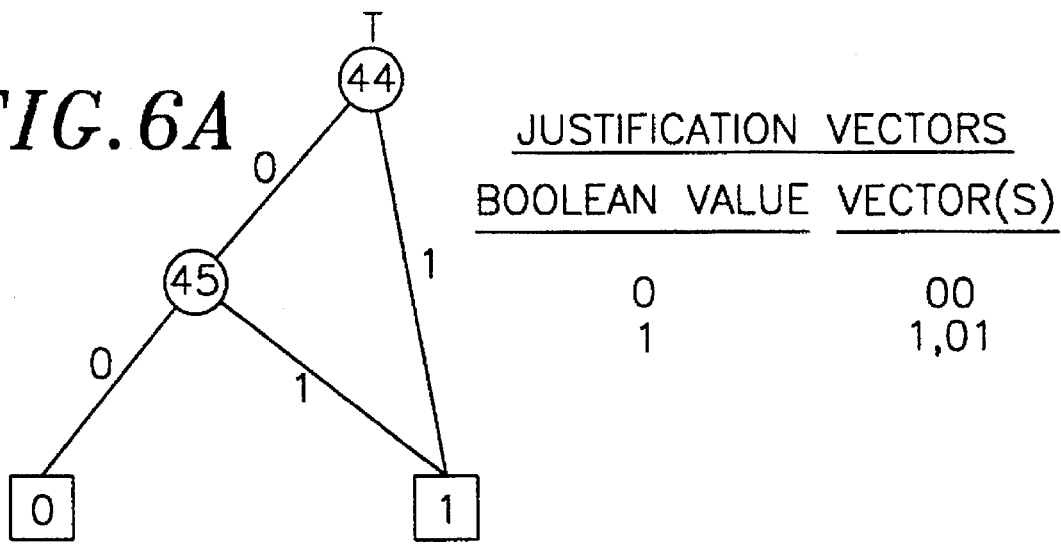
FIGS. 6A and 6B illustrate binary decision diagrams (BDDs) and justification vectors for logic gates shown in FIG. 4.

The cutset λ is used to build a BDD for the target gate T (block 56), although any type of decision diagram could be used. For example, an if-then-else diagram can also be used, such as shown in K. Karplus, *Using If-Then-Else DAGs For Multi-Level Minimization*, Decennial Caltech Conference on VLSI (May 1989), the disclosure of which is hereby incorporated by reference. For illustration, a BDD for logic gate 40 using the cutset defined by cut 39 is shown in FIG. 6A.

For each unjustified gate, a potential learning area, called set PLAR, is marked (block 57). This is done by first collecting a set of justification vectors from the BDD built for the unjustified gate using cutset λ. Justification vector collection is done as described next.

A path from the root vertex of the BDD is traced to the terminal vertex whose value is equal to the value of the unjustified wire being analyzed. This path constitutes a justification vector. For instance, the justification vectors for a BDD for logic gate 40 using the cut set defined by cut 39 is shown in FIG. 6A.

A set of k such justification vectors is collected. Each justification vector is simulated by applying it to the cut. The intersection of all the gates that get a consistent Boolean value for each of the k justification vectors is collected in set PLAR. This set of gates constitutes the potential learning area. If all possible justification vectors in the BDD have been simulated, then set PLAR constitutes the set of true learning points.

Figure 14:
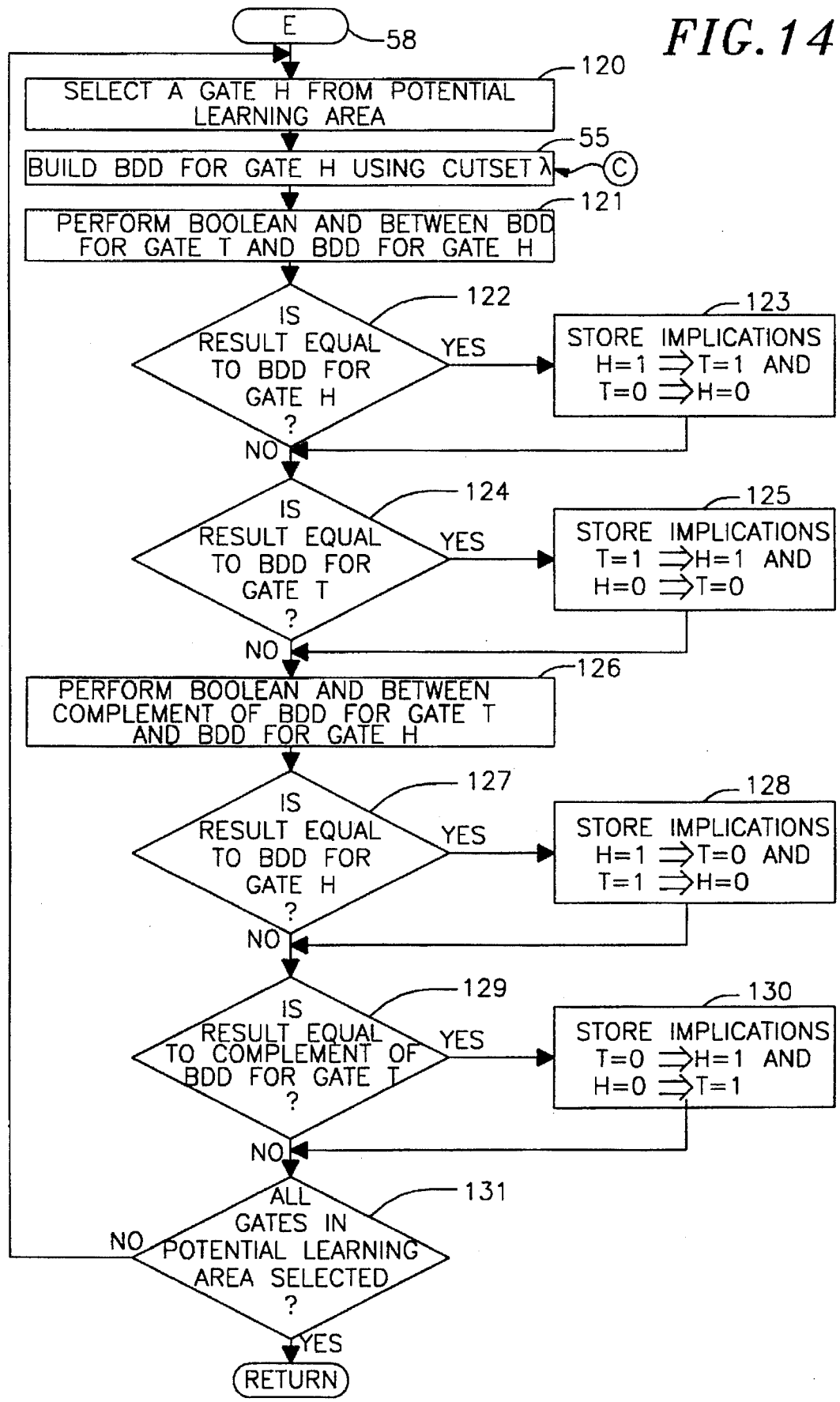
FIG. 14 is a flow chart illustrating the routine for learning implications between each gate in a potential learning area and a specific logic gate.

Once a potential learning area has been marked and it is not the true learning area, the learning process for determining implications between each gate in the potential learning area and the target gate T can begin (block 58). This includes building a BDD for each logic gate in the potential learning area, such as the BDD for logic gate 47 shown in FIG. 6B and the BDD for logic gate 38 shown in FIG. 6C, and carrying out Boolean operations, such as shown in FIG. 14.

The learning process is repeated until all gates in the potential learning area have been looked at (block 59). All unjustified gates not yet looked at in set $C_u$ are collected (block 60) and the steps of selecting a new target gate T, finding a cutset λ, building a BDD, marking potential learning areas, and learning implications are repeated until candidate set $C_u$ is empty (block 61). The process of finding implications is repeated until the predetermined maximum learning level is exceeded or all gates in the circuit are justified (block 62). If the maximum learning level has not been exceeded, it is increased during the next iteration if unjustified gates still remain in the cut (block 63). In a preferred embodiment, the learning level is increased in increments of physical levels of 1 and a learning level of 5 corresponds to a physical distance (level) of 5.

Figure 8:
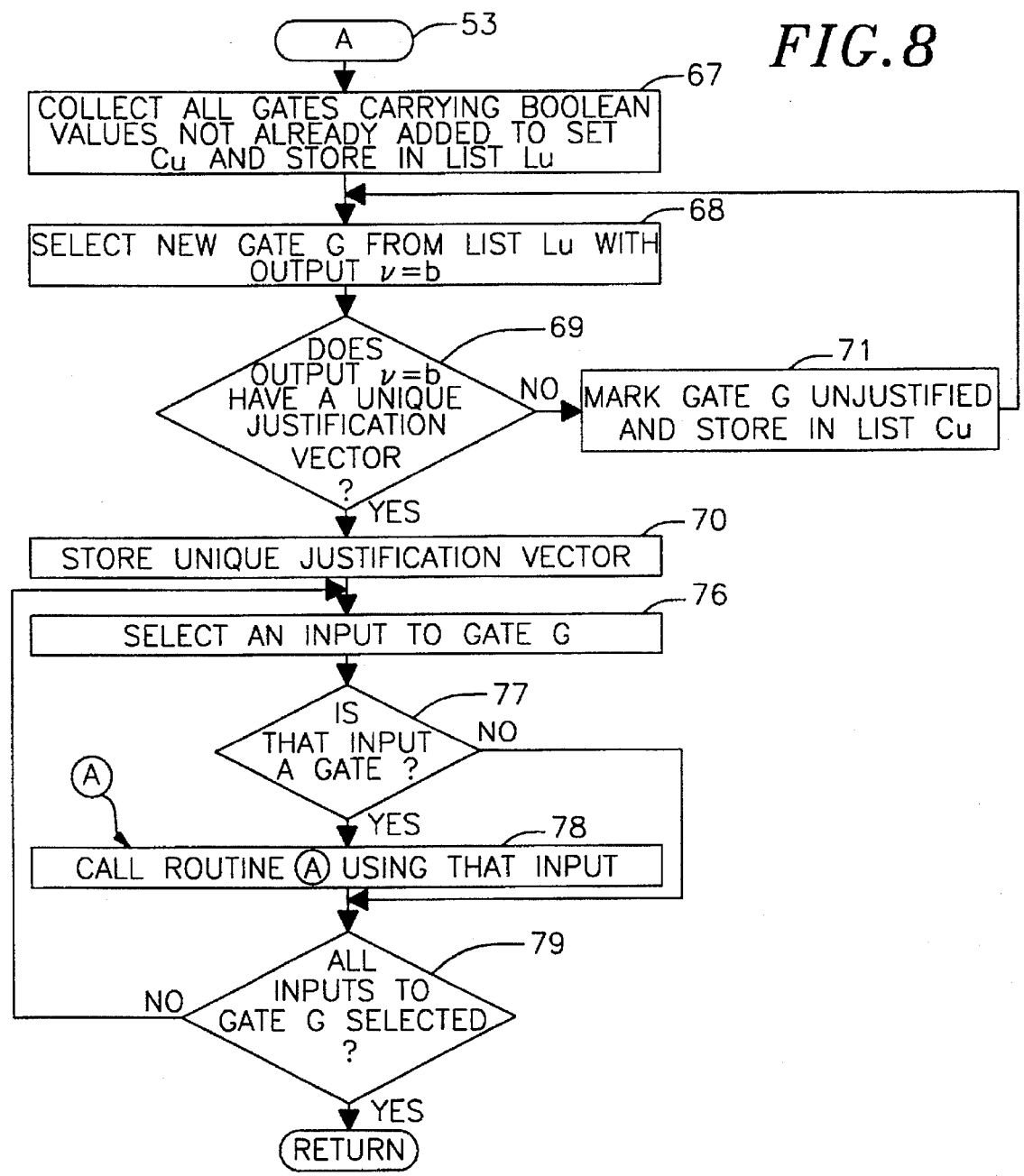
FIG. 8 is a flow chart illustrating the routine for finding unjustified gates located in the fan-in of a specific logic gate.

Referring to FIG. 8, a routine for finding unjustified logic gates in the transitive fan-in of a target logic gate (block 53) is shown. A depth-first search is used to trace backwards through the fan-in of a target logic gate G, such as shown in M. Abramovici et al., *Digital Systems Testing and Testable Design*, Computer Science Press (1990), the disclosure of which is hereby incorporated by reference.

The set $C_u$ contains only unjustified gates. Logic gates carrying Boolean values but not already added to candidate set $C_u$ are collected and stored in a list $L_u$ (block 67). A gate G with an output value b (equalling a Boolean 0 or 1) is selected from list $L_u$ (block 68). The input wires to gate G are examined to determine if, for the value b specified for the gate G, a unique justification vector exists whereby the specified value b is asserted (block 69). If a vector is found, that vector is stored (block 70). Otherwise, gate G is marked unjustified and added to the list $C_u$ (block 71). If gate G is not added to set $C_u$, an input to gate G is selected (block 76) and if that input is a gate (block 77), the routine recursively calls itself in a depth-first fashion using that input gate (block 78) until all inputs to gate G have been selected (block 79).

Figure 9:
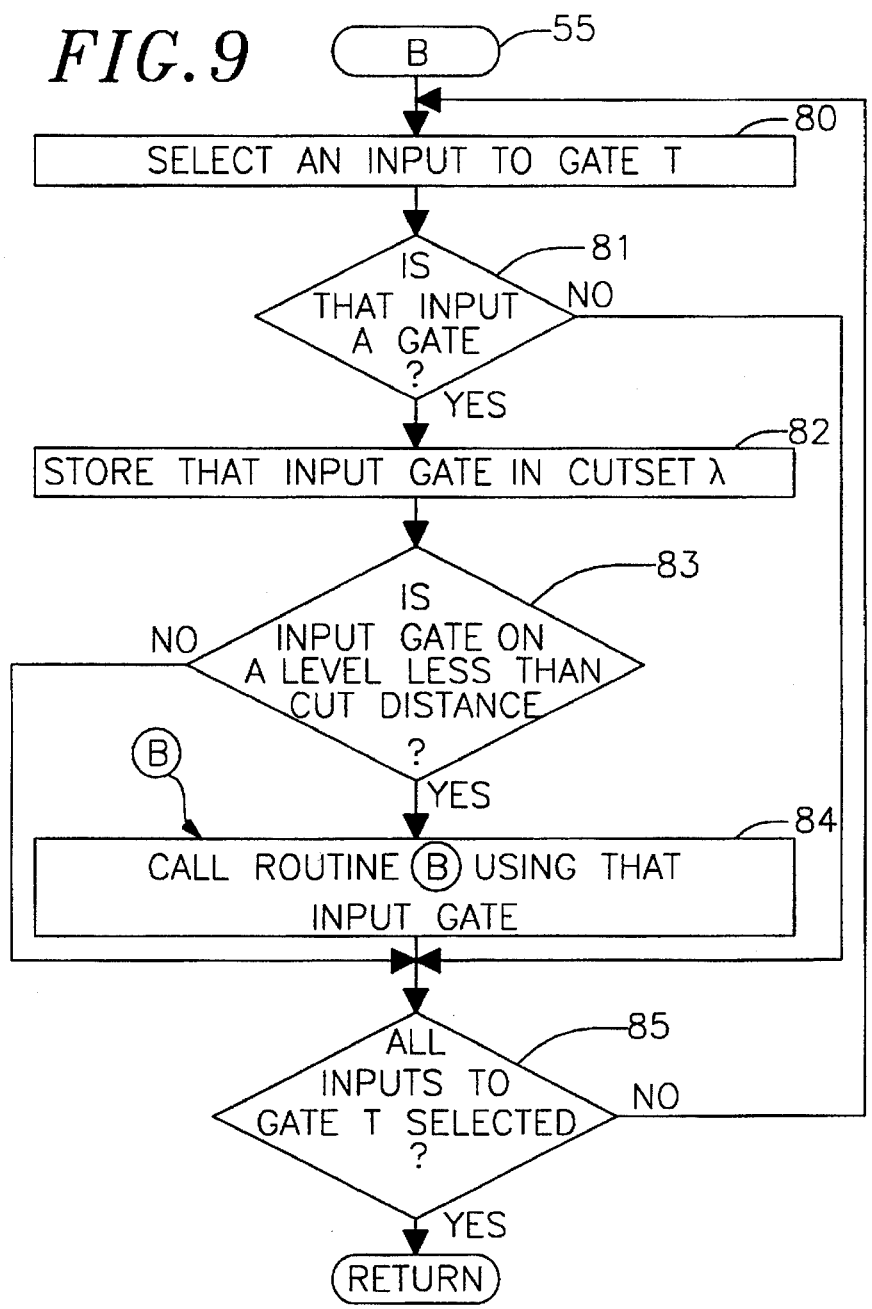
FIG. 9 is a flow chart illustrating the routine for finding a cutset for a specific logic gate.

Referring to FIG. 9, a routine for finding a cutset λ (block 55) is shown. A depth-first search is used to trace backwards through the fan-in of a target gate T (block 80) for each input to that gate (block 81). The routine recursively calls itself (block 84) until it has traced back a physical distance corresponding to the present learning level from the target gate T or has reached a primary input (block 83) and stores those gates in cutset λ (block 82). The depth-first search is recursively called on all inputs of the target gate T (block 85). After termination of all depth-first search calls, the gates in cutset λ will give the required cutset.

Figure 10:
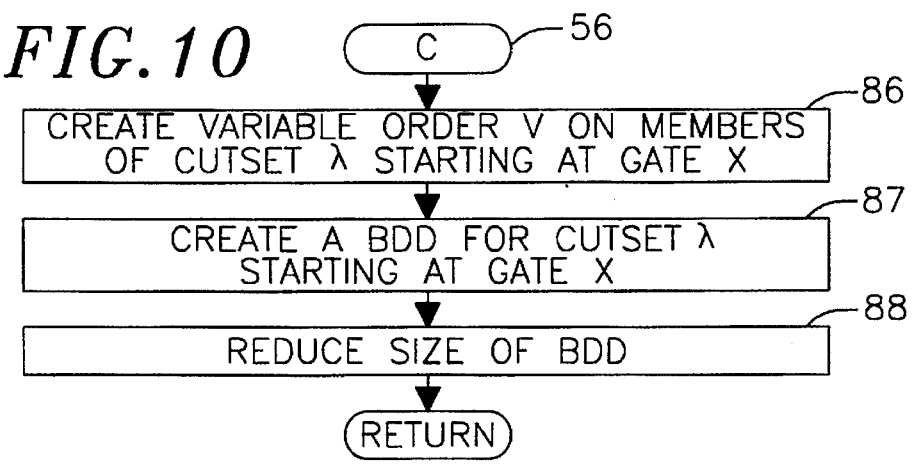
FIG. 10 is a flow chart illustrating the routine for building a BDD for a specific logic gate using its cutset.

Referring to FIG. 10, a routine for building a BDD (block 56) is shown. In a preferred embodiment, ordered BDDs are used. Thus, a variable order on the members of the cutset λ is created using, for instance, a depth-first search ordering routine (block 86), such as shown in S. Malik et al., *Logic Verification Using Binary Decision Diagrams in a Logic Synthesis Environment*, Intl Conf. on Computer-Aided Design (1988), at pages 6–9, the disclosure of which is hereby incorporated by reference. Using the variable order, a BDD for the cutset λ is built (block 87) and its size reduced (block 88). Two algorithms suitable for building and reducing the size of BDDs in connection with the present process are shown in R. E. Bryant, *Graph Based Algorithms for Boolean Function Manipulation*, IEEE Transactions on Computers, C-35 (Aug. 1986), at pages 677–690, the disclosure of which is hereby incorporated by reference.

An internal data structure, shown in FIG. 11, is maintained as a representation of a BDD constituting a series of vertex records. The low and high fields point to children vertices. For example, the 0-edge is the low field of vertex 44 in FIG. 6A. It points to vertex 45 which is its low child. Note that vertices 44 and 45 correspond to different wires in FIG. 4. The index field stores the structural depth of the vertex beginning with the root vertex. For example, the index field for vertex 44 equals 1 and for vertex 45 equals 2. The value field is either 0, 1 or X (don't care condition). For example, the high field for vertex 44 points to the terminal vertex whose value field equals 1. The value field of any non-terminal vertex is always X, since no value is actually contained therein and consequently, a don't care condition exists. The ID field contains an integer which uniquely identifies the vertex. The mark field marks which vertices have been visited during a traversal of the BDD.

Figure 6B:
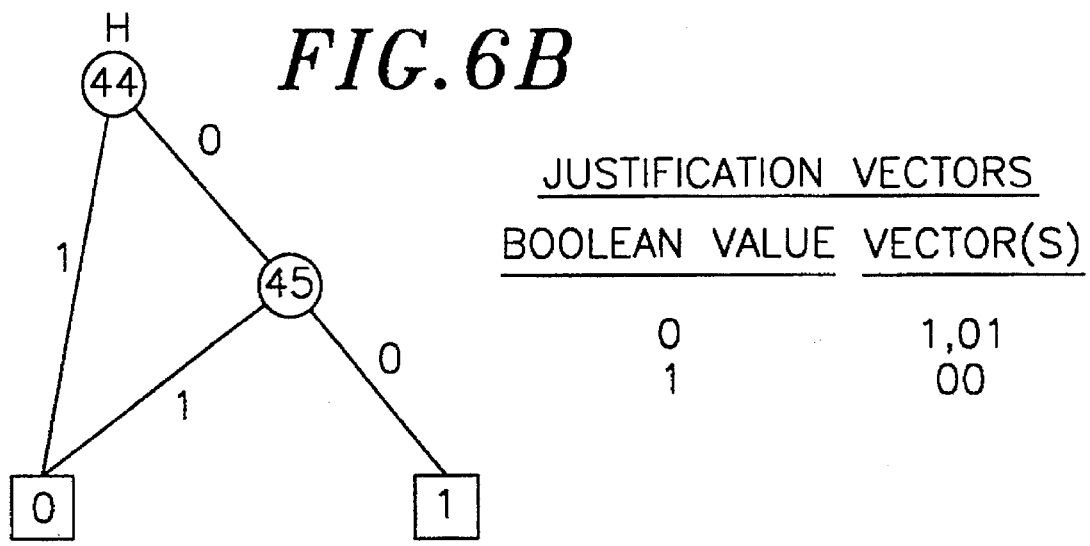
Figure 6C:
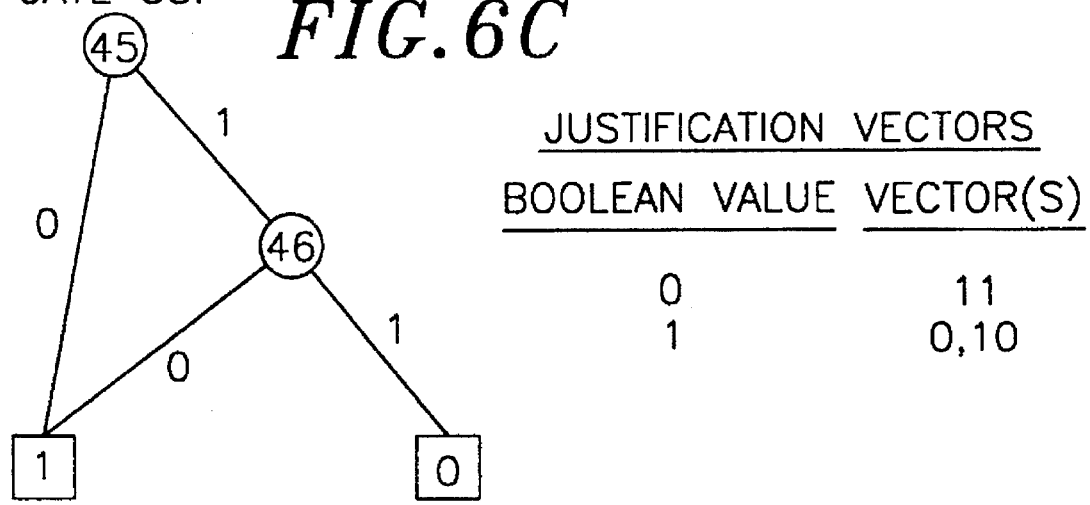
Figure 12A:
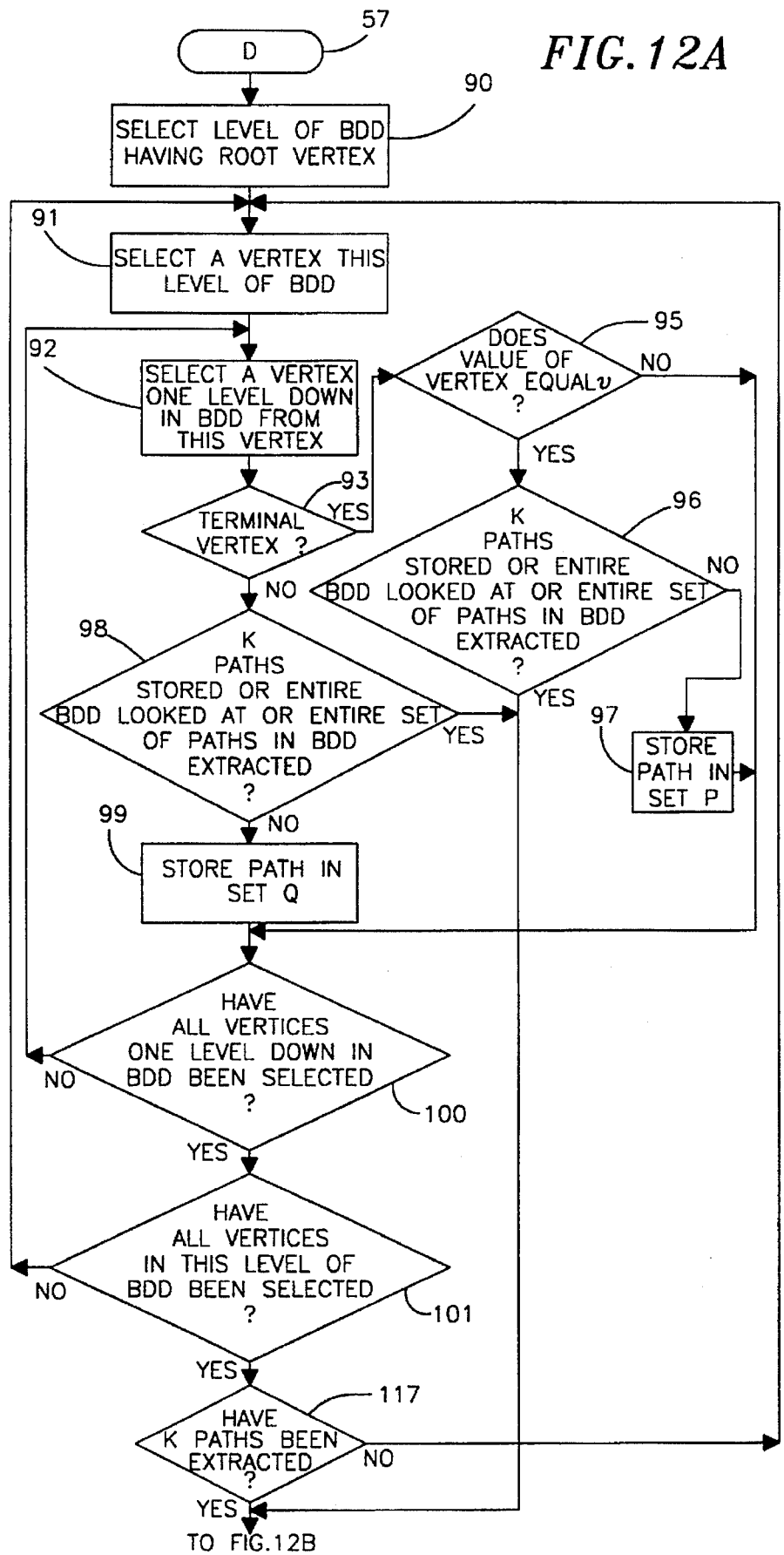
FIGS. 12A and 12B are a flow chart illustrating the routine for marking a potential learning area for a specific logic gate.
Figure 12B:
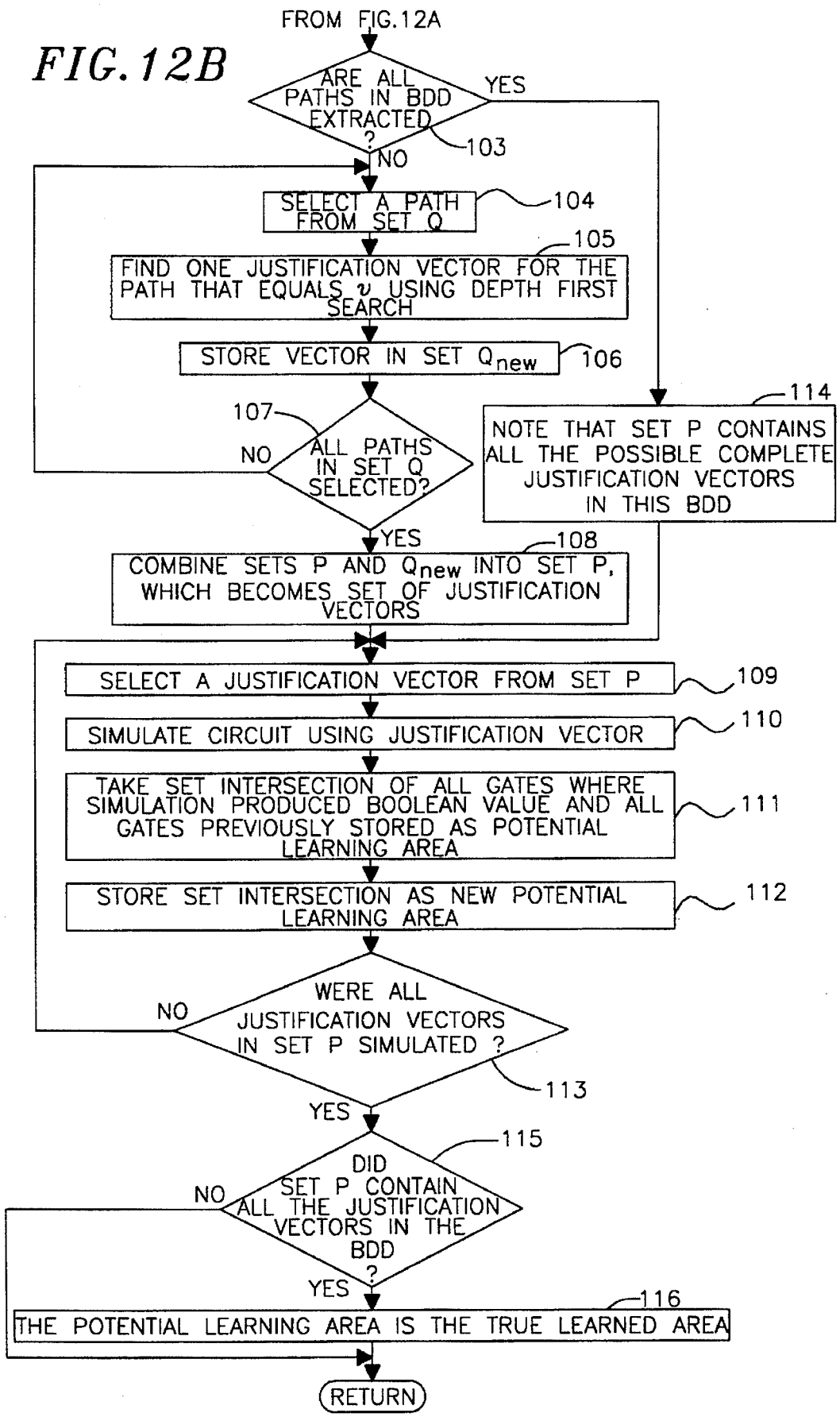

Referring to FIGS. 12A and 12B, a routine for marking a potential learning area for a Boolean value v (block 57) is shown. The BDD is preprocessed in three parts whereby a predetermined k justification vectors are extracted for each unjustified wire. In FIG. 6C, the logic gate 38 is fully justified for an output equaling an Boolean 0. In a preferred embodiment, the predetermined k is supplied by the user but empirically the value of k=100 has been found to be sufficient.

A justification vector is a walk from a root vertex in a BDD to a terminal vertex representing a predetermined Boolean value. Referring to FIGS. 6A, 6B and 6C, justification vectors for NAND logic gate 40, NOR logic gate 47, and NAND logic gate 38 are shown. In FIG. 6A, there are only justification vectors for the Boolean value 1. The Boolean value 0 is completely justified since there is only one set of signal assignments (0,0) whereby a Boolean 0 is asserted at logic gate 40. In FIG. 6B, the logic gate 47 is fully justified for an output equalling a Boolean 1.

An internal data structure, shown in FIG. 13, is maintained as a representation of a justification vector extracted from a BDD. The leaf_BDD field contains the BDD at the bottom of each justification vector. The path_length field contains the number of nodes in the justification vector. The partial_path field stores an array of the Boolean values for the branches occurring along the justification vector. The bottom_out field contains a flag indicating if the justification vector is complete or incomplete.

In order to illustrate the use of this data structure, consider the justification vector for the BDD shown in FIG. 6A consisting of the 0 branch of vertex 44 and the 0 branch of vertex 45. This justification vector justifies a Boolean 1 at the output of logic gate 47. The leaf_BDD field is the BDD representing a Boolean 0. The path_length equals 2. The partial_path field contains the integer identifiers of vertices 44 and 45. Both are needed to indicate that the 0 branch is used. The bottom_out field is a flag that is set to TRUE to indicate that the path bottoms out at a terminal vertex with a Boolean 0 value.

In part one, a justification vector is extracted using a breadth-first traversal of the BDD beginning at the root vertex. If a vector is incomplete (extracted only to a nonterminal vertex), during part two, a depth-first traversal is performed so that the justification vector can be completed. In part three, the circuit is simulated for each justification vector and a set of Boolean values in the circuit is determined which are consistent for all justification vectors. A detailed description follows.

Part one begins with the selection of the root vertex (block 90). A vertex on the present level of the BDD (block 91) and a vertex one level down are selected (block 92). If the selected vertex is a terminal vertex (block 93) equal to either a Boolean 0 or Boolean 1, it is compared to the target Boolean value v (block 95). If the values are equal and if a predetermined k paths have not been stored nor has the entire BDD been looked at nor has the entire set of paths in the BDD been extracted (block 96), the justification vector is stored in set P (block 97). Otherwise, if the vertex is a nonterminal vertex (block 93) and a predetermined k paths have not been stored nor has the entire BDD been looked at nor has the entire set of justification vectors in the BDD been extracted (block 98), the incomplete justification vector is stored in set Q (block 99) for further processing.

The steps of selecting a vertex one level down and determining whether it is a terminal vertex continues until all vertices one level down have been selected (block 100). Similarly, the step of selecting a vertex in the present level of the BDD is repeated until all vertices in the present level have been selected (block 101) or until k paths have been extracted (block 117) or no more paths can be extracted.

In part two, if a predetermined k paths have been extracted (block 103), an indication is set if during the process of extracting justification vectors, the whole BDD has been enumerated (block 114). A BDD is enumerated if all the possible justification vectors contained in that BDD have been extracted. In that case, all the paths in set P are complete.

As explained below, in this scenario, the simulation of all the vectors in set P will give a set of learning conditions.

Otherwise, a path is selected from the set Q of incomplete justification vectors (block 104). A depth-first traversal of the BDD is performed to find a justification vector equal to the target Boolean value v (block 105). The found vector is stored in set $Q_{new}$ (block 106). The depth-first traversal continues until all paths in set Q have been selected (block 107). The union of set P and set $Q_{new}$ is taken and stored in set P (block 108).

In part three, the fan-in and the fan-out of each justification vector is traced to carry out direct implications. A justification vector is selected (block 109) and the circuit is simulated using truth tables for the logic gates and the physical connectivity of the circuit to evaluate all logic gates that can be reached through forward and backward propagation (block 110). In a verification algorithm, all pre-stored Boolean values (implications) for the selected justification vector are also injected into the circuit.

Upon simulation completion, the intersection of the implication result vectors is taken to obtain the current vector of all consistent values for all the justification vectors simulated until this point (block 111). The intersection is stored as the new potential learning area set PLAR (block 112). Part three is repeated until all justification vectors in set P have been simulated (block 113).

In a post-processing part of the routine, if the indication that set P contained all the justification vectors in the BDD was set (block 115), then set PLAR constitutes the true learning area (block 116), Boolean operations using BDDs as described below need not be carried out for the logic gates in set PLAR.

Referring to FIG. 14, a routine for learning implications between each gate in the potential learning area and the target logic gate (block 58) is shown. Up to this point, the method determined logical relationships through direct implication. The routine shown in FIG. 14 performs indirect implication to learn further logical relationships occurring among logic gates in a digital circuit topology.

A logic gate H is selected from the potential learning area (block 120) and a BDD is built for that gate using the cutset λ (block 55). Indirect implications are learned by performing Boolean operations on the BDD for the target gate T and the BDD for gate H and determining logical interdependencies based on the results of the Boolean operation.

In a preferred embodiment, a Boolean AND on the BDD for the target gate T and the BDD for gate H (block 121) and a Boolean AND on the complement of the BDD for the target gate T and the BDD for gate H (block 126) are performed, but other simple or complex Boolean operations could also be performed, including Boolean NAND, OR, XOR, and other operations. Two of the possible outcomes from the Boolean AND operations are that the result equals the BDD for gate H (or its complement) (blocks 122 and 127) or equals the BDD for the target gate T (or its complement) (blocks 124 and 129). These results can be used to learn indirect implications by applying the Law of Contrapositum based on Table 1. Each set of indirect implications is stored (blocks 123, 125, 128 and 130) and the process repeats until all gates in the potential learning area have been selected (block 131).

For example, assume that the BDDs for gate T and gate H are ANDed and that the result equals the BDD for gate H. This means that when gate H equals a Boolean 1, the target gate T also equals a Boolean 1. Using the Law of Contrapositum, when the target gate T equals 0, it is indirectly implied that gate H will also equal 0.

TABLE 1

| Premise | Conclusion | Law of Contrapositum |
| --- | --- | --- |
| Ḡ ^ T = T | T = 1 → G = 0 | G = 1 → T = 0 |
| Ḡ ^ T = G | G = 0 → T = 1 | T = 0 → G = 1 |
| G ^ T = G | G = 1 → T = 1 | T = 0 → G = 0 |
| G ^ T = T | T = 1 → G = 1 | G = 0 → T = 0 |

The above discussion focuses on computing constant valued relations (learning) for purposes of illustration. It can also be used for computing functional dependencies (relations) between two signals which are more involved than constant valued relations. For example, given an unjustified gate G and a target gate T, a Boolean AND of two BDDs for these gates can be computed and stored if no learning was obtained but a small BDD H was generated. The resulting BDD H can be used as a target BDD in a constant valued learning procedure, but will result in "functionally valued" learning, rather than constant valued learning. The learning is functionally valued because a Boolean 0 or 1 value for BDD H need not always correspond to a single logic gate in the digital circuit having a constant Boolean value. Other operations besides a Boolean AND, in addition to more complex Boolean operations, can easily be used to further the process of learning functional valued relations.

Figure 15:
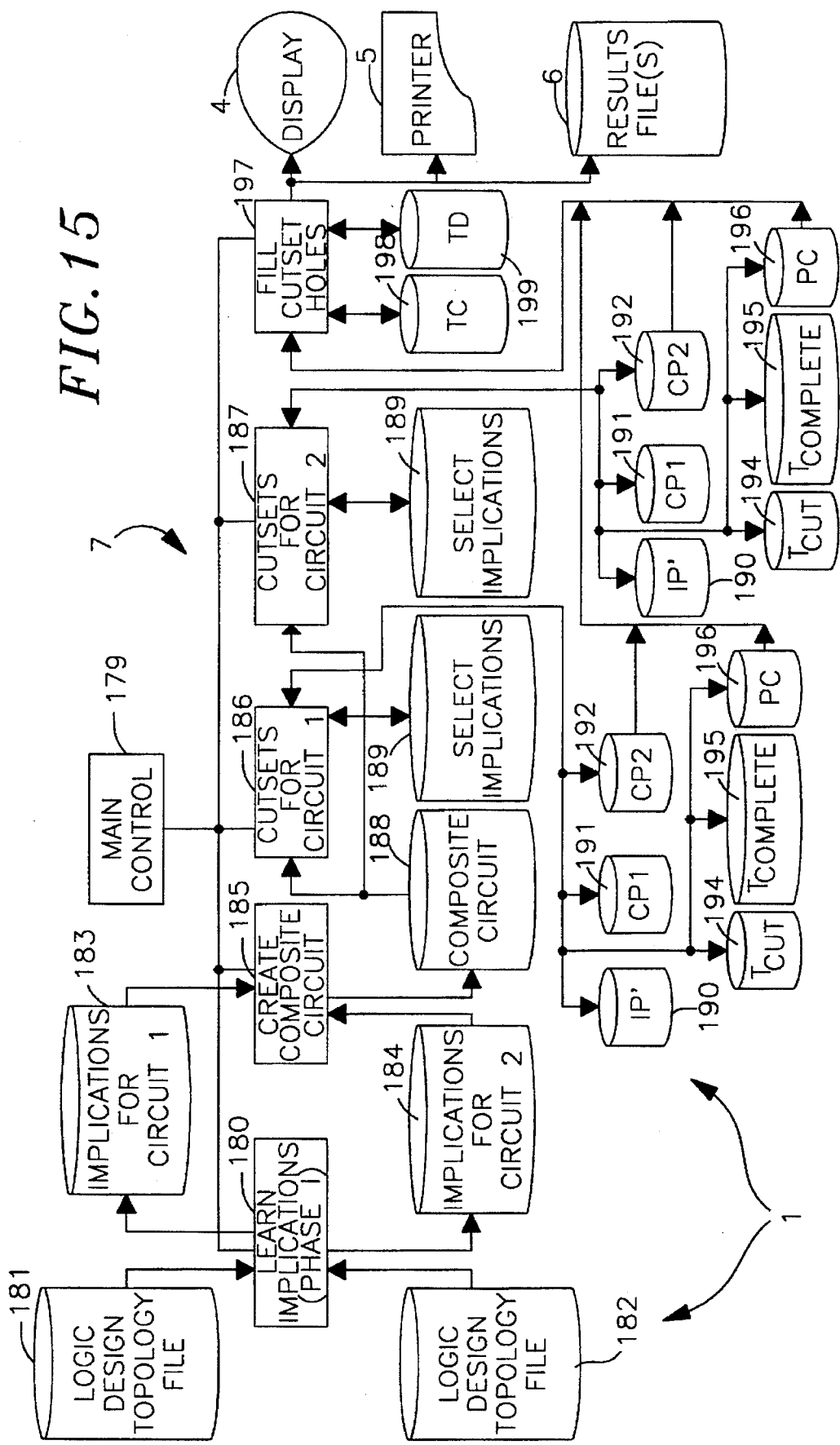
FIG. 15 is a block diagram of a computer-aided design system and method thereof for logic design verification using a group of logic gates with logical interdependencies as used in the system of FIG. 1.

II. Logic Design Verification Using a Group of Logic Gates with Logical Interdependencies A block diagram of a computer-aided design system and method thereof for logic design verification using a group of logic gates with logical interdependencies as used in the system of FIG. 1 is shown in FIG. 15. The computer program 7 consists of six main components (blocks 179, 180, 185, 186, 187 and 197), including a main control component 179 to coordinate the other components. The secondary storage device 1 contains 14 files (blocks 181, 182, 183, 184, 188, 189, 190, 191, 192, 194, 195, 196, 198 and 199). A learn implications component 180 is used to read in logic design topology files 181 and 182 for a pair of digital circuits. The learn implications component 180 constitutes the learning program shown in FIG. 2, however, it stores implications for two digital circuits, not just a single circuit, in a pair of implication files 183 and 184.

A create composite circuit component 185 is used to generate a composite circuit file 188 constituting the topologies for the two circuits joined at their primary outputs through an exclusive OR (XOR) logic gate. The cutset for the first circuit component 186 and the cutset for the second circuit component 187 both generate a cutset for their respective circuit and a reflection cutset for the other circuit. A plurality of intermediate data files IP' 190, CP1 191, CP2 192, $T_{cut}$ 194, $T_{complete}$ 195, and PC 196 are created. In addition, a select implications file 189 is used to store intermediate results.

If no complete cutset is found, the fill cutset holes component 197 reads in intermediate data files CP2 192 and IP' 190 to generate a complete cut. It also creates intermediate data files 198 and 199 and outputs its determination of whether the circuits have been verified on the display 200 and printer 201 and stored in results file 202.

Figure 16B:
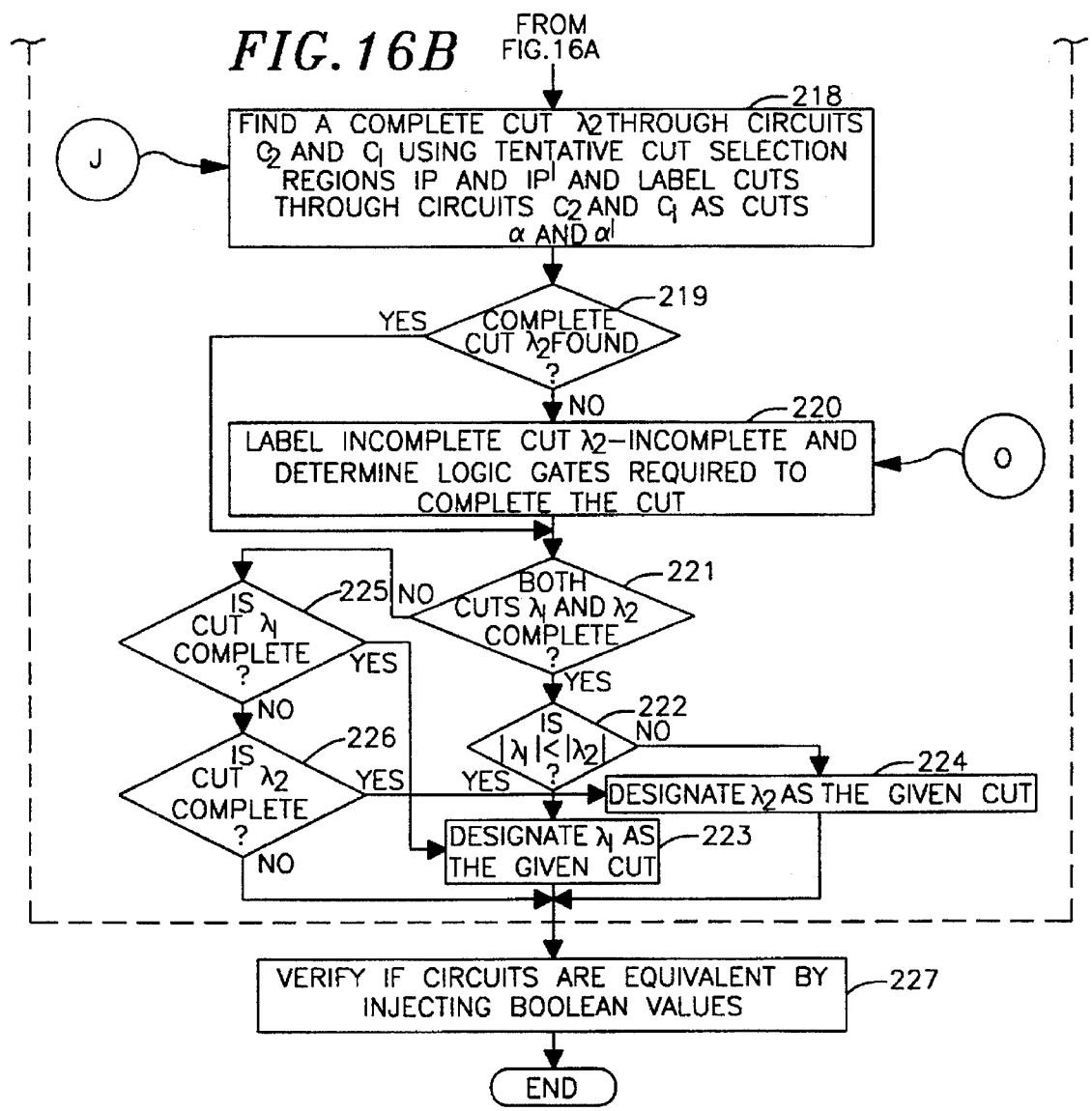

A preferred embodiment of the logic design verification using a group of logic gates with logical interdependencies program 210 is shown in FIGS. 16A and 16B. It operates in two phases. Phase I analyzes the logic designs of each circuit to be verified by learning logical interdependencies (implications) (block 211) using the computer program shown in FIG. 7.

A logical interdependency (implication) is a relation between two Boolean variables such that if one variable assumes some particular Boolean value, then the other variable is forced to assume another particular Boolean value. For example, referring back to FIG. 4, suppose a logical interdependency exists at logic gate 40 with respect to logic gate 48, such that whenever a Boolean 1 value is asserted on wire 41, a Boolean 1 value is also asserted on wire 49. The data structures used by Phase I are shown in FIGS. 17 and 18.

Figures 17A, 17B:
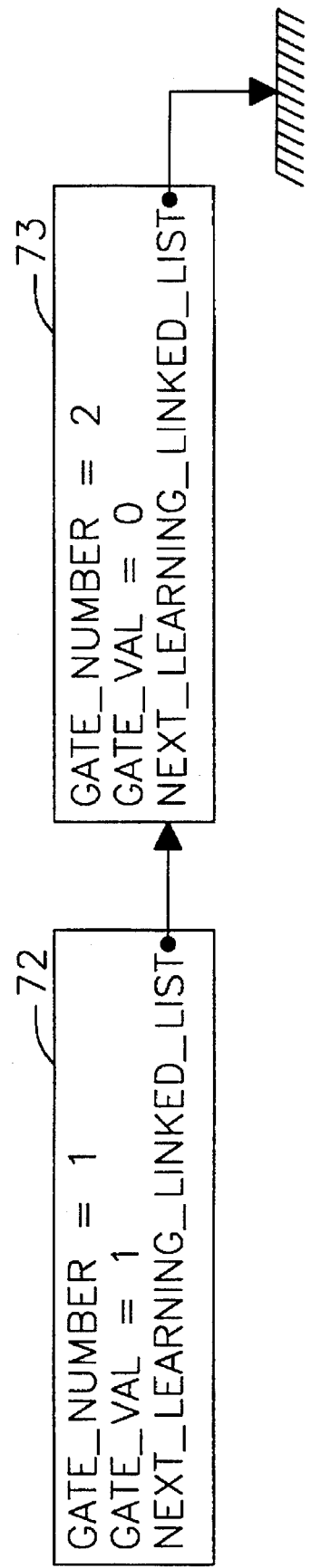
FIG. 17A is a linked list data structure for storing an interim list of logical interdependencies.
FIG. 17B is a diagram illustrating an example of the linked list data structure.

Referring to FIG. 17A, a linked list data structure for storing an interim list of logical interdependencies is shown. While Phase I is in progress, it is not known beforehand how many logical interdependencies will be obtained. Therefore, as each logical interdependency is found, it is appended to a dynamic linked list data structure. The gate_number field contains the logic gate number where a logical interdependency was obtained. The gate_val field identifies the Boolean value of the logical interdependency. Finally, the next_learning_linked_list field contains a pointer to the next element in the linked list. The last element in the linked list is grounded, that is, the next_learning_linked_list field has a value of NULL. This linked list data structure is assigned to each wire in the topology for each Boolean value for which a logical interdependency is found.

Referring to FIG. 17B, a diagram illustrating an example of the linked list data structure is shown. A first element 72 represents a logical interdependency equaling a Boolean 1 value for logic gate 1. It points to a second list element 73 representing a logical interdependency equaling a Boolean 0 value for logic gate 2. Element 73 is the last element in the linked list and points to a NULL value.

Referring to FIG. 18A, a data structure for storing and collecting logical interdependencies upon completion of a level of logic gates during Phase I is shown. Once all logical interdependencies for the learning level have been found, four lists are created: EQ_list, INV_list, LIST_0, and LIST_1. EQ_list contains a list of logic gates that are functionally equivalent to the gate to which the list is assigned. Similarly, INV_list contains a list of logic gates that are functionally inverse to the gate to which the list is assigned. LIST_0 and LIST_1 contain lists of logic gates that have logical interdependencies whenever Boolean 0 or Boolean 1 values are injected at the gate to which the lists are assigned, respectively.

The data structure for these four lists is shown in FIG. 18A. The length field contains the length of the learning list, that is, the number of logic gates in the list of logical interdependencies. The learning field contains a memory address pointer to an integer array containing the logical interdependencies for that gate. The integer values are either positive or negative gate numbers. A positive gate number signifies a Boolean 1 value has been obtained at the target gate and a negative gate number signifies a Boolean 0 has been obtained at the target gate.

Referring to FIG. 18B, a diagram illustrating an example of a set of logical interdependency lists for a gate k is shown. EQ_list lists four gates functionally equivalent to gate k: 5, 8, −10, and 12. Similarly, INV_list lists four gates functionally inverse to gate k: 1, −2, 7, and 11. LIST_0 lists three gates at which a logical interdependency for a Boolean 0 value is known: 3, 15, and 20. Lastly, LIST_1 lists five logic gates at which a logical interdependency for a Boolean 1 value is known: 4, 6, 9, 13, and 15.

Phase II verifies a pair of circuits. Its goal is to prove equivalency using a pair of partitions located between the primary outputs and a set of logic gates constituting a subset of each of the circuits.

Referring back to FIGS. 16A and 16B, a composite circuit is created (block 212) by matching the primary outputs from each of the two circuits and feeding them into a single XOR logic gate. Thus, any mismatch between the matching output logic signals is reflected in the output of the XOR gate.

Figure 39:
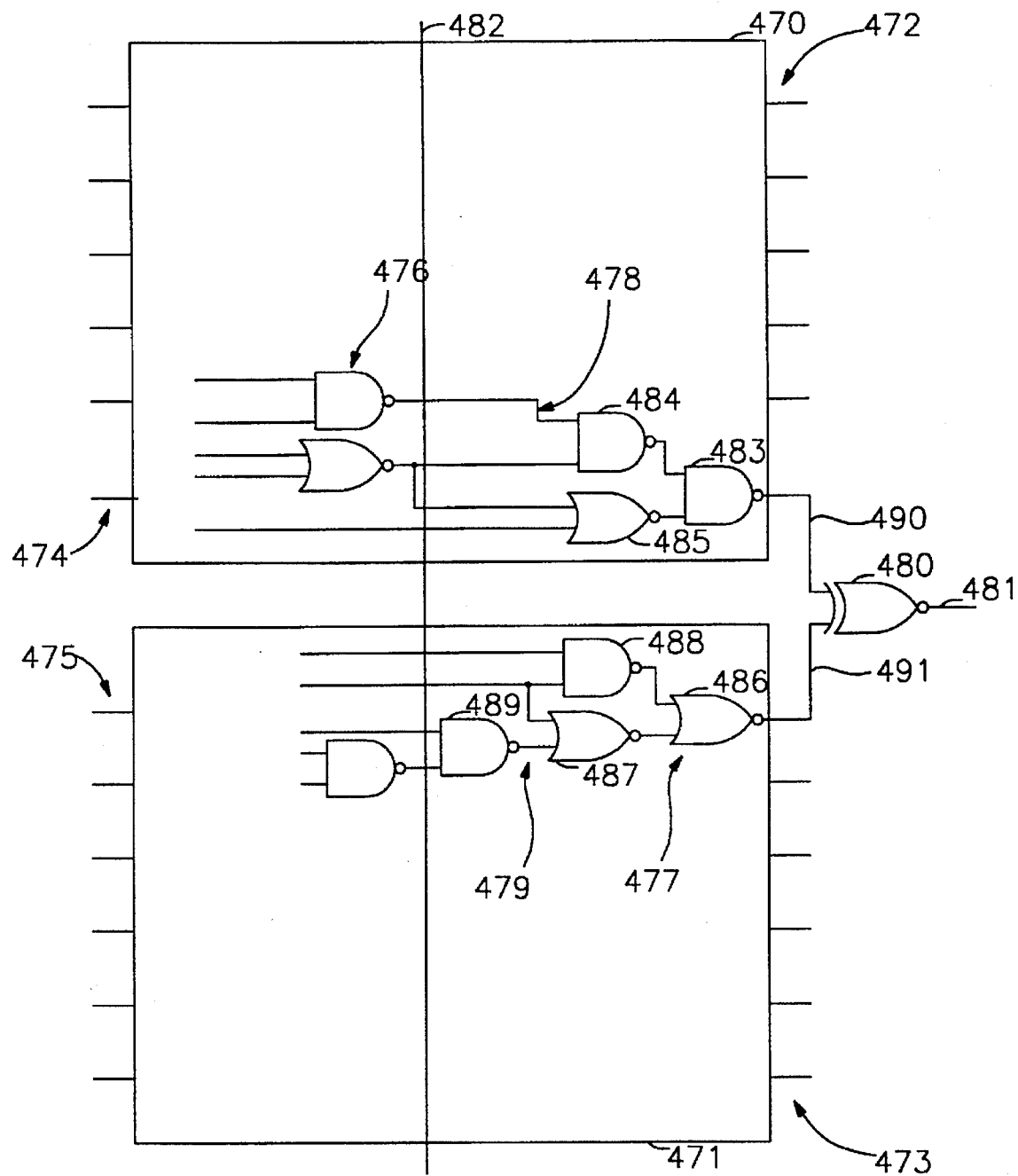
FIG. 39 is a logic design schematic illustrating the topologies of a composite digital circuit.

Referring to FIG. 39, a logic design schematic illustrating the topologies of a composite digital circuit is shown. The composite circuit constitutes a first and a second separate digital circuit topologies 470 and 471, each constituting a set of primary outputs 472 and 473 and primary inputs 474 and 475. The primary outputs are interconnected with logic gates 476 and 477 interconnected by wires 478 and 479. Each such primary output 490 for one of the separate topologies has a corresponding primary output 491 on the other separate topology. The corresponding primary outputs from each of the separate topologies are XORed together using an exclusive OR (XOR) logic gate 480 which asserts an output signal on wire 481 indicating equivalency between the two topologies. Although an XOR logic gate is depicted in FIG. 39, such a gate can be simulated whereby the corresponding output is logically XORed through a computer-aided design system using software. Similarly, the composite circuit can be simulated through similar means.

Equivalency can be verified by examining only a portion of the topologies of the two circuits constituting a pair of partitions located between a pair of internal cuts and the primary outputs. However, such a cut usually must be complete. A cut is called complete if every point in the cut has an implication point on or ahead of the cut in the same circuit or in some other circuit. If there are logic gates on the cut with no implications with respect to any other logic gate on or ahead of the cut, it is generally not possible to verify the two circuits by only examining the portions of the circuits falling between the primary outputs and the cut.

Thus, a tentative cut selection region IP for each circuit is found and a reflection tentative cut selection region IP' is found in the other circuit (blocks 213 and 217). Each such tentative cut selection region IP constitutes a set of logic gates falling between a tentative cut through each circuit and its primary outputs. An example of a tentative cut selection region IP is shown in FIG. 39, whereby the tentative cut 482 defines a tentative cut selection region IP constituting logic gates 483, 484 and 485. This region corresponds to a partition of the circuit and will be evaluated for suitability in performing digital circuit verification. Each such reflection tentative cut selection region IP' constitutes a set of logic gates occurring in the other circuit whereby each such implication point in the tentative cut selection region IP is mapped to a corresponding implication point in the other circuit. This set of mapped points is termed the reflection region IP'. An example of a reflection region IP' is shown in FIG. 39, whereby the tentative cut 482 defines a reflection region IP' constituting logic gates 486, 487, 488 and 489.

For both the tentative cut selection region IP and the reflection tentative cut selection region IP', there is a cut through points in the logic gates that potentially can constitute a complete cut forming a partition of the two circuits. Both circuit 1 (block 214) and circuit 2 (block 217) are analyzed separately to create a tentative cut selection region IP for each with a reflection tentative cut selection region IP' mapping to the other respective circuit. Thus, an optimal cut, that is, a partition of smaller size, can be found so as to minimize the amount of computational resources required to perform verification. The pair of individual cuts through circuits 1 and 2 based on their respective tentative cut selection region IP and reflection tentative cut selection region IP' is termed a complete cut $\lambda_1$ and $\lambda_2$ for circuits 1 and 2, respectively. If either is not a complete cut (blocks 215 and 219), they are labeled as incomplete cuts $\lambda_{1-incomplete}$ and $\lambda_{2-incomplete}$, respectively, and the logic gates required to complete these incomplete cuts are determined (blocks 216 and 220).

A complete cut through each of circuits 1 and 2 using the tentative cut selection region IP and reflection tentative cut selection region IP' is attempted and these pairs of cuts are labeled as cuts $\alpha$ and $\alpha'$, respectively (blocks 214 and 218).

If complete cuts $\lambda_1$ and $\lambda_2$ are found for both circuits 1 and 2 (block 221), the sizes of these cuts are compared (block 222). The size of a cutset is defined in terms of number of gates. A hole in a cutset means that there is a gate in the cutset with no implications in the other circuit on or ahead of the cut. If the cutset $\lambda_1$ is smaller, it is designated the complete cut (block 223). Otherwise, the cutset $\lambda_2$ is so designated (block 224). If only cut $\lambda_1$ is complete (block 225), it is designated as the cut for the circuits (block 223). Otherwise, if only cut $\lambda_2$ is complete (block 226), it is designated instead (block 224).

Once the testing of cutset completeness has been performed, the topologies are verified by injecting Boolean values into the wires for each of the gates constituting the cuts $\lambda_1$ or $\lambda_2$ (block 227). An output signal is asserted from the XOR logic gate to indicate equivalency between the topologies. If the output signal equals a Boolean 0 value, the circuits are verified to be equivalent.

Figures 19, 20:
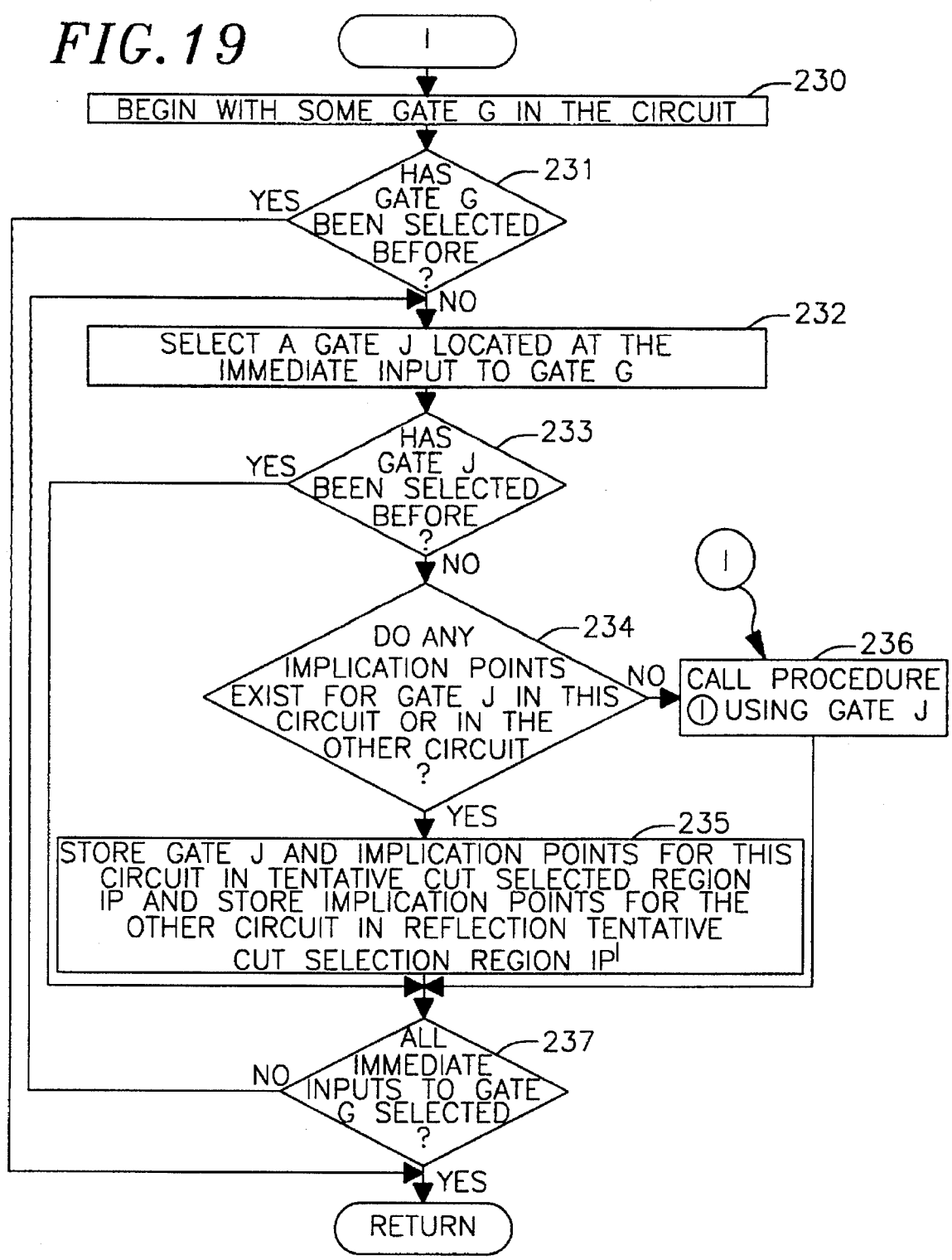
FIG. 19 is a flow chart illustrating a routine for finding a cutset α starting from the primary outputs.
FIG. 20 is a data structure for storing a tentative cut selection region and a reflection tentative cut selection region.

Referring to FIG. 19, a routine for finding a cutset $\alpha$ starting from the primary outputs is shown. It traces backwards through the fan-in of an output gate to select a set of implication points for forming a partition. An output gate G somewhere in the target circuit is selected (block 230) and if gate G has been selected before (block 231), the routine terminates.

Since the fan-in of gate G is being traced backwards towards the primary inputs, a gate J is selected that is located at the immediate input to gate G (block 232). If gate J has not been selected before (block 233), the set of stored learned implication points for gate J is examined to determine if any implication points exist for gate J in the present circuit or in the other circuit (block 234). If such implication points exist in the same circuit, they are stored in the tentative cut selection region IP along with gate J for the circuit being analyzed and any implication points in the other circuit are stored in the reflection tentative cut selection region IP' for the other circuit (block 235). If no such implication points exist, the procedure recursively calls itself using gate J (block 236). The process repeats until all immediate inputs to gate G have been selected (block 237).

Referring to FIG. 20, a data structure for storing the tentative cut selection region IP and the reflection tentative cut selection region IP' is shown. It constitutes an integer array of logic gate numbers constituting the tentative cut. The maximum size of this array is defined by the cut size_macro which sets a maximum array dimension using a preprocessor command.

Referring to FIGS. 21A and 21B, a routine for finding a reflection cutset $\alpha$ is shown. Its purpose is to create a partition in a second circuit that functionally corresponds to the partition in a first circuit.

During the first part of this routine, all logic gates in a second circuit that can be reached from a given primary output yet cannot be reached from the gates in the reflection tentative cut selection region IP' are marked (block 240).

Recall that the reflection tentative cut selection region IP' contains stored logical interdependencies (learned implication points) for the given output gates in the second circuit having a matching output gate in the first circuit. These stored interdependencies are empirically or logically implied beforehand and stored in implication files 183 and 184 using the data structure shown in FIGS. 18A and 18B. Thus, a logic gate in a first circuit can be reflected in a second circuit using one of the these stored logical interdependencies, even though such relationship is not directly implied due to the separateness of the two circuits being verified.

If the reflection tentative cut selection region IP' is a complete cut (block 241), the logic gates in the first circuit are analyzed by tracing backwards from its primary outputs. A gate G is selected (block 257) and a backward tracing procedure is called to identify all gates in the first circuit that map to a point in the reflection tentative cut selection region IP' in the second circuit (block 258). This process is repeated until all of the primary outputs have been selected (block 259).

If the reflection tentative cut selection region IP' does not constitute a complete cut, the gates which cannot be reached by logic gates in reflection tentative cut selection region IP' are stored as candidate points in set CP1 (block 242). Similarly, all gates in the set of learned implications for the second circuit that have an implication point either on or ahead of the cut $\alpha'$ for the reflection tentative cut selection region IP' are marked (block 243) and stored as candidate points in set CP2 (block 245).

During the second part of this routine, the fan-in of each output gate in the second circuit is recursively analyzed to determine whether some gate in CP2 can form a cutset for every gate in CP1. A gate K is selected for some output gate G (block 248) and the recursive procedure is called for gate K (block 249). The procedure is repeatedly called until all input gates for output gate G have been selected (block 250).

The recursive search started at output gate G is stopped if a gate is found to be in CP1 and CP2. Such a gate is stored in array $T_{cut}$. Upon the completion of the search procedure, the members of the array $T_{cut}$ are added to the reflection tentative cut selection region IP' (block 251).

If the search procedure reaches the primary inputs, the cut is incomplete. Otherwise, a complete cutset has been found (block 252). Extraneous gates are pruned from the reflection tentative cut selection region IP' which when added to $T_{cut}$ gives the needed cut (block 253). This cutset is located by determining through a depth-first search the frontier of gates closest to the primary outputs. The procedure (block 255), similar to that described above, recursively analyzes every input of each output gate G (block 254) until all input gates in the fan-in have been analyzed (block 256).

Referring to FIG. 22, a routine for filling a hole in a cutset is shown. It attempts to create a cut by searching out the set of logical interdependencies (learned implication points) stored during Phase I to bridge the gap in a circuit partition. To bridge the gap, it seeks some gates (even without any stored implications) which, when added to the set of learned implications, help derive a possibly small cutset.

During the first part of this routine, a gate K is selected from the set $\alpha$ (block 260) and if gate K has been examined before (block 261), the routine terminates. Otherwise, if gate K is not reachable from the set of candidate points CP1 (block 262), the routine terminates. If gate K is in the candidate set CP1 and the candidate set CP2 (block 263), gate K is added to the array $T_{cut}$ (block 264) and the routine terminates. Otherwise, if gate K is a primary input (block 265), no complete cut can be found (block 266) and the routine terminates. Otherwise, an input gate I for gate K is selected (block 267) and the procedure recursively calls itself (block 268) until all input gates for gate K have been selected (block 269).

Figure 23:
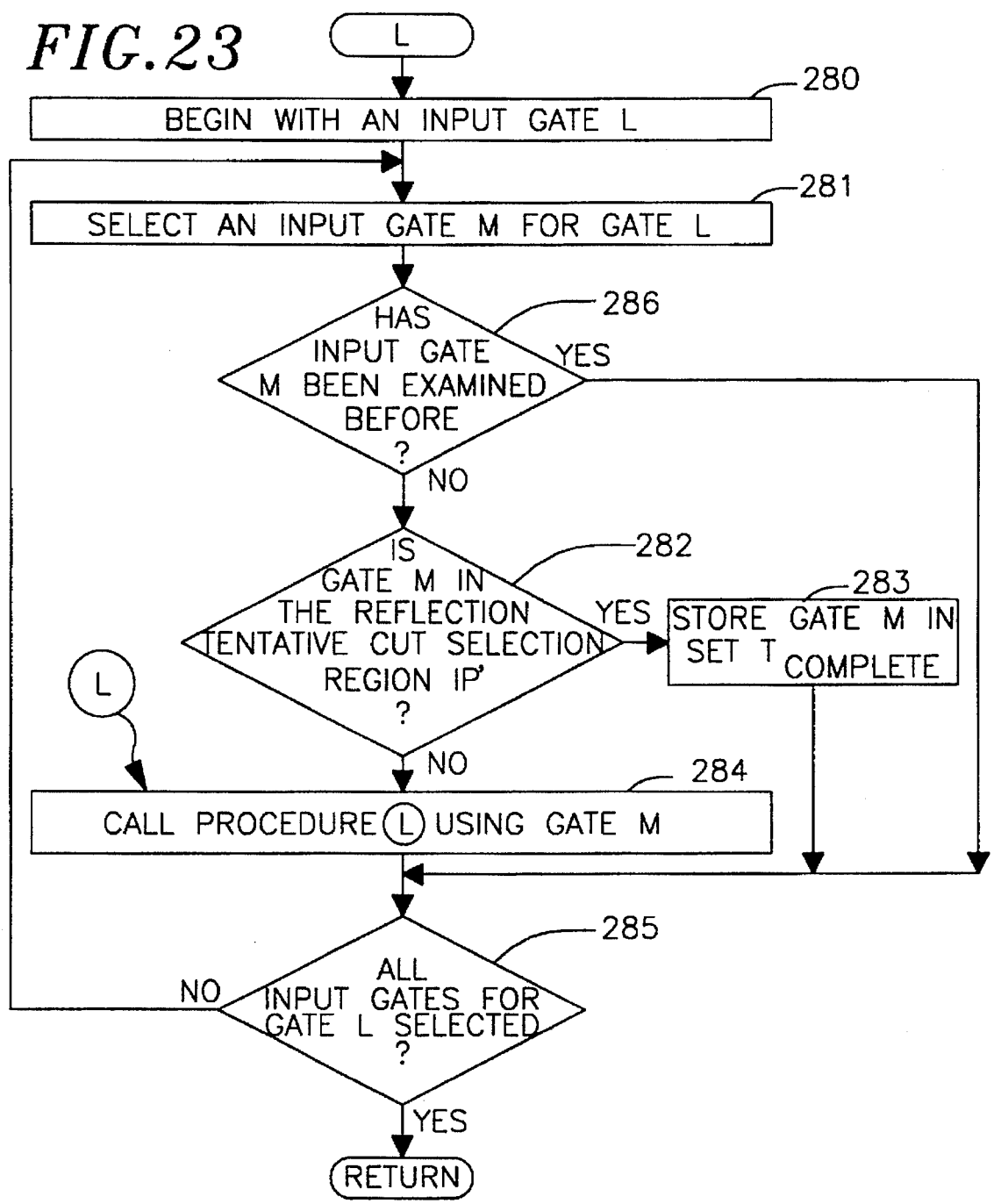
FIG. 23 is a flow chart illustrating a routine for tracing backwards through the fan-in of a gate to determine whether it falls within a reflection tentative cut selection region.

Referring to FIG. 23, a routine for tracing backwards through the fan-in of a logic gate to determine whether it falls in the reflection tentative cut selection region IP' is shown. An input gate M is selected (block 281) for some gate L located in the circuit (block 280). If the input gate M has been examined before (block 286), it is skipped and another gate is selected. Otherwise, if gate M is in the reflection tentative cut selection region IP' (block 282), it is stored in set $T_{complete}$ (block 283). If gate M does not fall within the region, the procedure recursively calls itself using gate M (block 284). The procedure repeats until all input gates for the given gate L have been selected (block 285).

Figure 24:
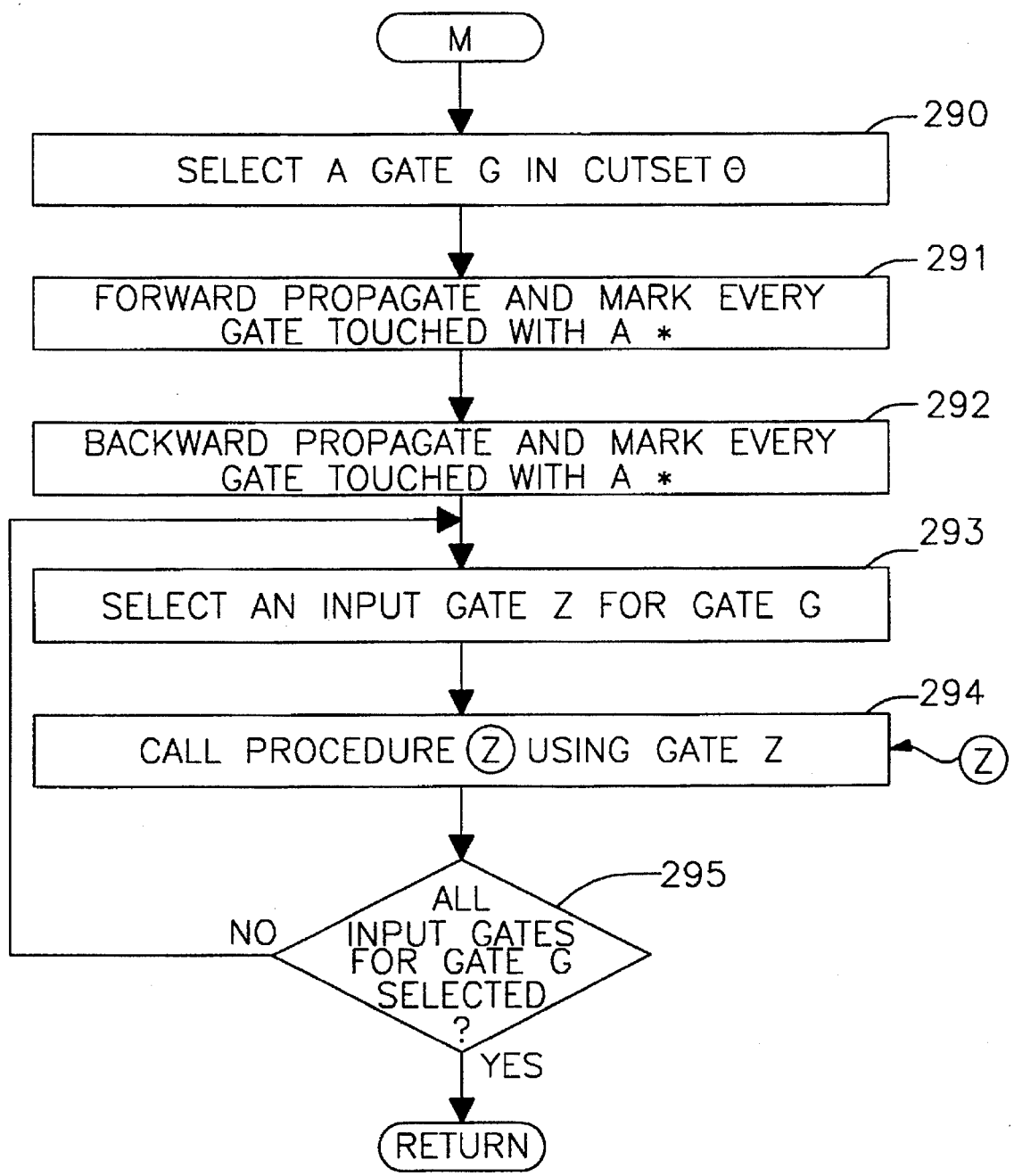
FIG. 24 is a flow chart illustrating a routine for deciding if a cutset is complete.

Referring to FIG. 24, a routine for deciding if a cutset $\theta$ is complete, that is, that there are no inputs in the circuit that are reachable from the primary outputs exclusive of the gates in set $\theta$, is shown. This procedure determines if a given partial cutset stored in array $\theta$ is a complete cutset or if it has a hole in it. Array $\theta$ represents a region of gates in a circuit and the routine in FIG. 24 determines if the given region blocks any input gate in the circuit from reaching an output gate.

A gate G is selected from the partial cutset (block 290). Its fan-out (block 291) and fan-in (block 292) are traced through the circuit topology using forward and backward propagation, respectively, and marked with a "*". This selection and marking process is repeated for every input gate Z for gate G (block 293) using a recursive call to itself (block 294) until all input gates to gate G have been selected (block 295). If all gates in the circuit are marked with a "*", the cutset is complete.

Figure 25:
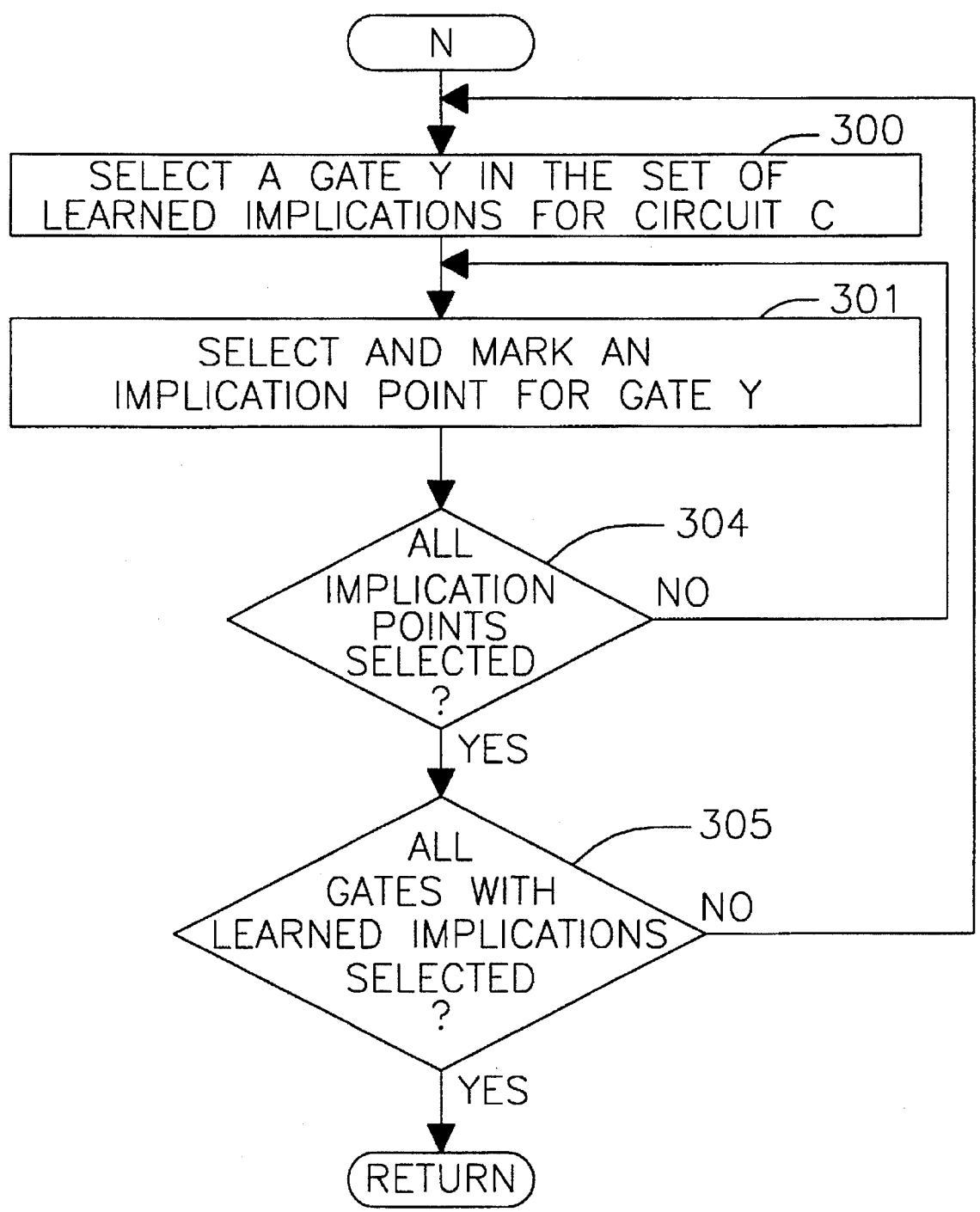
FIG. 25 is a flow chart illustrating a routine for marking logic gates in a set of logical interdependencies.

Referring to FIG. 25, a routine for marking logic gates in the set of logical interdependencies is shown. A gate is selected from the set of logical interdependencies (learned implications) (block 300) and an implication point for that gate is selected and marked (block 301). The process is repeated until all implication points have been selected (block 304) and every gate with logical interdependencies has been selected (block 305).

Figure 26:
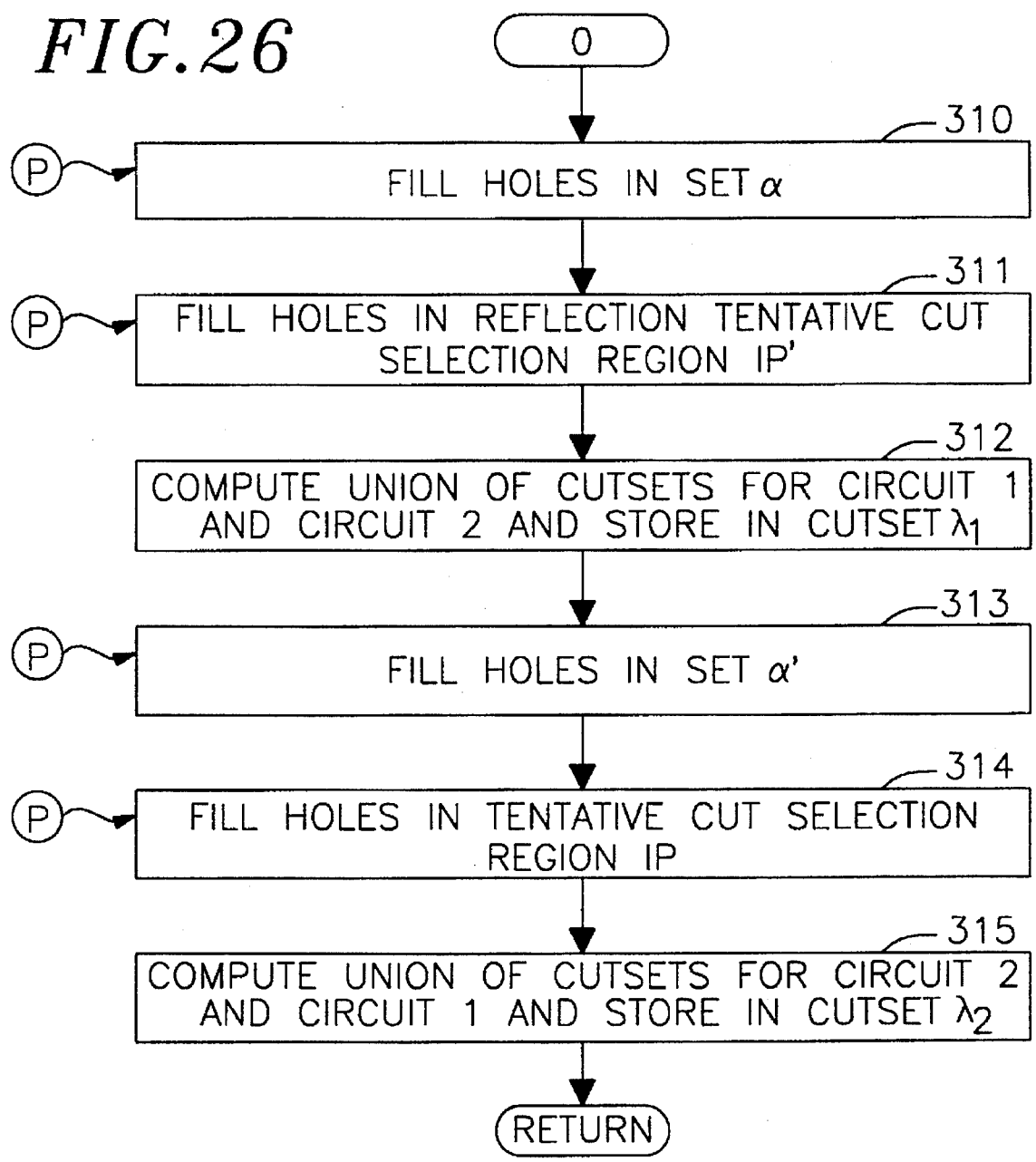
FIG. 26 is a flow chart illustrating a routine for determining the logic gates required to complete an incomplete cut.

Referring to FIG. 26, a routine for determining the logic gates required to complete an incomplete cut is shown. Any hole in the partial cutsets $\alpha$ (block 310) and $\alpha'$ (block 313) is filled. Similarly, any hole in the reflection tentative cut selection regions IP' (block 311) and IP (block 314) is filled. Recall that for circuit 1, a complete cut constitutes the partial cutset $\alpha$ and the reflection tentative cut selection region IP'. Similarly, for circuit 2, a complete cut constitutes the partial cutset $\alpha'$ and the tentative cut selection region IP. Consequently, a union of these two cutsets is computed and stored in cutset $\lambda_1$ (block 312) and $\lambda_2$ (block 315) as complete cutsets for circuits 1 and 2, respectively.

Figures 27A, 27B, 28:
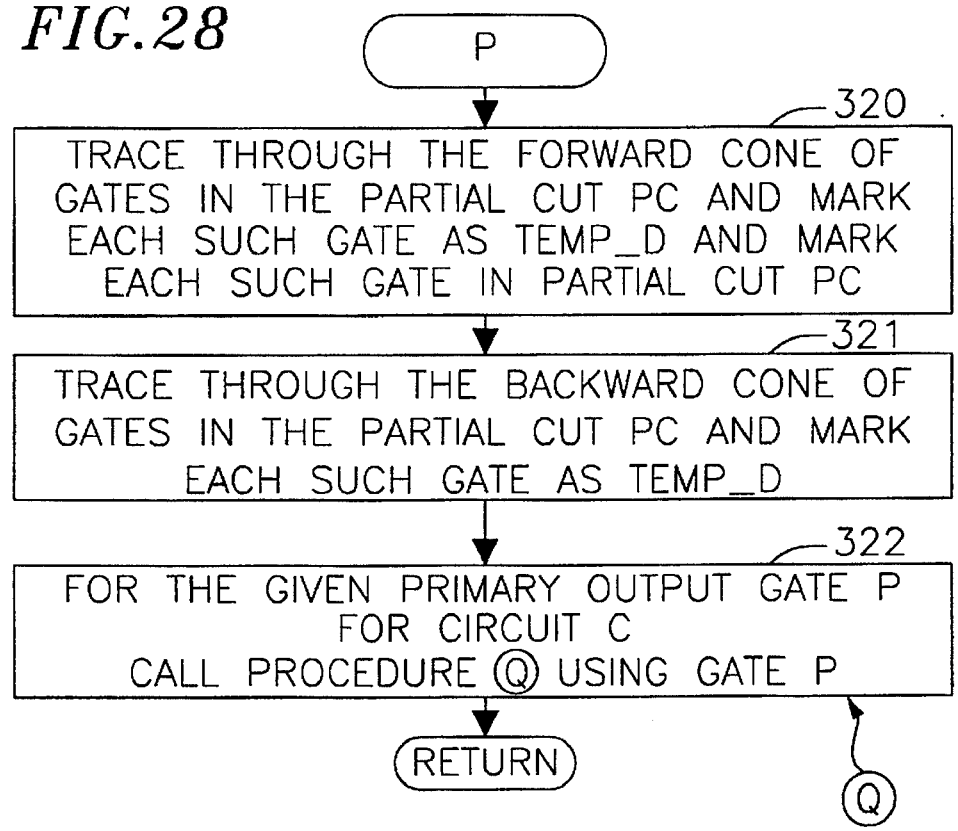
FIG. 27A is a data structure for storing a cutset.
FIG. 27B is a data structure for storing a cut.
FIG. 28 is a flow chart illustrating a routine for tracing and marking logic gates in a partial cut.

Referring to FIG. 27A, a data structure for storing cutset $\lambda_1$ and $\lambda_2$ is shown. The gate_number field stores a unique number identifying each logic gate in the circuit. The EQ_flag, INV_flag, and BOTH_flag fields contain flags respectively indicating if the given logic gate has an equivalent logic gate, an inverse logic gate, or a logical interdependency, either in this circuit or in the other circuit. Note that the equivalent gates, inverse gates, and logical interdependencies are stored in each learning lists for each given logic gate. The 0_flag and 1_flag fields contain a flag respectively indicating that the given gate has a logical interdependency whenever a Boolean 0 or Boolean 1 value is injected at that gate. Finally, the complete_flag indicates whether the cut is complete.

Referring to FIG. 27B, a data structure for storing cut $\alpha_1$ and $\alpha_2$ is shown. It constitutes an array of data structures as shown in FIG. 27A. The maximum size of this array is defined by the cut_size macro which sets a maximum array dimension using a preprocessor command.

Referring to FIG. 28, a routine for tracing and marking logic gates in a partial cut is shown. The forward cone (block 320) and backward cone (block 321) of each gate in the partial cut PC is traced and marked through a traversal of the transitive fan-out and fan-in of each such logic gate and each gate encountered is also marked as TEMP_D. In the second part of this routine, a primary output gate P is selected and analyzed to determine whether it bridges the gap constituting the hole in the partial cut PC (block 322).

Figure 29:
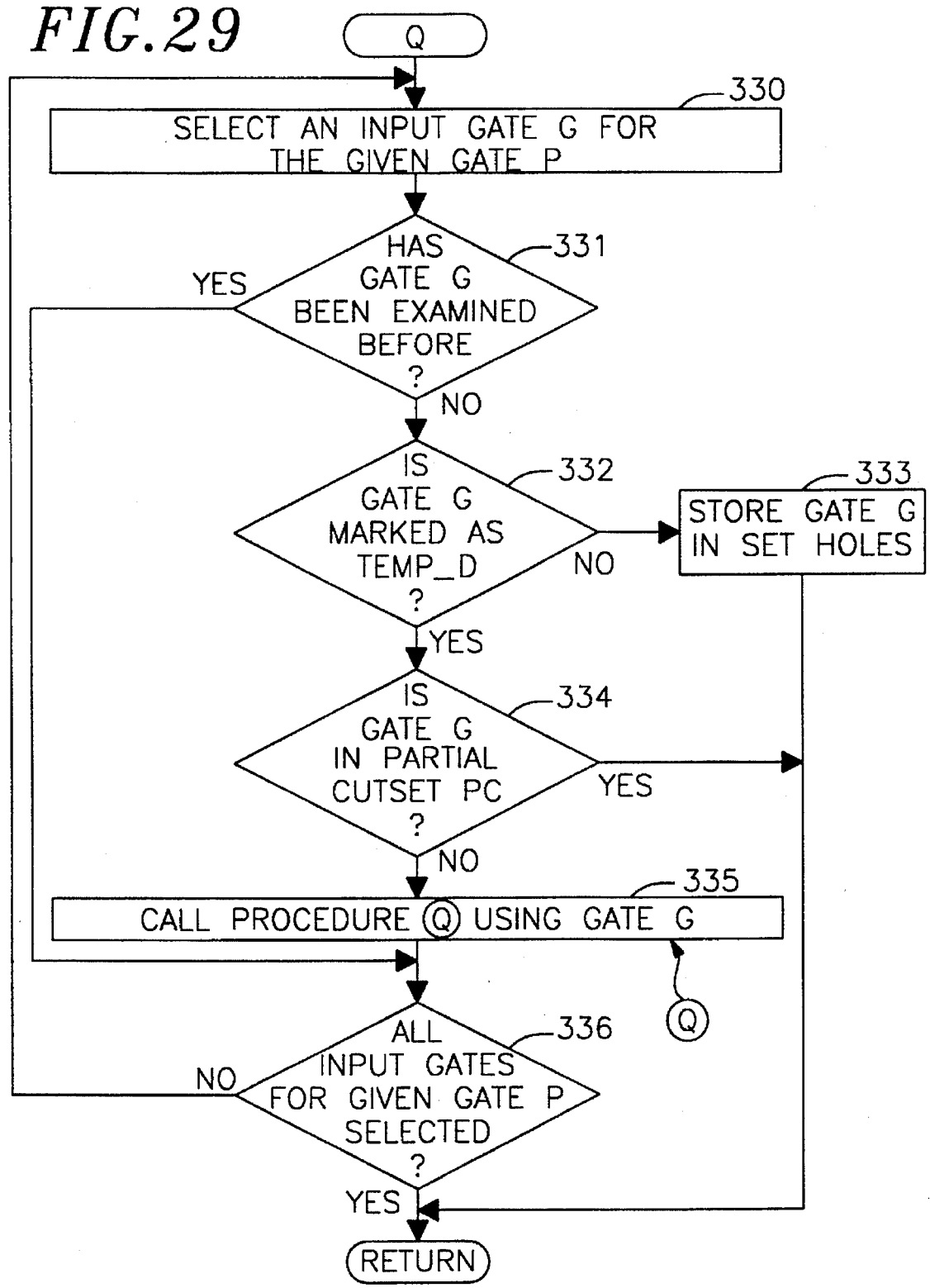
FIG. 29 is a flow chart illustrating a routine for searching for logic gates bridging a gap between those gates in the set of logical interdependencies and those logic gates which are not.

Referring to FIG. 29, a routine for searching for logic gates bridging a gap between those logic gates in the set of logical interdependencies and those logic gates which are not is shown. An input gate G for the given gate P is selected (block 330). If gate G has not been examined before (block 331) and was not marked as TEMP_D in a previous routine (block 332), gate G is stored in set HOLES (block 333), which constitutes the set of logic gates in a gap of a partial cut PC.

If gate G was marked as TEMP_D and is also in the partial cutset PC (block 334), no further analysis need be performed since gate G is also considered in the gap. Otherwise, the procedure calls itself recursively using gate G (block 335) and repeats until all input gates for the given gate P have been selected (block 336).

Figure 30:
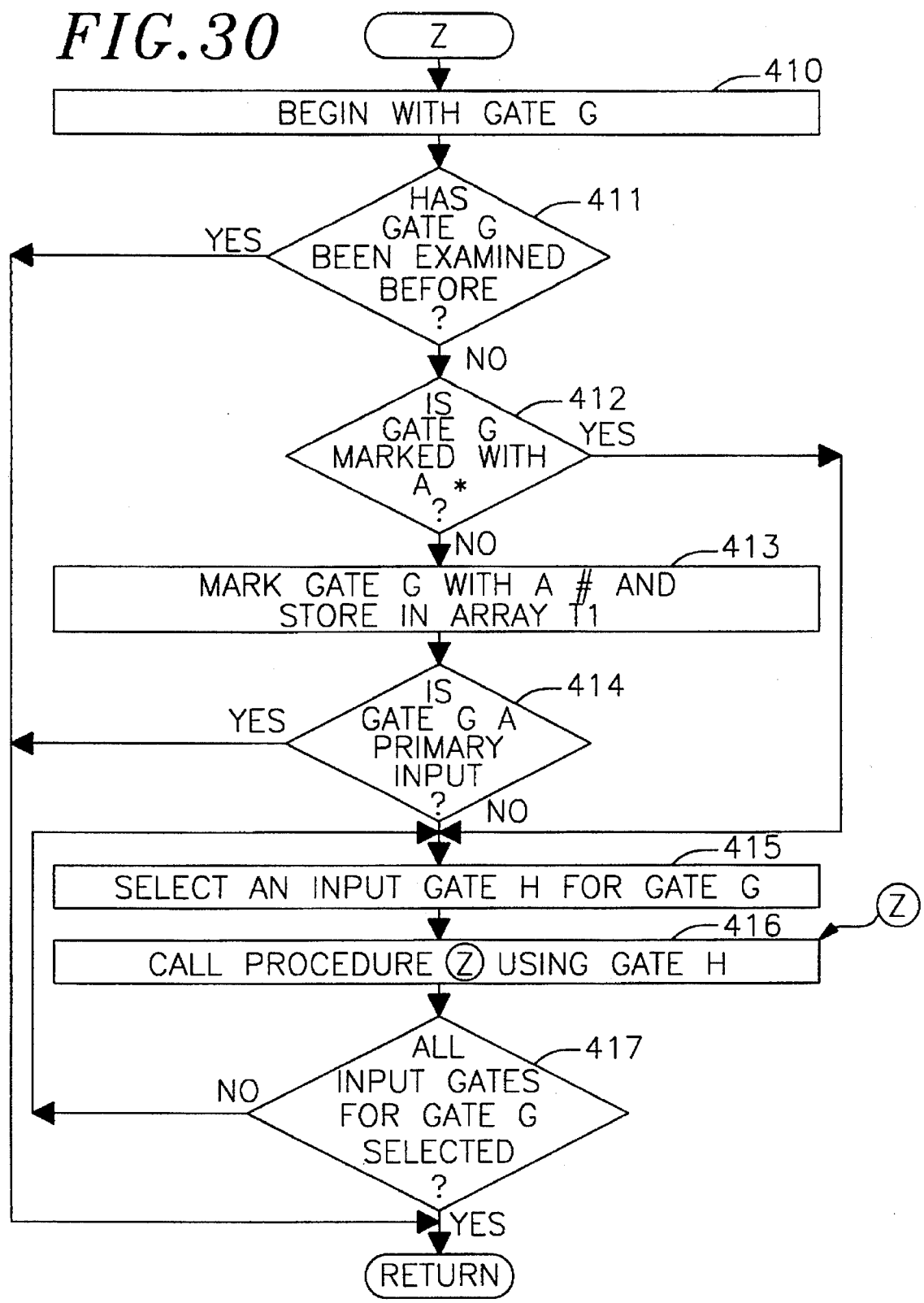
FIG. 30 is a flow chart illustrating a routine for tracing and marking logic gates previously marked.

Referring to FIG. 30, a routine for tracing, collecting and marking logic gates previously marked is shown. The routine operates on some gate G (block 410) if that gate has not been examined before (block 411). If it has not and gate G was also marked with a "*" (block 412), gate G is skipped. Otherwise, gate G is marked with a "#" and stored in array T1 (block 413). If gate G is a primary input (block 414), no further analysis of gate G is required and the routine terminates. Otherwise, an input gate H for gate G is selected (block 415) and the routine recursively calls itself using gate H as input (block 416) until all input gates for gate G have been selected (block 417).

III. Logic Design Verification Using BDD Simplification

Figure 31:
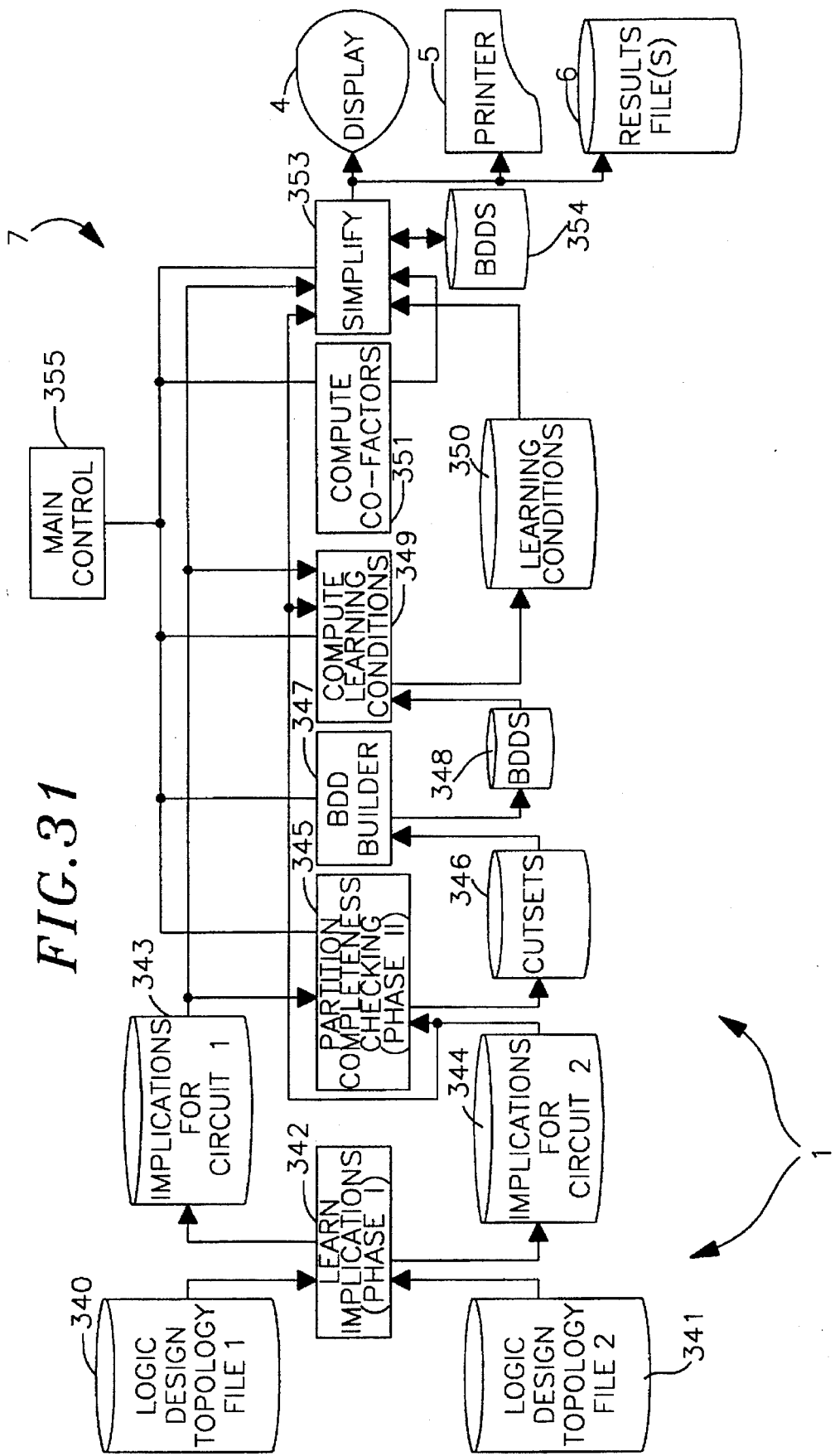
FIG. 31 is a block diagram of a computer-aided design system and method thereof for logic design verification using BDD simplification as used in the system of FIG. 1.

A block diagram of a computer-aided design system and method thereof for logic design verification using BDD simplification as used in the system of FIG. 1 is shown in FIG. 31. Its goal is to use functional learning to verify a pair of digital circuits in a BDD-based procedure without giving up the benefits of verification using BDDs alone.

If the BDDs representing the two circuits being verified are large and complex, verification of the two circuits becomes difficult. When the two circuits are structurally similar, verification can be accomplished using only functional learning because quite often functional learning discovers that the corresponding primary outputs of two circuits are equivalent.

Functional learning can be used to decrease the size of the BDDs when the BDD representations of the Boolean expressions contained in the input cone (transitive fan-in) of some target wire are too large for BDD-based verification. Functional learning can also be used to speed up verification by using logical interdependencies (implications) to choose a set of pseudo input variables and build an XOR (composite) BDD of the two BDDs representing the corresponding output functions of the two circuits. Logical interdependencies (implications) are further utilized to discover "don't care" combinations of the cut variables, that is, Boolean combinations of the cut variables that do not exist in the two given circuits to further reduce the XOR BDD graph size.

The computer program 7 consists of six main components (blocks 342, 345, 347, 349, 351, 353 and 355), including a main control component 355 to coordinate the other components. The secondary storage device 1 contains eight files (blocks 340, 341, 343, 344, 346, 348, 350 and 354). A learn implications component 342 is used to read in logic design topology files 340 and 341 for a pair of digital circuits and learn indirect implications in them. The learn implications component 342 constitutes the computer program shown in FIG. 7, however, it stores indirect implications for two digital circuits, not just a single circuit, in a pair of implication files 343 and 344.

A partition completeness checking component 345 is used to create and check that cutsets for each of the circuits being verified are complete partitions. The partition completeness checking component 345 generates a pair of complete cutsets 346 which are used by a BDD builder component 347 to build BDDs 348. The partition completeness checking component 345 constitutes those routines from the logic design verification using a group of logic gates with logical interdependencies program 210 shown in FIGS. 16A and 16B as indicated by block 363.

A compute learning conditions component 349 creates a set of learning conditions 350 to be used by a simplify component 353 for reducing and simplifying the size of a BDD. In addition to using learning conditions, the stored logical interdependencies (indirect implications) are used by a compute co-factors component 351 to further reduce the size of the BDD.

Thus, BDDs 354 for all the wires in the cone of the target wire, including the target wire itself, are built. The BDD of the target cone built in terms of the pseudo variables introduced at some intermediate cut will be referred to as $G_d$. Next, learning conditions 350 are derived by appropriately combining various BDDs in the input of the target wire and ahead of the cut. These learning conditions are ANDed with $G_d$ one after the other to reduce and simplify the size of $G_d$ in a simplify component 353. These conditions essentially constitute the controllability "don't care" set for the function ahead of the cut.

Upon completion of the simplification of the size of $G_d$, the results are displayed to the user on display 356 and printer 357 and stored in results file 358.

Figure 32B:
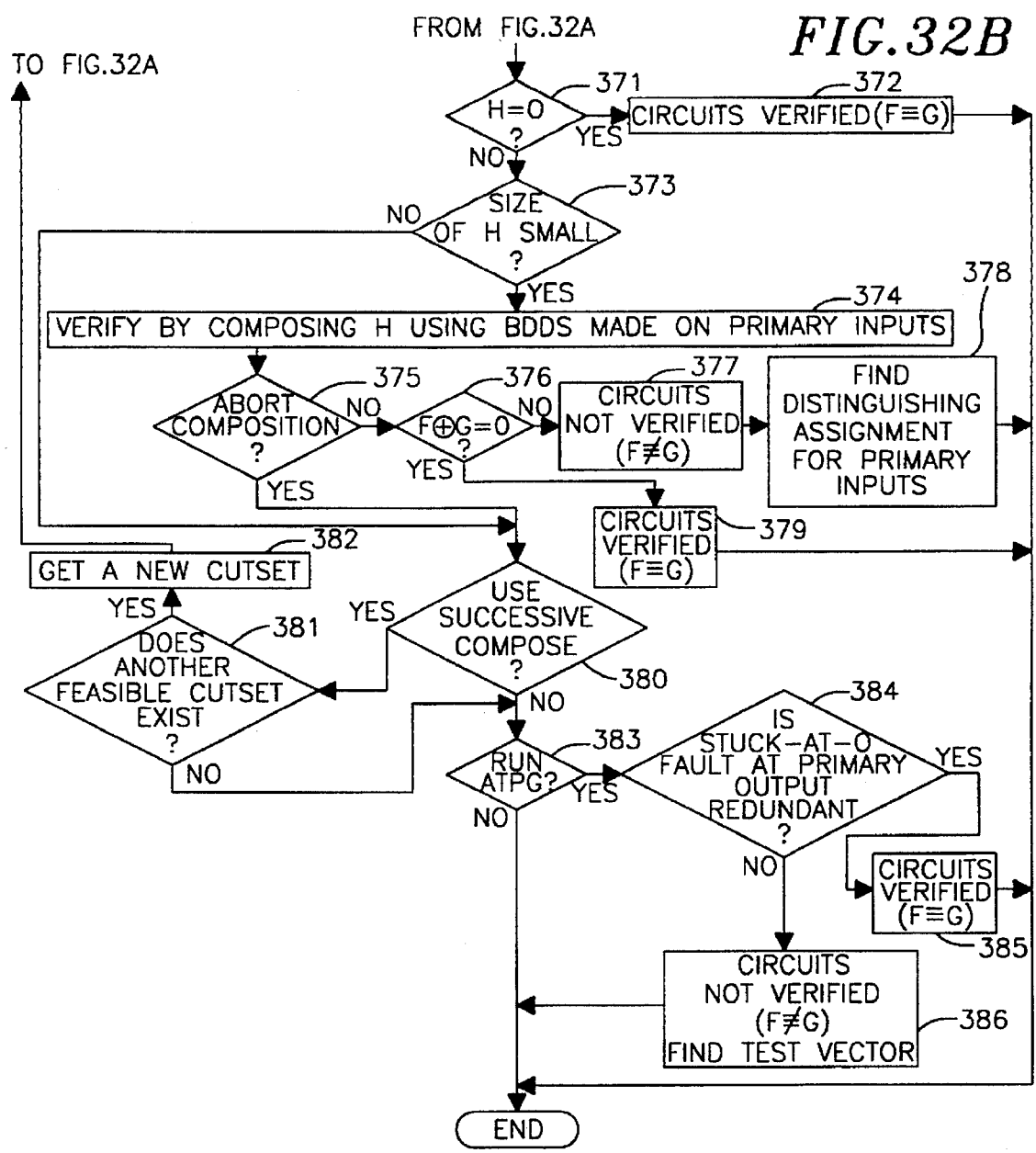

A preferred embodiment of the logic design verification using BDD simplification program 360 is shown in FIGS. 32A and 32B. It operates in three phases. Phase I analyzes the logic designs of each circuit to be verified by learned logical interdependencies (implications) (block 361) using the computer program shown in FIG. 7.

Next, a composite circuit is created (block 362) by matching the primary outputs from each of the two circuits and feeding each pair into an XOR logic gate. Thus, any mismatch between the matching output signals is reflected in the output of the XOR gate. If the two corresponding primary outputs are functionally different, there is at least one combination of Boolean values which, when applied to the primary inputs of the two circuits, produces a Boolean 1 value at the output of the XOR logic gate and thereby indicates a lack of equivalency between the two circuits being verified.

In Phase II, a determination of whether the circuit partitions are complete is made (block 363) using the completeness checking routines from the logic design verification using a group of logic gates with logical interdependencies program shown in FIGS. 16A and 16B as indicated by block 363.

The remaining sections of the program constitute Phase III. The overall goal is to iteratively simplify a composite BDD (XOR BDD) representing the difference function of the combined partitions for both circuits being verified.

Thus, a cutset making up a partition for each circuit must be appropriate for use with learning conditions. An appropriate cutset satisfies the property that the number of holes that the cutset has are very few. One suggested proportion for the number of holes is less than or equal to one third the number of implication points that the cutset has. Other proportions can be similarly tried depending on available computational resources for verifying a given pair of circuits. Recall that a hole is a point in a circuit with no implication point with respect to another point on or ahead of the cut. If the cutset is not appropriate (block 364), the circuits are instead verified using ordered BDDs built in terms of the primary inputs (block 365).

If an appropriate cutset exists for each of the two circuits, a variable order $\pi$ and $\pi'$ is computed for each cutset (block 366) and a pair of BDDs, $F(\lambda)$ and $G(\lambda')$ are built (block 367). The variable order required for the construction or manipulation of a BDD as provided herein is computed using standard methods, such as shown in S. Malik et al., *Logic Verification Using Binary Decision Diagrams In A Logic Synthesis Environment*, Int'l Conf. on Computer-Aided Design (1988), at pages 6–9, the disclosure of which is hereby incorporated by reference. Moreover, dynamic-ordering-based BDD packages which can automatically decide a heuristically acceptable BDD order are readily available, such as the public domain package developed by David Long, available from Carnegie Mellon University, Pittsburgh, Pa.

From these two BDDs, a composite BDD H is computed by performing a Boolean XOR of BDD $F(\lambda)$ and BDD $G(\lambda')$ (block 368). This XOR BDD represents the difference function of the two functions $F(\lambda)$ and $G(\lambda)$.

Part of the learning condition simplification process is to build a set of BDDs, called learning conditions AND_LNG (i), which is located between the primary outputs and the cut for each respective circuit (block 369). Thus, a Composite BDD H is created by a Boolean XOR operation between the two BDDs for the corresponding primary outputs of the two circuits that are built in terms of the cutset variables for some internal cut points in each of the two circuits. This composite BDD H is ANDed with each BDD contained in the set of learning conditions AND_LNG(i) to create a BDD $H_{new}(i)$. If after each such operation, the size of $H_{new}(i)$ is less than the size of H, then $H_{new}(i)$ is substituted for the original composite BDD H, thereby simplifying the composite BDD.

After the ANDing of learning conditions is completed, the resultant BDD H is subjected to further size reduction by co-factoring and restriction using learning conditions. During the co-factor step, the BDD H is co-factored using the Shannon expansion formula based on the cut variables (block 370). After each such co-factoring step, the indirect implications of the cut variables are utilized to reduce the sizes of the co-factors.

Finally, the two co-factors are combined to build BDD $H_{new}$. If the size of $H_{new}$ is less than that of H, then H is replaced by $H_{new}$ as the new XOR BDD. Co-factoring repeats as long as the size of H can be reduced. Upon completion, if the aggregate BDD H is a BDD 0 (block 371), the circuits have been verified (block 372) and the process terminates. If BDD H reduces to a BDD 1, then the two functions are the complement of one another. Otherwise, if the size of the composite BDD H is small (block 373), verification proceeds by fully composing the composite BDD H using BDDs made on the primary inputs of the circuit (block 374), such as shown in R. E. Bryant, *Graph Based Algorithms for Boolean Function Manipulation*, IEEE Transactions on Computers, C-35 (Aug. 1986), at pages 677–690, the disclosure of which is hereby incorporated by reference.

If the composition does not abort due to insufficient computer memory space (block 375), a Boolean XOR of each of the respective BDDs, $F(\lambda)$ and $G(\lambda')$, is computed in terms of the primary inputs. If that result equals 0 (block 376), the circuits are verified (block 379) and the process terminates. Otherwise, the circuits are proven to be functionally different (block 377) and a distinguishing vector (a combination of Boolean values at the primary inputs which when applied to the two circuits produces different values at the primary outputs of the two circuits) is derived by a simple depth-first traversal of the BDD H (block 378), and the process terminates.

If, after a complete reduction of size through learning condition ANDing and co-factoring of the XOR BDD H, the final size of H is still too large for a full compose in terms of the primary inputs of the circuits to complete, a method called successive compose is used to simplify the XOR BDD H (block 380). Successive compose proceeds as follows: First, if another feasible cutset exists (block 381), a new cutset is selected in the two circuits being verified (block 382). This new cutset can be selected using a breadth-first traversal of L-levels towards the primary inputs starting at the original cutset. In a preferred embodiment, L can be 3.

Alternatively, a new cut can be selected as another complete cut between the present cut and the primary inputs using those routines from the logic design verification using a group of logic gates with logical interdependencies program 210 shown in FIGS. 16A and 16B as indicated by block 363. While seeking a complete cut, if only an incomplete cut can be obtained, such a cut can be accepted provided that the number of holes in the cut are heuristically limited to some number based on available computational resources.

Next, the BDD H is composed in terms of the variables of this new cutset, referred to as $CUT_{new}$. This gives a new XOR BDD $H_{new}$ built in terms of $CUT_{new}$. Learning conditions derived from the portion of the two circuits ahead of $CUT_{new}$ are ANDed with BDD $H_{new}$ to try to reduce the size of BDD $H_{new}$. This procedure is identical to the learning conditions procedure described earlier used to reduce the size of a BDD $H_{new}$. Next, co-factoring based on the Shannon expansion formula using the variables in the $CUT_{new}$ and subsequent restrictions are carried out to further reduce the size of the BDD $H_{new}$. After this step is completed, successive compose operations can be repeated with $CUT_{new}$ replacing the original cutset and $H_{new}$ replacing H. This can be continued until the size of the BDD H becomes sufficiently small to make a full compose in terms of the primary inputs feasible.

If at any stage during successive compose operations, the operation fails due to exhausted computer memory resources, an ATPG tool is invoked (block 383). The goal of the ATPG tool is to prove that a stuck-at-0 fault located at the output of the XOR gate is redundant (block 384). The ATPG tool makes use of all the prestored learning (logical interdependencies). If the fault is proved redundant, verification is complete and the circuit is verified (block 385). Otherwise, the circuit is not verified and a test vector is found for the fault (block 386). This test vector, if applied to the primary inputs of the two circuits, causes them to have different Boolean values at their primary outputs.

Figure 33:
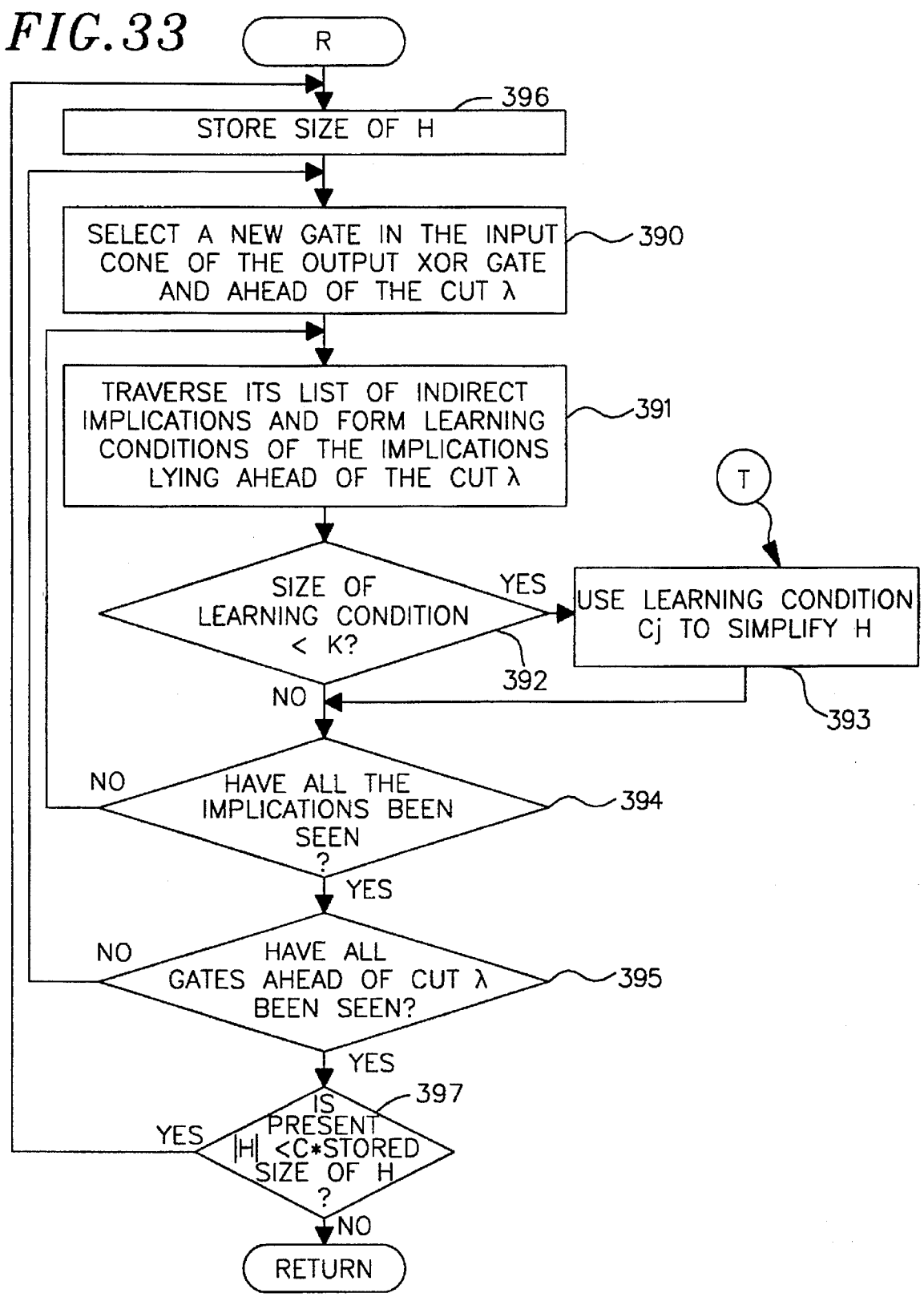
FIG. 33 is a flow chart illustrating a routine for computing a set of learning conditions.

Referring to FIG. 33, a routine for computing a set of learning conditions AND_LNG(i) is shown. The size of the BDD H is stored (block 396). A gate in the input cone (transitive fan-in) of an output XOR gate that is located ahead of the cut $\lambda$ is selected (block 390). Its list of stored indirect implications (from Phase I) is traversed and learning conditions are formed from the implications lying ahead of the cut $\lambda$ (block 391). If the size of the learning condition is less than some user-defined value k (block 392), the learning condition $C_j$ is used to simplify BDD H (block 393). The traversal process is repeated until all implications have been seen (block 394) and the entire process is repeated until all gates ahead of the cut $\lambda$ have been seen (block 395). Moreover, if the present size of the BDD H is less than a certain percentage c, say 2%, times the stored size of BDD H (block 397), the process is repeated.

Figure 34:
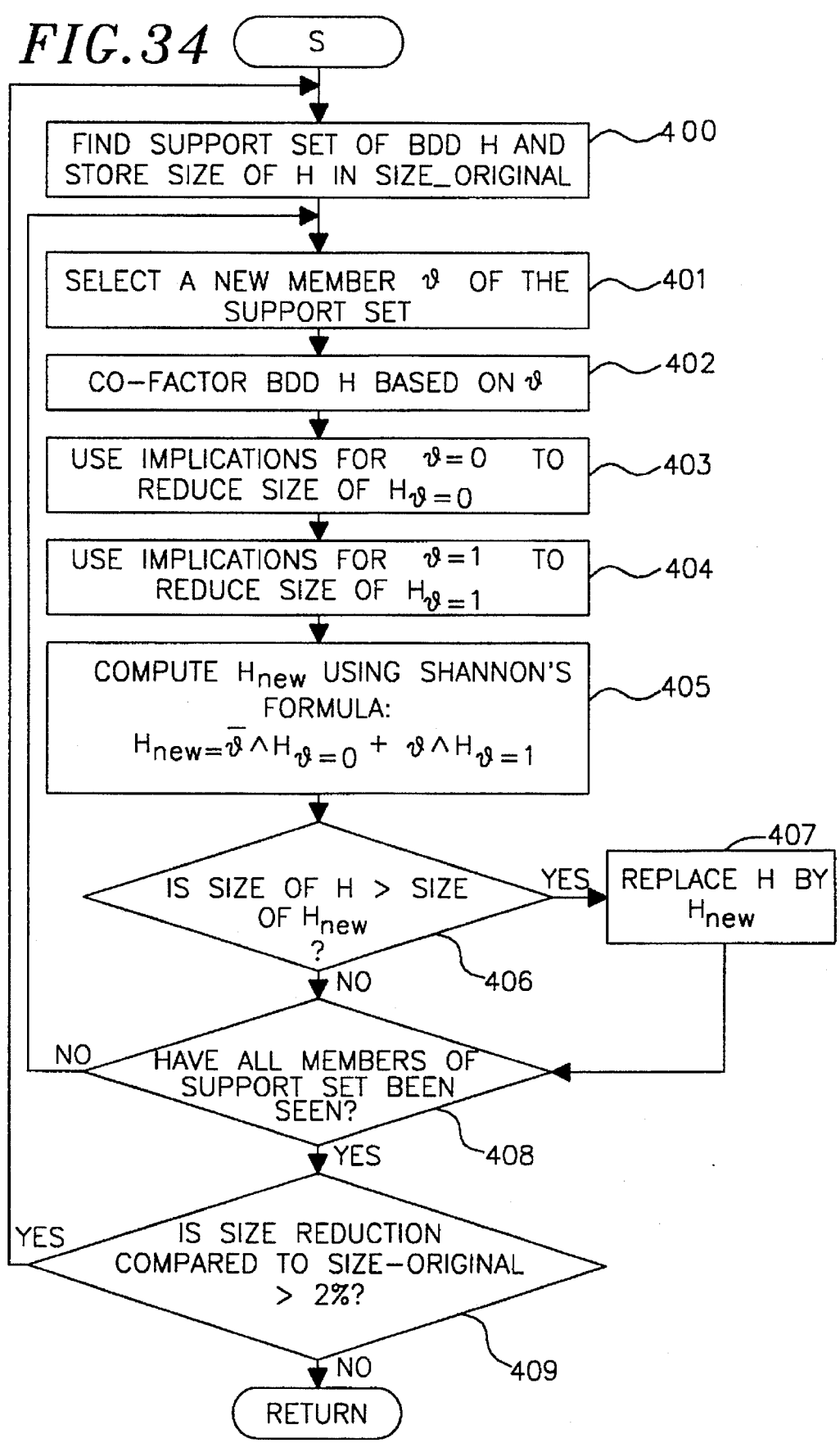
FIG. 34 is a flow chart illustrating a routine for computing co-factors based on the variables of the cutset and using known logical interdependencies to reduce BDD size.

Referring to FIG. 34, a routine for computing co-factors based on the variables of a cutset $\lambda$ and using known logical interdependencies to reduce BDD size is shown. A co-factor can take as an argument either a variable or a function. This routine applies the Shannon expansion formula to the BDD H and then tries to reduce the size of the BDD by making restrictions based on known implications.

During this phase, the BDD H is co-factored successively on each of the variables in its support set, that is, the set of all unique variables contained in a BDD. For example, suppose that v is a variable in the support set of H. After co-factoring H with respect to v, two co-factors of H are obtained, $H_{v=0}$ and $H_{v=1}$. $H_{v=0}$ is the BDD H with the variable v restricted to a Boolean 0 and $H_{v=1}$ is the BDD H with the variable v restricted to a Boolean 1. First, the support set of BDD H is determined and its size stored as SIZE_ORIGINAL (block 400).

Next, a member of v of the support set is selected (block 401) and the BDD H is co-factored based on the value for the variable v (block 402). The list of all direct and indirect implications for v=0 is taken. If any of these implications are with respect to any other variable in the support set of H, an appropriate restriction is done in $H_{v=0}$ (block 403). The list of all direct and indirect implications for v=1 is also taken and a similar process of restriction is followed for $H_{v=1}$ (block 404).

For instance, if an implication v=0→a=1 (where a is another variable in the support set of H) exists, the variable a is restricted to a Boolean 1 in $H_{v=0}$. Thus, a final $H_{v=0}$ is obtained and a final $H_{v=1}$ is obtained. $H_{new}$ is constructed using the Shannon expansion formula as follows: $H_{new}$= $\overline{V} \wedge H_{v+1} + V \wedge H_{v=0}$ (block 405). If the size of $H_{new}$ is less than the size of H (block 406), H is replaced by $H_{new}$ (block 407) and the entire procedure is repeated for the other variables in the support set of the new H (block 408).

After co-factoring and restriction have been carried out for all the variables in the support set and if the final size of H is less than the size of the original H reduced by at least a certain percentage, say 2%, the entire process is repeated (block 409). However, all the variables for which a reduction in BDD size was obtained in any of the previous iterations are not used again. This decision is heuristic in nature.

Figure 35:
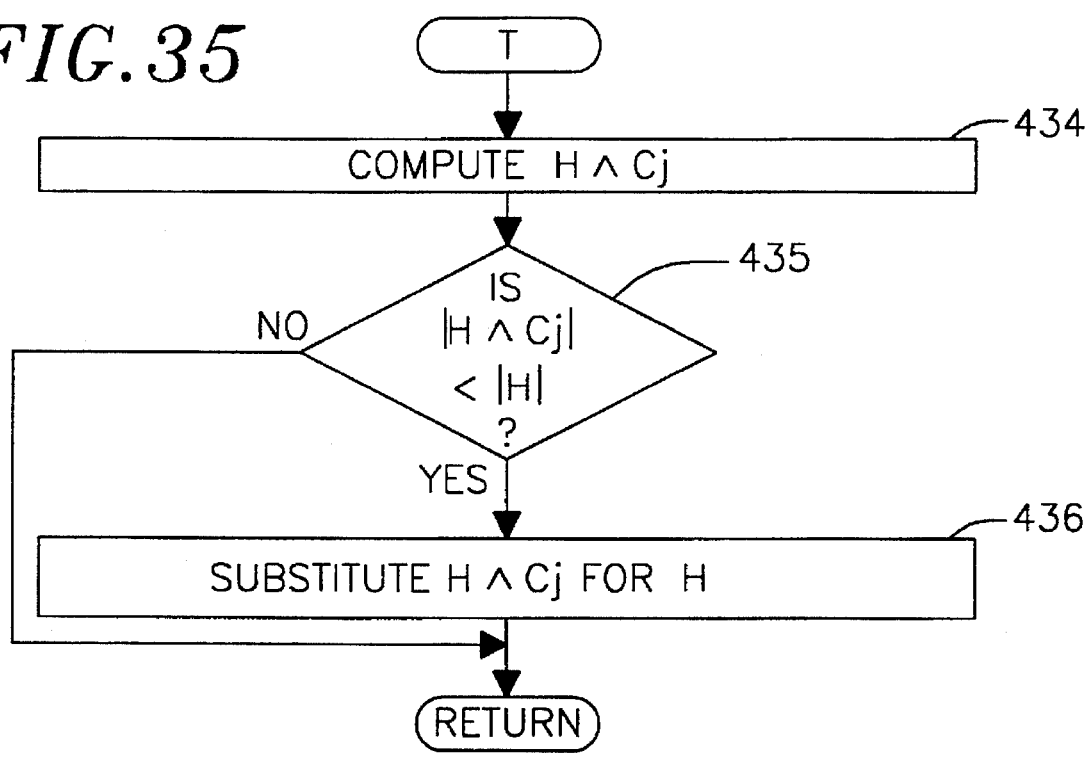
FIG. 35 is a flow chart illustrating a routine for simplifying a composite BDD by appropriately ANDing learning conditions.

Referring to FIG. 35, a routine for simplifying the composite BDD H by appropriately ANDing learning conditions is shown. A Boolean AND operation is computed between H and the learning condition BDD $C_j$ (block 434). If that result is smaller than the present size of the composite BDD H (block 435), the result of the Boolean AND operation (H$\wedge$ $C_j$) is substituted for the composite BDD H (block 436).

IV. Decreasing Computational Resource Requirements for Construction of Representations of Hardware Designs Through the methods discussed above, logical interdependencies can be used to decrease the time and space required in terms of computational resources to build decision diagrams. First, logical interdependencies (implications) are determined within a given digital circuit. These interdependencies limit the possible signal assignment situations that can take place within the circuit. For example, if a signal implies a→b, each time signal a assumes a high value, signal b must assume a high value, too. Thus, the situation where signal a assumes a high value but signal b assumes a low value is precluded.

By taking into account such relationships as expressed by logical interdependencies, a decision diagram which has a similar signal a and signal b can be simplified. The time and memory required in terms of computational resources for decision diagram construction can therefore be reduced. By selecting a logic gate G, a "new" subcircuit G_cone_circuit can be formed constituting all logic gates and primary inputs present in the input cone (transitive fan-in) of gate G.

Figure 36A:
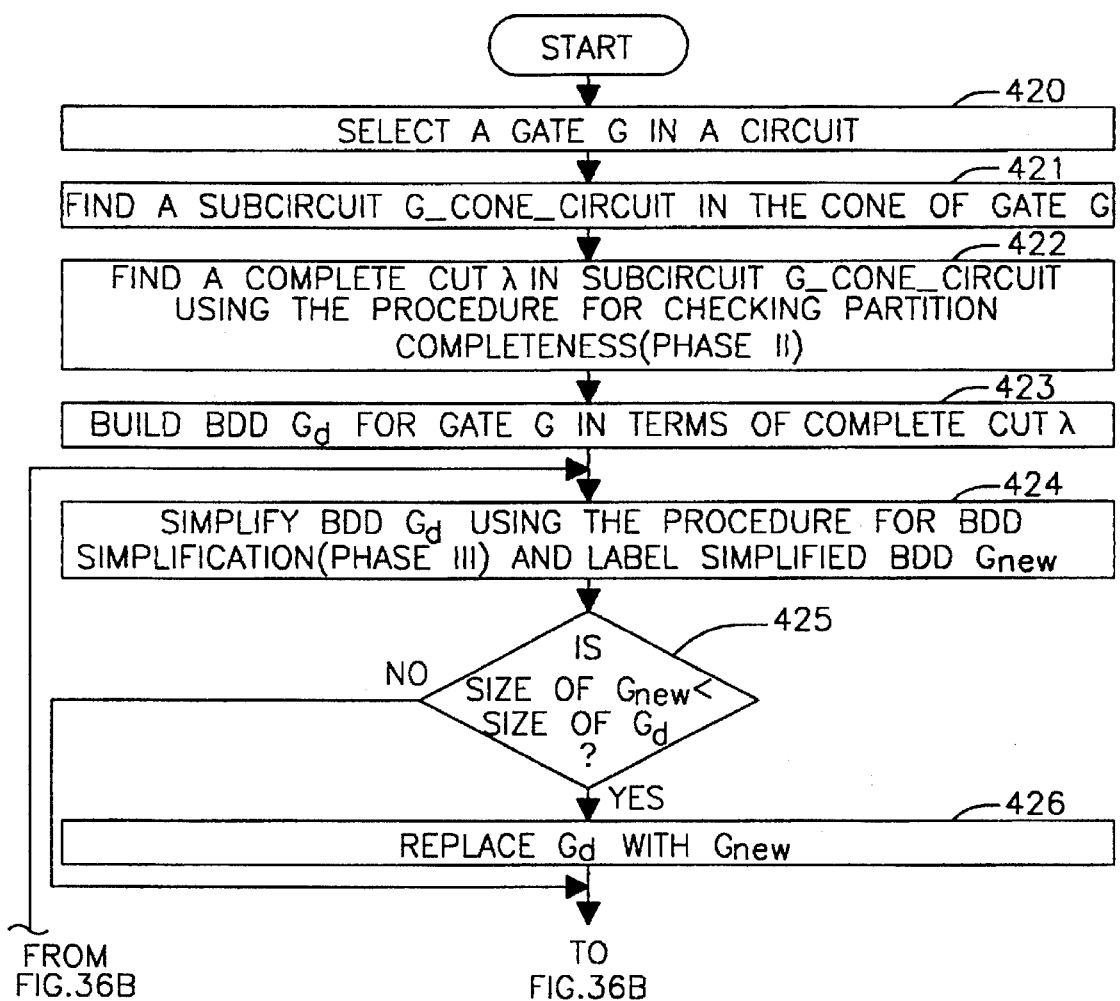
FIGS. 36A and 36B are a flow chart illustrating a process for decreasing computational resource requirements for constructing hardware designs as an embodiment of the present invention.
Figure 36B:
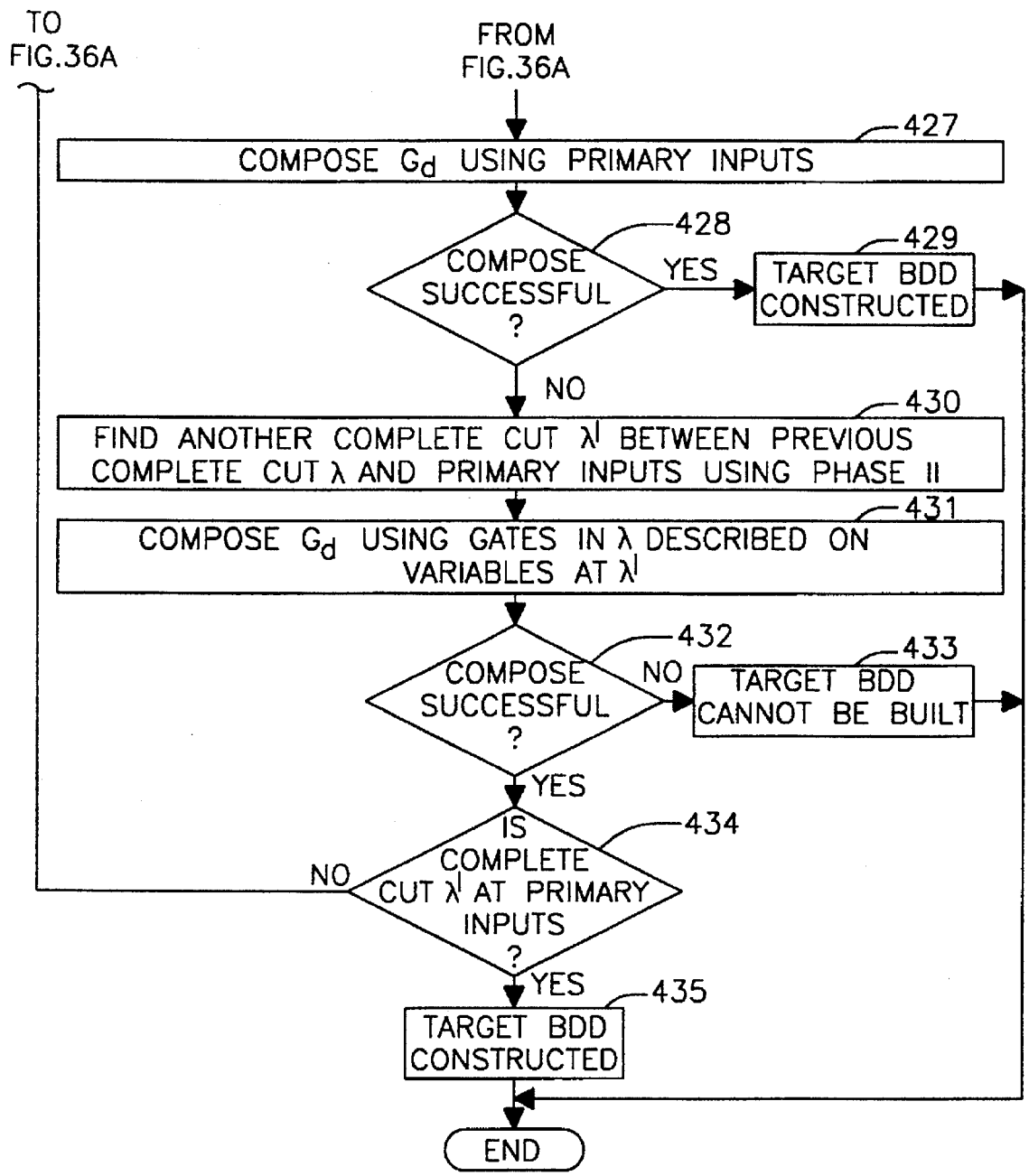

Referring to FIGS. 36A and 36B, a flow chart illustrating a process for decreasing computational resource requirements for constructing representations of hardware designs as an embodiment of the present invention is shown. Its purpose is to build a BDD for a given primary output or an internal gate in a digital circuit and to reduce the time and computer memory resources required thereby. A logic gate G in the circuit is selected (block 420) and its transitive fan-in (input cone) is marked as subcircuit G_cone_circuit (block 421).

A complete cut $\lambda$ for subcircuit G_cone_circuit is determined using those routines from the logic design verification using a group of logic gates with logical interdependencies program 210 shown in FIGS. 16A and 16B as indicated by block 363 (block 422). A similar process for finding the best possible cut, although possibly not complete, is followed as performed in Phase II. A BDD $G_d$ for logic gate G is built in terms of the cut $\lambda$ (block 423). If the BDD cannot be built due to lack of computer memory resources, the operation aborts.

Next, learning conditions that are already stored with the logic gates in the circuit are used to simplify the BDD $G_d$ (block 424). The same routines used for the logic design verification using BDD simplification program 360 shown in FIGS. 32A and 32B are also employed in the present method (block 424). The new simplified BDD is labeled $G_{new}$. If the size of BDD $G_{new}$ is less than the size of BDD $G_d$ (block 425), BDD $G_{new}$ is substituted for BDD $G_d$ (block 426). The computer memory resources allocated to the old BDD $G_d$ can be freed (deallocated).

If the size of the decomposed BDD is large or the corresponding cutset is not closer to the primary inputs, the BDD $G_d$ is recursively simplified. Otherwise, BDD $G_d$ is composed in terms of the primary inputs to the circuit (block 427). If the compose operation is successful (block 428), the target BDD will have been constructed (block 429) and the routine terminates. A compose will be unsuccessful if it runs out of computer memory. If it does, a new complete cut $\lambda'$ must be determined located between the old cut $\lambda$ and the primary inputs (block 430). If a complete cut is not found, an incomplete cut is used that incorporates a maximum number of logical interdependencies using the same routines for the logic design verification using a group of logic gates with logical interdependencies program 210 shown in FIGS. 16A and 16B (block 430).

Again, the BDD $G_d$ is composed using the new cut $\lambda$ (block 431). If the composed is unsuccessful (block 432), the target BDD cannot be built (block 433) and the routine terminates. Otherwise, if the compose operation completed successfully and the complete cut $\lambda'$ is not at the primary inputs (block 434), the routine repeats. Otherwise, the target BDD will have been constructed (block 435) and the routine terminates.

An advantage of the present method is that logical interdependencies can be used to both cut down memory requirements and computational time. By employing the same routines for selecting a complete cut, full use can be made of relationships among the variables in the cut $\lambda$ to reduce BDD size. And, since BDD size is reduced, computer memory requirements are reduced. Finally, the composition of a BDD can be performed faster because the BDD being composed is smaller in size. Hence, time requirements are decreased.

V. Goal Directed Learning

A further advantage of the present invention is a method for directing computational resources to more efficiently meet a specific goal, known as goal directed learning. For example, in performing logic design verification using a group of logic gates with logical interdependencies or BDD simplification (Phase II and III), when a cut $\lambda$ has been determined, resources can be directed using the method of goal directed learning so that more logical interdependencies (implications) can be obtained between the cut points and the primary outputs. The increased number of logical interdependencies obtained thereby can be used to obtain a new cut $\lambda$ which is closer to the primary outputs and therefore results in a smaller partition of the circuit. Moreover, increasing the number of logical interdependencies also means additional learning constraints can be used to further simplify the difference BDD $G_d$ employed in the method discussed in Part IV of this document.

Goal directed learning treats initial cut $\lambda$ as defining in approximate region of the circuit for focusing computational resources on. If the initial cut $\lambda$ was obtained in a circuit using a learning method where the maximum learning level used was a structural distance k from the primary outputs, goal directed learning focuses the determination of logical interdependencies in the vicinity of the initial cut $\lambda$ using learning levels greater that k, say k+i, where an exemplary value of i is 2. The learning procedure employed in this region of the circuit around the initial cut $\lambda$ and this potential region is termed the goal directed learning region.

A first method for performing goal directed learning is as follows. A cut $\lambda_{k+i}$ is determined located between the original cut $\lambda$ and the primary outputs using a distance of k+i from the original cut $\lambda$. Starting from the cut $\lambda$, the learning procedure learns at every logic gate located between cut $\lambda$ and cut $\lambda k_{+i}$ using functional learning with a learning level of k+i. The logical interdependencies determined thereby are used to determine further logical interdependencies in the circuit or to find a better cut $\lambda$.

Figure 37:
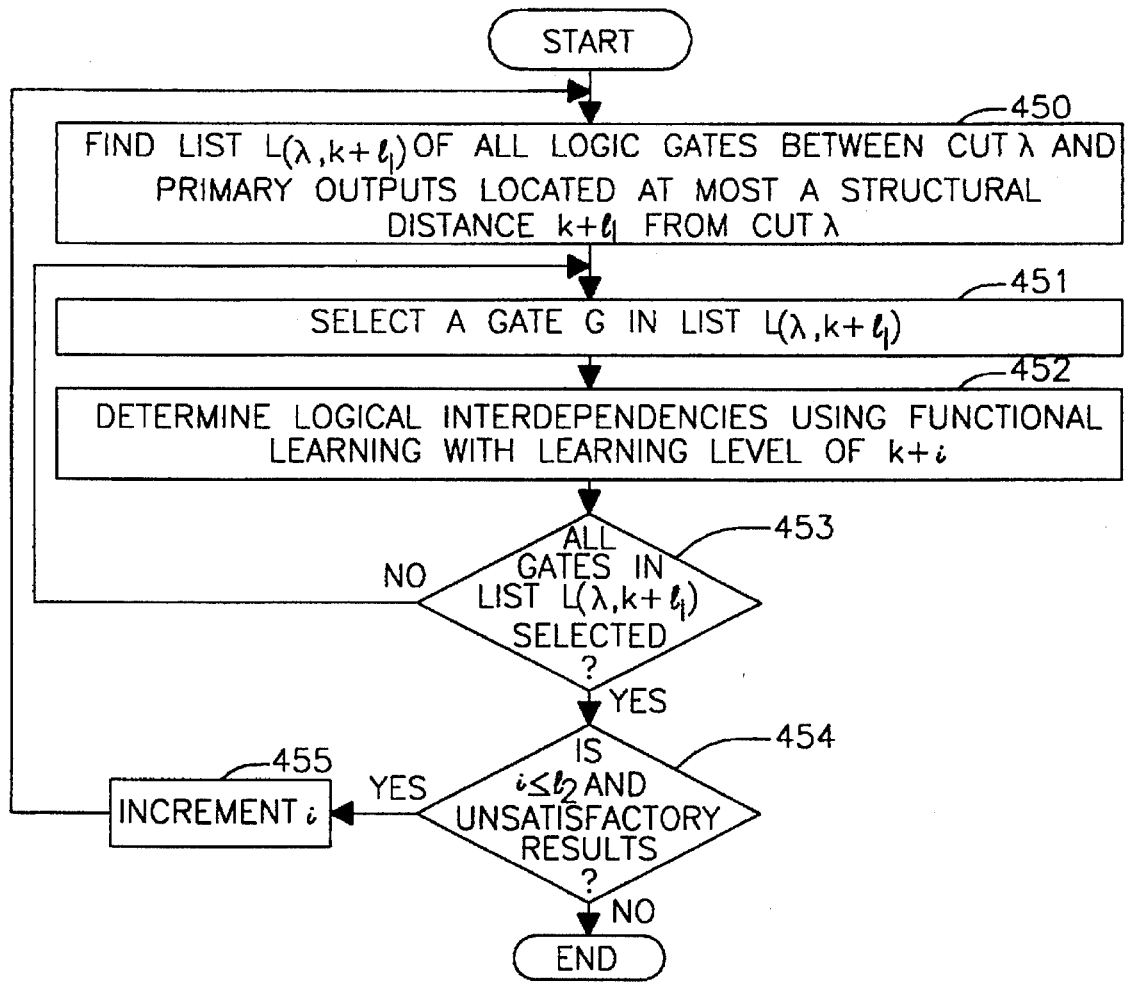
FIG. 37 is a flowchart illustrating a process for performing goal directed learning as an embodiment of the present invention.
Figure 38:
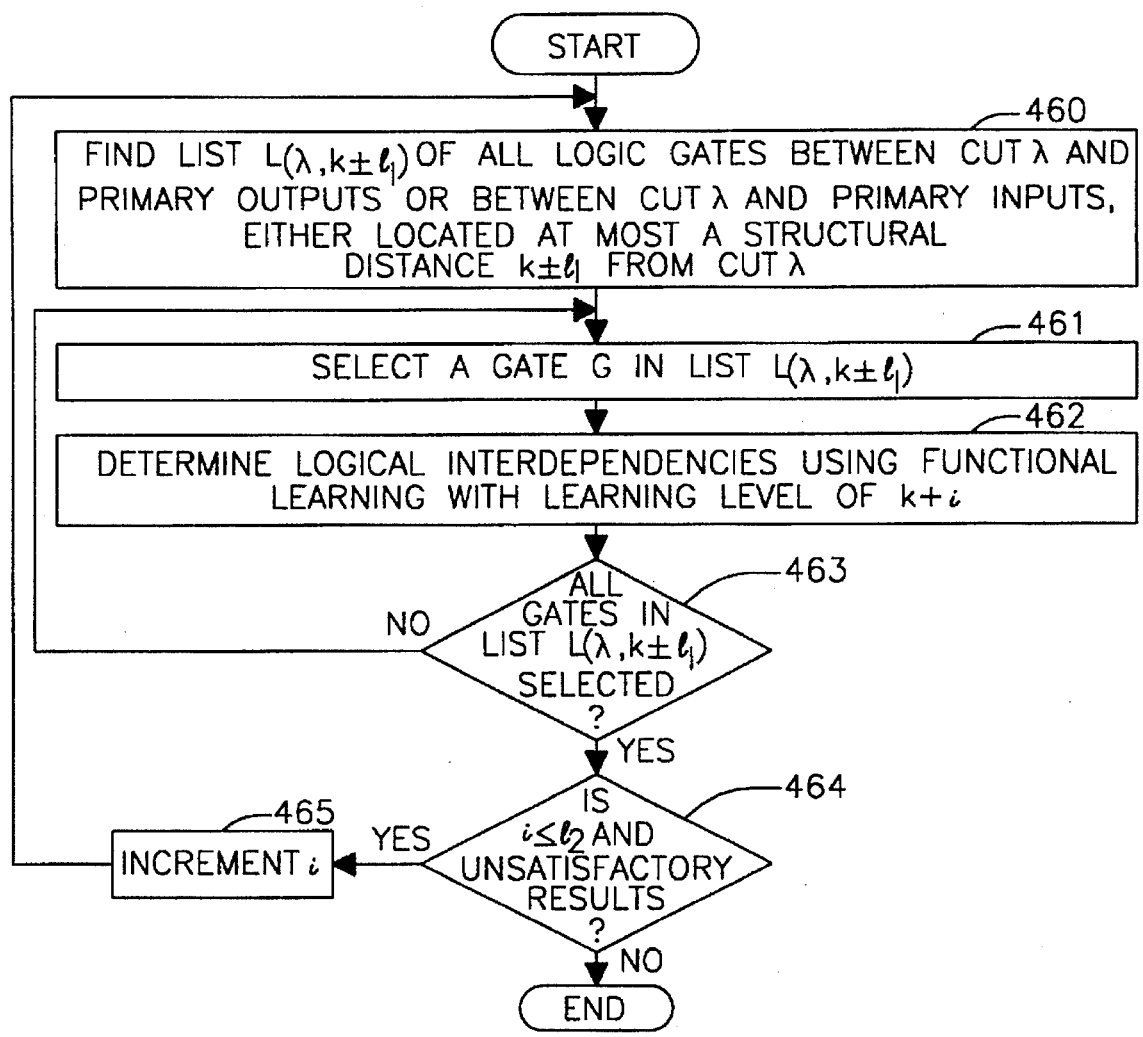
FIG. 38 is a flowchart illustrating an alternate process for performing goal directed learning as an embodiment of the present invention.

Referring to FIG. 37, a flowchart illustrating a process for performing goal directed learning as an embodiment of the present invention is shown. A list $L_{(\lambda, k+L1)}$ constituting all logic gates located between a cut $\lambda$ and the primary outputs which are located at most a structural distance of k+L1 from the cut $\lambda$ are found (block 450). This list constitutes the goal directed learning region. A gate G is selected from list $L_{(\lambda, k+L1)}$ (block 451) and logical interdependencies are determined using functional learning (Phase I) with a learning level equaling k+i (block 452). The selection and determination steps are repeated until all gates in list $L_{(\lambda, k+L1)}$ have been selected (block 453). If the number of learning levels i does not exceed some fixed constant L2 and the results of the determination step are unsatisfactory for any reason, such as a failure to find a predetermined number of additional logical interdependencies or other related reasons (block 454), the learning level parameter i is incremented (block 455) by some fixed increment, say 2, and the process repeats.

A second method for performing goal directed learning is as follows. A structural cut k+i levels before the original cut $\lambda$ is taken. This new cut is called CUT1. Next, a structural cut k+i levels after the original cut $\lambda$ is taken. This new cut is called CUT2. Logic design analysis is performed between CUT1 and CUT2 using a learning level of k+i. This level can be incremented up to k+i. This technique can be used to obtain extra logical interdependencies whenever a region in a circuit is identified where computationally expensive analysis is taking place and which could therefore benefit from extra logical interdependencies.

Referring to FIG. 37, a flowchart illustrating an alternate process for performing goal directed learning as an embodiment of the present invention is shown. A list $L_{(\lambda, k+L1)}$ constituting all logic gates located between a cut $\lambda$ and the primary outputs or between the cut $\lambda$ and the primary inputs, both of which are located at most a structural distance of k+L1 from the cut $\lambda$ are found (block 460). This list constitutes the goal directed learning region. A gate G is selected from list $L_{\lambda, k+L1)}$ (block 461) and logical interdependencies are determined using functional learning (Phase I) with a learning level equaling k+i (block 462). The selection and determination steps are repeated until all gates in list $L_{(\lambda, k+L1)}$ have been selected (block 463). If the number of learning levels i does not exceed some fixed constant L2 and the results of the determination step are unsatisfactory for any reason, such as a failure to find a predetermined number of additional logical interdependencies or other related reasons (block 464), the learning level parameter i is incremented (block 465) by some fixed increment, say 2, and the process repeats.

While the invention has been particularly shown and described with reference to the preferred embodiments thereof, it will be understood by those skilled in the art that the foregoing and other changes in form and detail may be made therein without departing from the spirit and scope of the invention.

What is claimed is:

1. A method using a computer-aided design system for determining logical interdependencies between points in a digital circuit topology, such a topology comprising a set of primary outputs and a set of primary inputs both interconnected with logic gates, the logic gates being interconnected by wires, each such point comprising a location on a wire carrying a signal asserted into or from one of the logic gates, comprising the steps of:

storing a representation of such topology in a storage device in the computer-aided design system;

selecting a cutset in the topology comprising the logic gates falling in a fan-in of the logic gates leading to a target one of the logic gates;

building a decision diagram for the logic gates in the cutset leading from the target logic gate;

marking the logic gates in a potential learning area in the topology comprising the step of extracting justification vectors from the decision diagram for a predetermined Boolean value of the target logic gate; and determining such logical interdependencies and storing a representation of the logical interdependencies in a storage device in the computer-aided design system comprising the step of performing Boolean operations between the decision diagram and a plurality of other decision diagrams for the logic gates in the potential learning area.

2. A method according to claim 1, further comprising the step of:

repeating the steps of selecting, building, marking and determining for a plurality of gates in a set of target logic gates in the topology.

3. A method according to claim 1, wherein the storing step further comprises storing a representation of a logic design topology for a physical digital circuit design.

4. A method according to claim 1, further comprising the steps of:

selecting a set of unjustified logic gates in the topology wherein each such unjustified logic gate has a non-unique justification vector; and selecting a target logic gate from the set of unjustified logic gates.

5. A method according to claim 1, wherein the selecting a cutset step comprises backward tracing along the fan-in for each such logic gate up to a predetermined structural distance from the target logic gate in the topology.

6. A method according to claim 1, wherein the building step further comprises building a binary decision diagram comprising a plurality of non-terminal vertices, a plurality of terminal vertices, and directed paths interconnecting each non-terminal vertex to another non-terminal vertex or a terminal vertex.

7. A method according to claim 6, wherein the building step further comprises:

creating a variable order on the logic gates in the cutset;

producing a binary decision diagram for the cutset starting at the target logic gate and having a size comprising the step of determining for the size a structural depth of the topology beginning from a root vertex that corresponds to the target logic gate and number of vertices in the binary decision diagram; and reducing the size of the binary decision diagram.

8. A method according to claim 1, wherein the marking step further comprises:

extracting a set of justification vectors by traversing the decision diagram beginning at a root vertex that corresponds to the target logic gate, such a justification vector being incomplete if the extracting step stops at a non-terminal vertex;

completing each such incomplete justification vector by traversing the decision diagram until a terminal vertex is encountered;

simulating each such justification vector using truth tables for the logic gates and the topology to evaluate all logic gates that can be reached through forward propagation and backward propagation of Boolean values; and determining an intersection of implication result vectors and storing a representation of the intersection at the potential learning area.

9. A method according to claim 1, wherein the determining step further comprises:

selecting one of the logic gates from the potential learning area;

building one of the other decision diagrams for the selected logic gate;

performing Boolean operations between the decision diagram and the other decision diagram to find results; and determining logical interdependencies from the results and storing a representation of the results in a storage device.

10. A method according to claim 9, wherein the performing step further comprises performing a Boolean AND between the decision diagram and the other decision diagram; and performing a Boolean AND between the decision diagram and the other decision diagram.

11. A computer-aided design system for determining logical interdependencies between points in a digital circuit topology, such a topology comprising a set of primary outputs and a set of primary inputs both interconnected with logic gates, the logic gates being interconnected by wires, each such point comprising a location on a wire carrying a signal asserted into or from one of the logic gates, the system comprising:

means for storing a representation of such topology in a storage device in the computer-aided design system;

means for selecting a cutset in the topology comprising the logic gates falling in a fan-in of the logic gates leading to a target one of the logic gates;

means for building a decision diagram for the logic gates in the cutset leading from the target logic gate;

means for marking the logic gates in a potential learning area in the topology comprising means for extracting justification vectors from the decision diagram for a predetermined Boolean value of the target logic gate; and means for determining such logical interdependencies and means for storing a representation of the logical interdependencies in a storage device in the computer-aided design system comprising means for performing Boolean operations between the decision diagram and a plurality of other decision diagrams for the logic gates in the potential learning area.

12. A method using a computer-aided design system for logic design verification using a group of logic gates with logical interdependencies, the system comprising a first and a second separate digital circuit topology each comprising a set of primary outputs interconnected with logic gates, the logic gates being interconnected by wires, the topologies having a set of logical interdependencies associated with at least one of the logic gates in the system, each such primary output for each separate topology having a corresponding primary output on the other of the separate topologies, comprising the steps of:

XORing together the corresponding primary outputs from each of the separate topologies using means for XORing;

selecting a tentative cut selection region in one of the separate topologies and selecting a reflection tentative cut selection region in the other of the separate topologies, each such region comprising a group of logic gates whereby the wires connecting into those of the logic gates in the region that are closest to the set of primary outputs form a cut, the tentative cut selection region further comprising at least one of the logic gates and at least one of the associated logical interdependencies on or ahead of the cut and the reflection tentative cut selection region further comprising at least one of the associated logical interdependencies for at least one of the logic gates in the tentative cut selection region; and verifying whether each of the topologies is equivalent comprising the step of determining the effect of injecting Boolean values into those of the logic gates in the tentative cut selection region and in the reflection tentative cut selection region that are closest to the set of primary outputs for each of the separate topologies to thereby determine an output signal indicating equivalency asserted by the XORing means.

13. A method according to claim 12, wherein the selecting step further comprises:

selecting a tentative cut selection region, comprising at least one cutset, in one of the separate topologies and selecting a reflection tentative cut selection region, comprising at least one cutset, in the other of the separate topologies.

14. A method according to claim 12, further comprising the step of:

repeating the step of selecting wherein the reflection tentative cut selection region is selected for the one of the separate topologies and the tentative cut selection region is selected for the other of the separate topologies.

15. A method according to claim 12, wherein the selecting step further comprises the steps of:

selecting at least one of the logic gates interconnected by the wires as an input into a logic gate in the separate topology and selecting at least one of the associated logical interdependencies for the selected logic gate on or ahead of the cut or in the other separate topology;

storing a representation of the selected logic gate and the interdependency in the tentative cut selection region; and repeating the steps of selecting and storing until every input wire into the logic gate has been selected.

16. A method according to claim 12, wherein the cut for the tentative cut selection region for each of the separate topologies has a size, the method further comprising the steps of:

checking the cut for completeness whereby every logic gate comprising the cut has a logical interdependency on or ahead of the cut in the separate topology or in the other separate topology;

comparing the size of each cut when each such cut is complete and selecting the cut being least in size; and performing the verifying step using the selected cut and the cut for the reflection tentative cut selection region in the other of the separate topologies.

17. A method according to claim 12, wherein the method further comprises the steps of:

checking the cut for each of the separate topologies for completeness, such a complete cut having for every logic gate comprising the cut a logical interdependency in the separate topology on or ahead of the cut or a logical interdependency in at least one of the other separate topologies; and determining such logic gates required to complete the cut for each of the separate topologies if the cut is not complete.

18. A method according to claim 17, wherein the determining step further comprises the steps of:

marking logic gates in the other of the separate topologies that can be reached from at least one of the primary outputs and that cannot be reached from one of the associated logical interdependencies stored in the reflection tentative cut selection region and storing a representation of the marked logic gates as a set of candidate points;

marking logic gates in the set of logical interdependencies for each of the separate topologies wherein each such logic gate has an associated logical interdependency on or ahead of the cut in the separate topology or in the other of the separate topologies and storing a representation of the marked logic gate in a further set of candidate points; and marking logic gates stored in both the set of candidate points and the further set of candidate points and storing a representation of those logic gates in the reflection tentative cut selection region that are closest to the set of primary outputs.

19. A method according to claim 12, further comprising the step of:

determining logical interdependencies between points in each of the separate topologies, each such point comprising a location on at least one of the wires.

20. A method according to claim 19, wherein the step of determining logical interdependencies comprises the steps of:

storing a representation of at least one of the topologies in a storage device in the computer-aided design system;

selecting a cutset in the topology comprising the logic gates falling in a fan-in of the logic gates leading to a target one of the logic gates;

building a decision diagram for the logic gates in the cutset leading from the target logic gate;

marking the logic gates in a potential learning area in the topology comprising the step of extracting justification vectors from the decision diagram for a predetermined Boolean value of the target logic gate; and determining such logical interdependencies and storing a representation of the logical interdependencies in a storage device in the computer-aided design system comprising the step of performing Boolean operations between the decision diagram and a plurality of other decision diagrams for the logic gates in the potential learning area.

21. A method according to claim 20, further comprising the step of:

repeating the steps of selecting, building, marking and determining for a plurality of gates in a set of target logic gates in the topology.

22. A method according to claim 20, wherein the storing step further comprises storing a representation of a logic design topology for a physical digital circuit design.

23. A method according to claim 20, further comprising the steps of:

selecting a set of unjustified logic gates in the topology wherein each such unjustified logic gate has a non-unique justification vector; and selecting a target logic gate from the set of unjustified logic gates.

24. A method according to claim 20, wherein the selecting a cutset step comprises backward tracing along the fan-in for each such logic gate up to a predetermined structural distance from the target logic gate in the topology.

25. A method according to claim 20, wherein the building step further comprises building a binary decision diagram comprising a plurality of non-terminal vertices, a plurality of terminal vertices, and directed paths interconnecting each non-terminal vertex to another non-terminal vertex or a terminal vertex.

26. A method according to claim 25, wherein the building step further comprises:

creating a variable order on the logic gates in the cutset;

producing a binary decision diagram for the cutset starting at the target logic gate and having a size comprising the step of determining for the size a structural depth of the topology beginning from a root vertex that corresponds to the target logic gate and number of vertices in the binary decision diagram; and reducing the size of the binary decision diagram.

27. A method according to claim 20, wherein the marking step further comprises:

extracting a set of justification vectors by traversing the decision diagram beginning at a root vertex that corresponds to the target logic gate, such a justification vector being incomplete if the extracting step stops at a non-terminal vertex;

completing each such incomplete justification vector by traversing the decision diagram until a terminal vertex is encountered;

simulating each such justification vector using truth tables for the logic gates and the topology to evaluate all logic gates that can be reached through forward propagation and backward propagation of Boolean values; and determining an intersection of implication result vectors and storing a representation of the intersection at the potential learning area.

28. A method according to claim 20, wherein the determining step further comprises:

selecting one of the logic gates from the potential learning area;

building one of the other decision diagrams for the selected logic gate;

performing Boolean operations between the decision diagram and the other decision diagram to find results; and determining logical interdependencies from the results and storing a representation of the results in a storage device.

29. A method according to claim 28, wherein the performing step further comprises performing a Boolean AND between the decision diagram and the other decision diagram; and performing a Boolean AND between the decision diagram and the other decision diagram.

30. A computer-aided design system for logic design verification using a group of logic gates with logical interdependencies, the system comprising a first and a second separate digital circuit topology each comprising a set of primary outputs interconnected with logic gates, the logic gates being interconnected by wires, the topologies having a set of logical interdependencies associated with at least one of the logic gates in the system, each such primary output for each separate topology having a corresponding primary output on the other of the separate topologies, the system comprising:

means for XORing together the corresponding primary outputs from each of the separate topologies;

means for selecting a tentative cut selection region in one of the separate topologies and means for selecting a reflection tentative cut selection region in the other of the separate topologies, each such region comprising a group of logic gates whereby the wires connecting into those of the logic gates in the region that are closest to the set of primary outputs form a cut, the tentative cut selection region further comprising at least one of the logic gates and at least one of the associated logical interdependencies on or ahead of the cut and the reflection tentative cut selection region further comprising at least one of the associated logical interdependencies for at least one of the logic gates in the tentative cut selection region; and means for verifying whether each of the topologies is equivalent comprising means for determining the effect of injecting Boolean values into those of the logic gates in the tentative cut selection region and in the reflection tentative cut selection region that are closest to the set of primary outputs for each of the separate topologies to thereby determine an output signal indicating equivalency asserted by the XORing means.

31. A method using a computer-aided design system for logic design verification using decision diagram simplification, the system comprising a first and a second separate digital circuit topology each comprising a set of primary outputs and a set of primary inputs both interconnected with logic gates, the logic gates being interconnected by wires, the topologies having a set of logical interdependencies associated with at least one of the logic gates in the system, the system further comprising a tentative cut selection region in one of the separate topologies and comprising a reflection tentative cut selection region in the other of the separate topologies, each such region comprising a group of logic gates whereby the wires connecting into those of the logic gates in the region that are closest to the set of primary outputs form a cut, the tentative cut selection region further comprising at least one of the logic gates and at least one of the associated logical interdependencies on or ahead of the cut and the reflection tentative cut selection region further comprising at least one of the associated logical interdependencies for at least one of the logic gates in the tentative cut selection region, each such primary output for each separate topology having a corresponding primary output on each of the other separate topologies, comprising the steps of:

XORing together the corresponding primary outputs from each of the separate topologies using means for XORing;

building a composite decision diagram by performing a Boolean exclusive OR between a decision diagram representing the tentative cut selection region and a decision diagram representing the reflection tentative cut selection region;

determining learning conditions for each of the separate topologies, comprising the step of building for each such learning condition a decision diagram representing logic gates located between the cuts and the primary outputs, and simplifying the composite decision diagram using the learning conditions;

determining a pair of co-factor decision diagrams for the simplified composite decision diagram by applying Shannon's expansion formula based on the cuts and combining the pair to build a reduced composite decision diagram that is substituted for the composite decision diagram; and verifying whether each of the topologies is equivalent comprising the steps of composing the composite decision diagram using decision diagrams built on the primary inputs for each of the separate topologies and performing a Boolean exclusive OR between the decision diagrams to thereby determine an output signal indicating equivalency asserted by the XORing means.

32. A method according to claim 31, further comprising the step of:

determining logical interdependencies between points in each of the separate topologies, each such point comprising a location on at least one of the wires.

33. A method according to claim 32, wherein the step of determining logical interdependencies comprises the steps of:

storing a representation of at least one of the topologies in a storage device in the computer-aided design system;

selecting a cutset in the topology comprising the logic gates falling in a fan-in of the logic gates leading to a target one of the logic gates;

building a decision diagram for the logic gates in the cutset leading from the target logic gate;

marking the logic gates in a potential learning area in the topology comprising the step of extracting justification vectors from the decision diagram for a predetermined Boolean value of the target logic gate; and determining such logical interdependencies and storing a representation of the logical interdependencies in a storage device in the computer-aided design system comprising the step of performing Boolean operations between the decision diagram and a plurality of other decision diagrams for the logic gates in the potential learning area.

34. A method according to claim 33, further comprising the step of:

repeating the steps of selecting, building, marking and determining for a plurality of gates in a set of target logic gates in the topology.

35. A method according to claim 33, wherein the storing step further comprises storing a representation of a logic design topology for a physical digital circuit design.

36. A method according to claim 33, further comprising the steps of:

selecting a set of unjustified logic gates in the topology wherein each such unjustified logic gate has a non-unique justification vector; and selecting a target logic gate from the set of unjustified logic gates.

37. A method according to claim 33, wherein the selecting a cutset step comprises backward tracing along the fan-in for each such logic gate up to a predetermined structural distance from the target logic gate in the topology.

38. A method according to claim 33, wherein the building step further comprises building a binary decision diagram comprising a plurality of non-terminal vertices, a plurality of terminal vertices, and directed paths interconnecting each non-terminal vertex to another non-terminal vertex or a terminal vertex.

39. A method according to claim 38, wherein the building step further comprises:

creating a variable order on the logic gates in the cutset;

producing a binary decision diagram for the cutset starting at the target logic gate and having a size comprising the step of determining for the size a structural depth of the topology beginning from a root vertex that corresponds to the target logic gate and number of vertices in the binary decision diagram; and reducing the size of the binary decision diagram.

40. A method according to claim 33, wherein the marking step further comprises:

extracting a set of justification vectors by traversing the decision diagram beginning at a root vertex that corresponds to the target logic gate, such a justification vector being incomplete if the extracting step stops at a non-terminal vertex;

completing each such incomplete justification vector by traversing the decision diagram until a terminal vertex is encountered;

simulating each such justification vector using truth tables for the logic gates and the topology to evaluate all logic gates that can be reached through forward propagation and backward propagation of Boolean values; and determining an intersection of implication result vectors and storing a representation of the intersection at the potential learning area.

41. A method according to claim 33, wherein the determining step further comprises:

selecting one of the logic gates from the potential learning area;

building one of the other decision diagrams for the selected logic gate;

performing Boolean operations between the decision diagram and the other decision diagram to find results; and determining logical interdependencies from the results and storing a representation of the results in a storage device.

42. A method according to claim 41, wherein the performing step further comprises performing a Boolean AND between the decision diagram and the other decision diagram; and performing a Boolean AND between the decision diagram and the other decision diagram.

43. A method according to claim 31, further comprising the steps of:

selecting at least one of the logic gates interconnected by the wires as an input into a logic gate in the separate topology and selecting at least one of the associated logical interdependencies for the selected logic gate on or ahead of the cut or in the other separate topology;

storing a representation of the selected logic gate and the interdependency in the tentative cut selection region; and repeating the steps of selecting and storing until every input wire into the logic gate has been selected.

44. A method according to claim 43, wherein the cut for the tentative cut selection region for each of the separate topologies has a size, the method further comprising the steps of:

checking the cut for completeness whereby every logic gate comprising the cut has a logical interdependency on or ahead of the cut in the separate topology or in the other separate topology;

comparing the size of each cut when each such cut is complete and selecting the cut being least in size; and performing the verifying step using the selected cut and the cut for the reflection tentative cut selection region in the other of the separate topologies.

45. A method according to claim 43, wherein the method further comprises the steps of:

checking the cut for each of the separate topologies for completeness, such a complete cut having for every logic gate comprising the cut a logical interdependency in the separate topology on or ahead of the cut or a logical interdependency in at least one of the other separate topologies; and determining such logic gates required to complete the cut for each of the separate topologies if the cut is not complete.

46. A method according to claim 45, wherein the determining step further comprises the steps of:

marking logic gates in the other of the separate topologies that can be reached from at least one of the primary outputs and that cannot be reached from one of the associated logical interdependencies stored in the reflection tentative cut selection region and storing a representation of the marked logic gates as a set of candidate points;

marking logic gates in the set of logical interdependencies for each of the separate topologies wherein each such logic gate has an associated logical interdependency on or ahead of the cut in the separate topology or in the other of the separate topologies and storing a representation of the marked logic gate in a further set of candidate points; and marking logic gates stored in both the set of candidate points and the further set of candidate points and storing a representation of those logic gates in the reflection tentative cut selection region that are closest to the set of primary outputs.

47. A method according to claim 31, wherein the building step further comprises the step of:

determining a variable order representing each such cutset for the logic gates in each of the separate topologies; and building a decision diagram for each of the separate topologies using the variable order.

48. A method according to claim 31, wherein the composite decision diagram has a size and each of the logic gates for each of the separate topologies has an input cone of logic gates falling in a fan-in of each such logic gate and each learning condition has a size, the step of determining a set of learning conditions further comprising the steps of:

storing a representation of the size of the composite decision diagram;

selecting a logic gate from an input cone located ahead of the cut for one of the separate topologies;

traversing a list of logical interdependencies for the selected logic gate and selecting a logical interdependency located ahead of the cut;

building a decision diagram constituting a learning condition from the selected logical interdependency; and simplifying the composite decision diagram using the learning condition when the size of the learning condition is less than a predetermined value.

49. A method according to claim 48, further comprising the steps of:

repeating the steps of traversing, building and simplifying until the list of logical interdependencies has been completely traversed;

repeating the steps of selecting, traversing, building and simplifying until every logic gate located ahead of the cut for one of the separate topologies has been selected; and repeating the steps of storing, selecting, traversing, building and simplifying until the size of the composite decision diagram decreases by a predetermined percentage.

50. A method according to claim 48, wherein the simplifying step further comprises the steps of:

performing a Boolean OR between the learning condition and the composite decision diagram to create a simplified composite decision diagram having a size; and substituting the composite decision diagram with the simplified composite decision diagram when the size of the simplified composite decision diagram is less than the size of the composite decision diagram.

51. A method according to claim 31, wherein the step of determining a pair of co-factor decision diagrams further comprises the steps of:

finding a support set comprising all unique variables in the simplified composite decision diagram;

selecting a member of the support set;

determining a co-factor of the decision diagram based on the member;

determining direct and logical interdependencies for the co-factor using the member equal to a Boolean 0 value and reducing the decision diagram for the decision diagram restricted to a Boolean 0 value;

determining direct and logical interdependencies for the co-factor using the member equal to a Boolean 1 value and reducing the decision diagram for the decision diagram restricted to a Boolean 1 value; and constructing a reduced composite decision diagram by using Shannon's expansion formula and substituting the composite decision diagram with the reduced composite decision diagram when the size of the reduced composite decision diagram is less than the size of the composite decision diagram.

52. A method according to claim 51, further comprising the step of:

repeating the steps of selecting, determining a co-factor, determining using a member equal to a Boolean 0 value, determining using a member equal to a Boolean 1 value, and constructing until every member of the support set has been selected.

53. A method according to claim 51, further comprising the step of:

repeating steps of finding step, selecting, determining a co-factor, determining using a member equal to a Boolean 0 value, determining using a member equal to a Boolean 1 value, and constructing until the size of the composite decision diagram decreases by a predetermined percentage.

54. A computer-aided design system for logic design verification using decision diagram simplification, the system comprising a first and a second separate digital circuit topology each comprising a set of primary outputs and a set of primary inputs both interconnected with logic gates, the logic gates being interconnected by wires, the topologies having a set of logical interdependencies associated with at least one of the logic gates in the system, the system further comprising a tentative cut selection region in one of the separate topologies and comprising a reflection tentative cut selection region in the other of the separate topologies, each such region comprising a group of logic gates whereby the wires connecting into those of the logic gates in the region that are closest to the set of primary outputs form a cut, the tentative cut selection region further comprising at least one of the logic gates and at least one of the associated logical interdependencies on or ahead of the cut and the reflection tentative cut selection region further comprising at least one of the associated logical interdependencies for at least one of the logic gates in the tentative cut selection region, each such primary output for each separate topology having a corresponding primary output on each of the other separate topologies, the system comprising:

means for XORing together the corresponding primary outputs from each of the separate topologies;

means for building a composite decision diagram by performing a Boolean exclusive OR between a decision diagram representing the tentative cut selection region and a decision diagram representing the reflection tentative cut selection region;

means for determining learning conditions for each of the separate topologies, comprising means for building for each such learning condition a decision diagram representing logic gates located between the cuts and the primary outputs, and means for simplifying the composite decision diagram using the learning conditions;

means for determining a pair of co-factor decision diagrams for the simplified composite decision diagram by applying Shannon's expansion formula based on the cuts and means for combining the pair to build a reduced composite decision diagram that is substituted for the composite decision diagram; and means for verifying whether each of the topologies is equivalent comprising means for composing the composite decision diagram using decision diagrams built on the primary inputs for each of the separate topologies and means for performing a Boolean exclusive OR between the decision diagrams to thereby determine an output signal indicating equivalency asserted by the XORing means.

55. A method using a computer-aided design system for decreasing computational resource requirements for a construction of a representation of a hardware design, the system comprising a digital circuit topology comprising a set of primary outputs and a set of primary inputs both interconnected with logic gates, the logic gates being interconnected by wires, the topology having a set of logical interdependencies associated with at least one of the logic gates in the system, the representation comprising a decision diagram representing part or all of the hardware design, comprising the steps of:

selecting a subcircuit topology of the digital circuit topology comprising logic gates falling in a fan-in of a logic gate in the digital circuit topology;

selecting a cutset comprising at least one of the logic gates whereby the wires connecting into those of the logic gates closest to the set of primary outputs form a cut and determining whether each such logic gate in the cutset has a logical interdependency located on or ahead of the cut;

building a decision diagram using the cutset;

simplifying the decision diagram whereby the simplified decision diagram is substituted for the decision diagram when the simplified decision diagram is smaller than the decision diagram; and composing the decision diagram using the set of primary inputs as a representation of the hardware design.

56. A method according to claim 55, further comprising the steps of:

selecting a further cutset comprising at least one of the logic gates whereby the wires connecting into those of the logic gates furthest from the set of primary outputs and located between the set of primary inputs and the cut form a further cut when the composing step is unsuccessful; and composing the decision diagram using the further cut.

57. A method according to claim 56, further comprising the step of:

repeating the steps of simplifying and composing until the further cut comprises at least one of the primary inputs.

58. A computer-aided design system for decreasing computational resource requirements for a construction of a representation of a hardware design, the system comprising a digital circuit topology comprising a set of primary outputs and a set of primary inputs both interconnected with logic gates, the logic gates being interconnected by wires, the topology having a set of logical interdependencies associated with at least one of the logic gates in the system, the representation comprising a decision diagram representing part or all of the hardware design, the system comprising:

means for selecting a subcircuit topology of the digital circuit topology comprising logic gates falling in a fan-in of a logic gate in the digital circuit topology;

means for selecting a cutset comprising at least one of the logic gates whereby the wires connecting into those of the logic gates closest to the set of primary outputs form a cut and means for determining whether each such logic gate in the cutset has a logical interdependency located on or ahead of the cut;

means for building a decision diagram using the cutset;

means for simplifying the decision diagram whereby the simplified decision diagram is substituted for the decision diagram when the simplified decision diagram is smaller than the decision diagram; and means for composing the decision diagram using the set of primary inputs as a representation of the hardware design.

59. A method using a computer-aided design system for performing goal directed learning, the system comprising a digital circuit topology comprising a set of primary outputs interconnected with logic gates, the logic gates being interconnected by wires, the topologies having a set of logical interdependencies associated with at least one of the logic gates in the system, and having a cutset comprising at least one of the logic gates whereby the wires connecting into those of the logic gates closest to the set of primary outputs form a cut, the goal directed learning being for directing the system to satisfy a predefined goal, comprising the steps of:

determining a list of logic gates between the cut and the set of primary outputs whereby each of the logic gates is located at most a predetermined structural distance from the cut;

selecting a logic gate from the list and determining logical interdependencies with a learning level equal to the predetermined structural distance;

repeating the step of selecting until every logic gate in the list has been selected; and repeating the steps of determining and selecting while the predetermined structural distance is less than a further predetermined structural distance and the predefined goal remains unsatisfied.

60. A computer-aided design system for performing goal directed learning, the system comprising a digital circuit topology comprising a set of primary outputs interconnected with logic gates, the logic gates being interconnected by wires, the topologies having a set of logical interdependencies associated with at least one of the logic gates in the system, and having a cutset comprising at least one of the logic gates whereby the wires connecting into those of the logic gates closest to the set of primary outputs form a cut, the goal directed learning being for directing the system to satisfy a predefined goal, the system comprising:

means for determining a list of logic gates between the cut and the set of primary outputs whereby each of the logic gates is located at most a predetermined structural distance from the cut; and means for selecting a logic gate from the list and means for determining logical interdependencies with a learning level equal to the predetermined structural distance.

61. A method using a computer-aided design system for performing goal directed learning, the system comprising a digital circuit topology comprising a set of primary outputs and a set of primary inputs both interconnected with logic gates, the logic gates being interconnected by wires, the topologies having a set of logical interdependencies associated with at least one of the logic gates in the system, and having a cutset comprising at least one of the logic gates whereby the wires connecting into those of the logic gates closest to the set of primary outputs form a cut, the goal directed learning being for directing the system to satisfy a predefined goal, comprising the steps of:

determining a list of logic gates between the cut and the set of primary outputs or between the cut and the set of primary inputs whereby each of the logic gates is located at most a predetermined structural distance from the cut;

selecting a logic gate from the list and determining logical interdependencies with a learning level equal to the predetermined structural distance;

repeating the step of selecting until every logic gate in the list has been selected; and repeating the steps of determining and selecting while the predetermined structural distance is less than a further predetermined structural distance and the predefined goal remains unsatisfied.

62. A computer-aided design system for performing goal directed learning, the system comprising a digital circuit topology comprising a set of primary outputs and a set of primary inputs both interconnected with logic gates, the logic gates being interconnected by wires, the topologies having a set of logical interdependencies associated with at least one of the logic gates in the system, and having a cutset comprising at least one of the logic gates whereby the wires connecting into those of the logic gates closest to the set of primary outputs form a cut, the goal directed learning being for directing the system to satisfy a predefined goal, the system comprising:

means for determining a list of logic gates between the cut and the set of primary outputs or between the cut and the set of primary inputs whereby each of the logic gates is located at most a predetermined structural distance from the cut; and means for selecting a logic gate from the list and means for determining logical interdependencies with a learning level equal to the predetermined structural distance.

* * * * *

UNITED STATES PATENT AND TRADEMARK OFFICE
CERTIFICATE OF CORRECTION

PATENT NO. : 5,649,165
DATED : July 15, 1997
INVENTOR(S) : Jawahar Jain; Rajarshi Mukherjee It is certified that error appears in the above-indentified patent and that said Letters Patent is hereby corrected as shown below:

Column 2, line 17, replace "pp. 34-38" with -- pp. 34-37 --.
Column 5, line 16, after "comprises" delete "of".
Column 5, lines 25,26, delete "The decision diagram is built using the cutset."
Column 8, line 40, after "(BDD)" delete the period.
Column 9, line 11, change "level-no" to -- level_no --.
Column 10, line 9, after "wire" insert -- 41. --.
Column 12, line 57, after "whereby" delete "a".
Column 12, line 60, change "an Boolean" to -- a Boolean --.
Column 13, line 42, after "and if" delete "a".
Column 13, lines 47,59, before "predetermined" delete "a" (both occurrences).
Column 18, lines 59,60, change "cut size_macro" to -- cut_size macro --.
Column 19, line 11, before "stored" delete "these".
Column 20, line 12, after "for" delete "some".
Column 21, line 1, change "lists" to -- list --.
Column 22, line 48, change "$G_a$" to -- $G_d$ --.
Column 23, line 50, change "Composite" to -- composite --.
Column 24, line 30, after "full" delete the period.
Column 25, line 59, change "$H_{v+1}$" to -- $H_{v=1}$ --.
Column 26, line 61, change "$G_a$" to -- $G_d$ --.
Column 27, line 57, replace "greater that" with -- greater than --.
Column 27, line 66, change "$\lambda k_{+i}$" to -- $\lambda_{k+i}$ --.
Column 28, line 41, change "$L_{\lambda, k \pm L1}$" to -- $L_{(\lambda, k \pm L1)}$ --.
Column 29, line 35, after "wherein the" insert -- step of --.

UNITED STATES PATENT AND TRADEMARK OFFICE
CERTIFICATE OF CORRECTION

PATENT NO. : 5,649,165
DATED : July 15, 1997
INVENTOR(S) : Jawahar Jain; Rajarshi Mukherjee It is certified that error appears in the above-indentified patent and that said Letters Patent is hereby corrected as shown below:

Column 33, line 3, after "wherein the" insert -- step of --.
Column 35, line 53, after "wherein the" insert -- step of --.
Column 39, line 32, change "0R" to -- OR --.

Signed and Sealed this

First Day of September, 1998

Attest:

BRUCE LEHMAN

*Attesting Officer*  *Commissioner of Patents and Trademarks*